US012745415B2

(12) United States Patent
Fang et al.

(10) Patent No.: US 12,745,415 B2
(45) Date of Patent: Sep. 22, 2026

(54) HEMT DEVICE AND SEMICONDUCTOR DEVICE

(71) Applicant: HUNAN SAN'AN SEMICONDUCTOR CO., LTD., Changsha (CN)

(72) Inventors: Yutao Fang, Changsha (CN); Qian Wang, Changsha (CN); Nien-Tze Yeh, Changsha (CN); Jie Zhang, Changsha (CN)

(73) Assignee: HUNAN SAN'AN SEMICONDUCTOR CO., LTD., Changsha (CN)

( * ) Notice: Subject to any disclaimer, the term of this patent is extended or adjusted under 35 U.S.C. 154(b) by 351 days.

(21) Appl. No.: 18/615,990

(22) Filed: Mar. 25, 2024

(65) Prior Publication Data

US 2024/0234565 A1 Jul. 11, 2024

Related U.S. Application Data

(63) Continuation of application No. PCT/CN2023/120170, filed on Sep. 20, 2023.

(30) Foreign Application Priority Data

Oct. 25, 2022 (CN) ........................ 202211327142.X
Oct. 25, 2022 (CN) ........................ 202211327296.9

(51) Int. Cl.
*H10D 30/47* (2025.01)
*H10D 62/10* (2025.01)

(Continued)

(52) U.S. Cl.
CPC ....... *H10D 30/4755* (2025.01); *H10D 62/124* (2025.01); *H10D 62/8503* (2025.01); *H10D 64/111* (2025.01)

(58) Field of Classification Search
CPC ............. H10D 30/4755; H10D 62/124; H10D 62/8503; H10D 64/111; H10D 30/01;

(Continued)

(56) References Cited

U.S. PATENT DOCUMENTS

| | | | |
|---|---|---|---|
| 10,461,161 | B1 | 10/2019 | Kinzer |
| 2006/0060895 | A1 | 3/2006 | Hikita |

(Continued)

FOREIGN PATENT DOCUMENTS

| | | | |
|---|---|---|---|
| CN | 102427085 | A | 4/2012 |
| CN | 103730360 | A | 4/2014 |

(Continued)

OTHER PUBLICATIONS

Chinese First Office Action,Chinese Application No. 202211327142.X, mailed Jan. 21, 2026 (12 pages).

(Continued)

*Primary Examiner* — Thanh Y. Tran

(57) ABSTRACT

Provided is a HEMT device, including: a substrate, an epitaxial layer, a source, a drain, a gate, a conductive layer, an electrocoupling structure, and a high-resistance structure. The epitaxial layer is disposed on the substrate, and includes: a first semiconductor stack layer and a second semiconductor layer disposed on the first semiconductor stack layer; wherein a two-dimensional electron gas is formed at an interface between the first semiconductor stack layer and the second semiconductor layer. The conductive layer is disposed within the epitaxial layer and between the substrate and the two-dimensional electron gas. An end of the electrocoupling structure is electrically connected to the gate, and the other end extends into the epitaxial layer and is electrically connected to the conductive layer. The high-resistance structure is at least partially disposed between the conductive layer and the two-dimensional electron gas, and between the electrocoupling structure and the two-dimensional electron gas.

21 Claims, 48 Drawing Sheets

(51) Int. Cl.
*H10D 62/85* (2025.01)
*H10D 64/00* (2025.01)

(58) Field of Classification Search
CPC .... H10D 30/015; H10D 30/47; H10D 30/475; H10D 64/257; H10D 62/10; H10D 62/343; H10D 64/411
See application file for complete search history.

(56) References Cited

U.S. PATENT DOCUMENTS

| | | | |
|---|---|---|---|
| 2013/0153967 A1 | 6/2013 | Curatola et al. | |
| 2014/0131721 A1 | 5/2014 | Nie et al. | |
| 2020/0013862 A1 | 1/2020 | Srivastava | |
| 2021/0384339 A1* | 12/2021 | Sun | H10D 62/8503 |

FOREIGN PATENT DOCUMENTS

| | | | |
|---|---|---|---|
| CN | 106992210 | A | 7/2017 |
| CN | 108155099 | A | 6/2018 |
| CN | 109037326 | A | 12/2018 |
| CN | 112018176 | A | 12/2020 |
| CN | 112368843 | A | 2/2021 |
| CN | 114122127 | A | 3/2022 |
| CN | 115498020 | A | 12/2022 |
| CN | 115663019 | A | 1/2023 |
| JP | 2011142182 | A | 7/2011 |

OTHER PUBLICATIONS

International Search Report,International Application No. PCT/CN2023/120170, mailed Dec. 4, 2023 (17 pages).

* cited by examiner

B
B
11
57
A
A
S
G
D
7(701)
6
5
4

6
57b
5
9a
4
204
203
801
702
701
703
202
201
1

9a
204
203
801
7
202
201
1

HEMT DEVICE AND SEMICONDUCTOR DEVICE

CROSS-REFERENCE TO RELATED APPLICATIONS

The present disclosure is a continuation-application of International (PCT) Patent Application No. PCT/CN2023/120170, filed on Sep. 20, 2023, which claims priority of China Patent Applicant No. 202211327142.X, filed on Oct. 25, 2022, and No. 202211327296.9, filed on Oct. 25, 2022, the entire contents of which are hereby incorporated by reference in their entirety.

TECHNICAL FIELD

The present disclosure relates to the technical field of semiconductor devices, and in particular to a HEMT device and a semiconductor device.

BACKGROUND

Semiconductor devices, also known as high electron mobility transistors (HEMTs), have a wide range of applications in high frequency, high voltage, high temperature, and high power density fields due to their high electron mobility, high two-dimensional electron gas concentration, and high breakdown voltage.

A desired property of the semiconductor device is to have a higher breakdown voltage, and a gate field plate is widely applied in the HEMT device due to its ability to increase the breakdown voltage of the device. Although the gate field plate, which is usually located on a passivation layer on top of the semiconductor device and connected to the gate or source, can increase the breakdown voltage of the device, it is desirable to develop a new technology that can increase the breakdown voltage of the device, and it is further desirable to continue to apply the gate field plate based on the new technology in order to substantially increase the breakdown voltage of the device.

SUMMARY OF THE DISCLOSURE

In order to address some or all of the above problems, the present disclosure provides a HEMT device and a semiconductor device that has a high breakdown voltage without the use of a gate-field plate and will have an even higher breakdown voltage with the use of a gate-field plate.

A high electron mobility transistor (HEMT) device, including: a substrate; an epitaxial layer, disposed on the substrate, and including: a first semiconductor stack layer and a second semiconductor layer disposed on the first semiconductor stack layer; wherein a two-dimensional electron gas is formed at an interface between the first semiconductor stack layer and the second semiconductor layer; a source, a drain, and a gate, disposed on the second semiconductor layer and spaced apart; a conductive layer, disposed within the epitaxial layer and between the substrate and the two-dimensional electron gas; an electrocoupling structure; wherein an end of the electrocoupling structure is electrically connected to the gate, and the other end of the electrocoupling structure extends into the epitaxial layer and is electrically connected to the conductive layer; and a high-resistance structure, at least partially disposed between the conductive layer and the two-dimensional electron gas, and between the electrocoupling structure and the two-dimensional electron gas.

A semiconductor device, including: a substrate; an epitaxial layer, disposed on the substrate, and including: a first semiconductor stack layer and a second semiconductor layer disposed on the first semiconductor stack layer; wherein a two-dimensional electron gas is formed at an interface between the first semiconductor stack layer and the second semiconductor layer; a source, a drain and a gate, disposed on the second semiconductor layer and spaced apart; a plurality of conductive layers, spaced within the epitaxial layer and between the substrate and the two-dimensional electron gas; a plurality of electrocoupling structures, for electrically coupling the plurality of conductive layers to the gate; a first high-resistance portion, for insulating the plurality of conductive layers from the two-dimensional electron gas; and a second high-resistance portion, for insulating isolating the plurality of electrocoupling structures from the two-dimensional electron gas.

In the HEMT device and semiconductor device provided in the embodiments of the present disclosure, by providing a conductive layer capable of electrically coupling with the gate inside the device, and by isolating between the conductive layer and the two-dimensional electron gas, and between the electrocoupling structure and the two-dimensional electron gas by a barrier structure, the electric field strength of the gate of the semiconductor device at a high voltage can be effectively reduced by the conductive layer to which the gate is connected, so as to increase the breakdown voltage of the device.

BRIEF DESCRIPTION OF THE DRAWINGS

Embodiments of the present disclosure will be described in detail below in connection with the accompanying drawings.

FIG. **5*a*** is a view of a fabrication process for the semiconductor device according to Embodiment I of the present disclosure.

FIG. **5*b*** is another view of the fabrication process for the semiconductor device according to Embodiment I of the present disclosure.

FIG. **5*c*** is further another view of the fabrication process for the semiconductor device according to Embodiment I of the present disclosure.

FIG. **5*d*** is still another view of the fabrication process for the semiconductor device according to Embodiment I of the present disclosure.

FIG. **5*e*** is still another view of the fabrication process for the semiconductor device according to Embodiment I of the present disclosure.

FIG. **5*f*** is still another view of the fabrication process for the semiconductor device according to Embodiment I of the present disclosure.

FIG. **5*g*** is still another view of the fabrication process for the semiconductor device according to Embodiment I of the present disclosure.

Figure 5A:
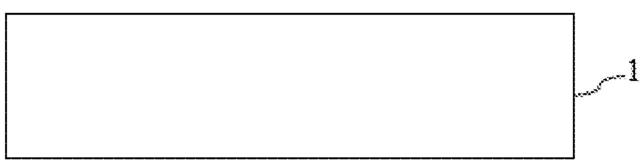
Figure 5B:
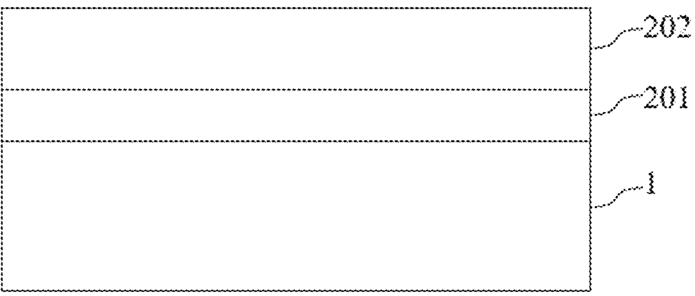
Figure 5C:
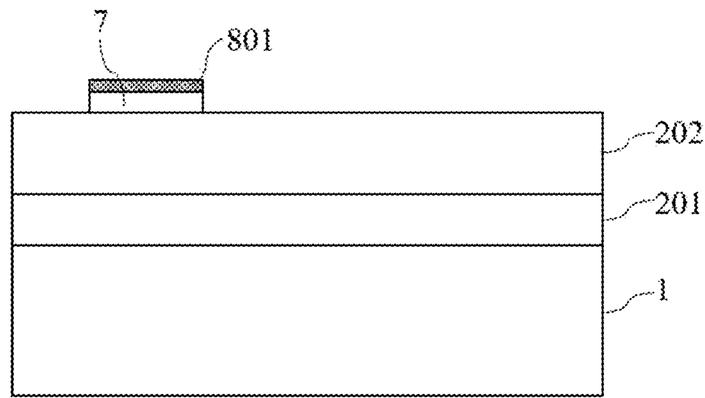
Figure 5D:
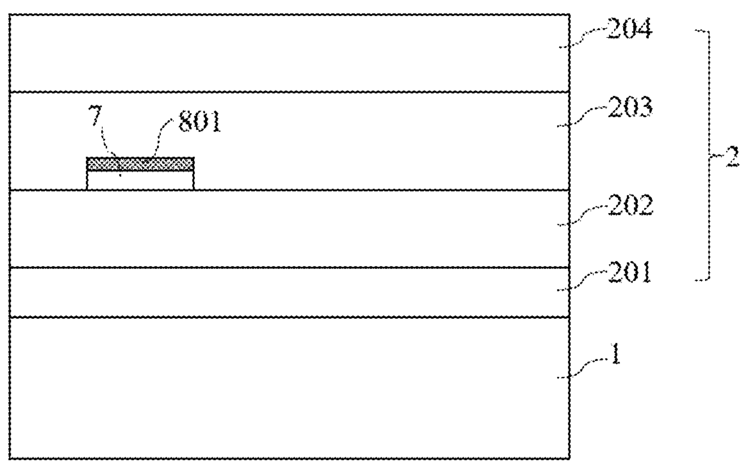
Figure 5E:
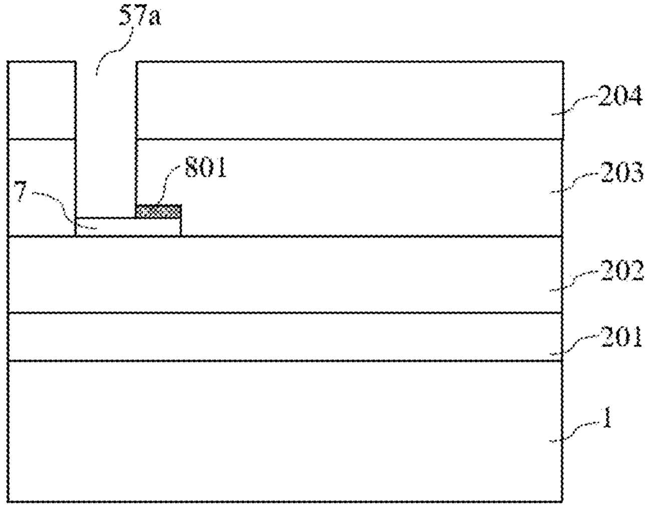
Figure 5F:
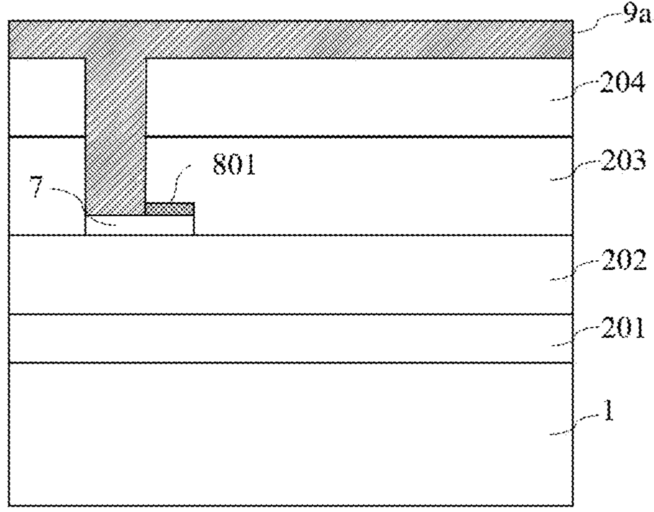
Figure 5G:
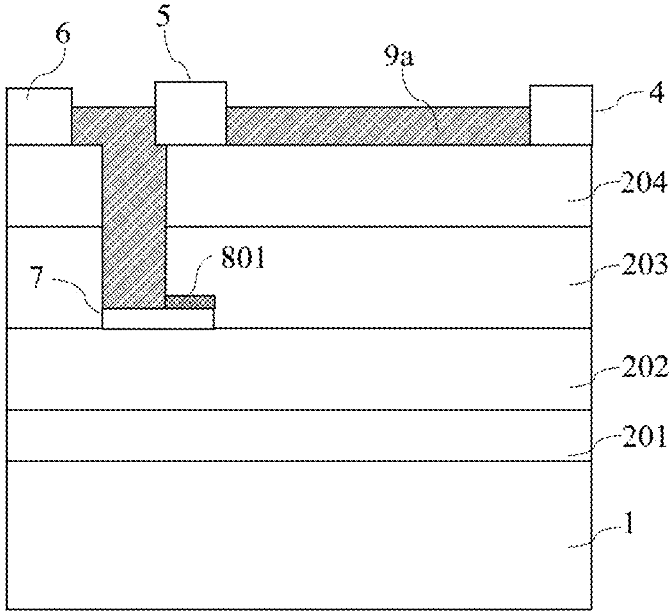
Figure 5H:
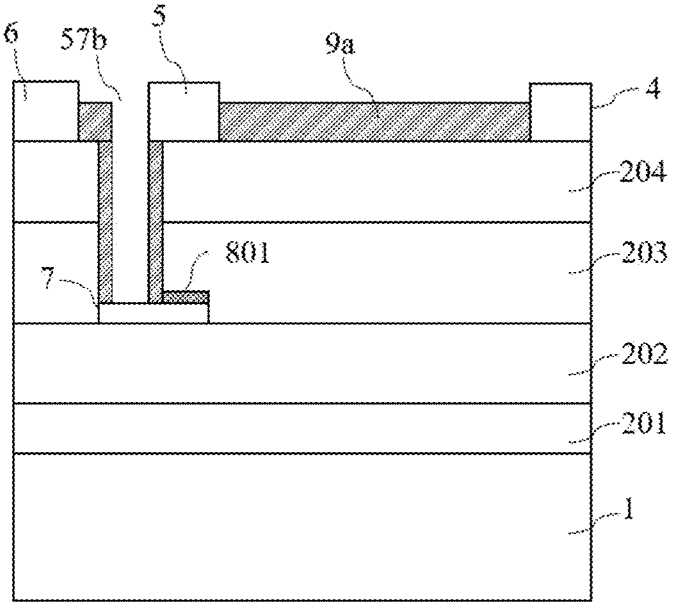

FIG. 5*h* is still another view of the fabrication process for the semiconductor device according to Embodiment I of the present disclosure.

Figure 5I:
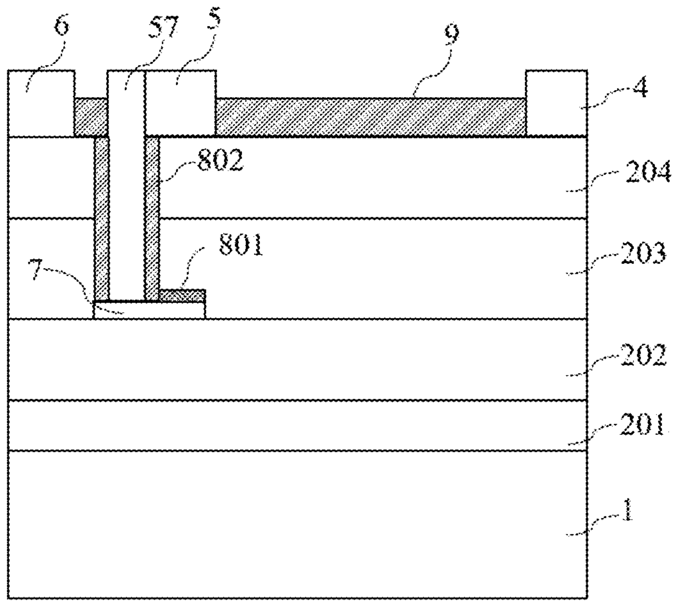

FIG. 5*i* is still another view of the fabrication process for the semiconductor device according to Embodiment I of the present disclosure.

Figure 6:
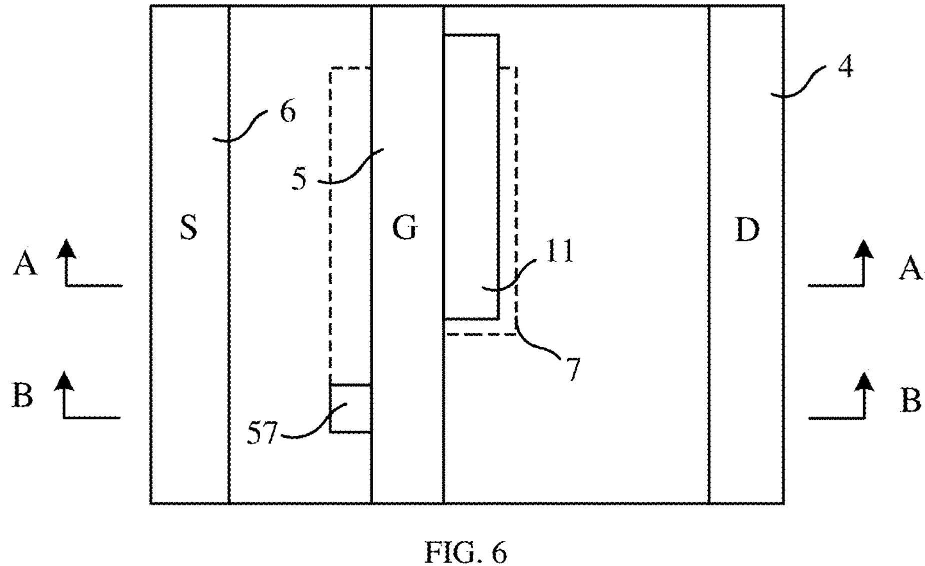

FIG. 6 is a schematic view of a top view structure of a semiconductor device according to Embodiment II of the present disclosure.

Figure 7:
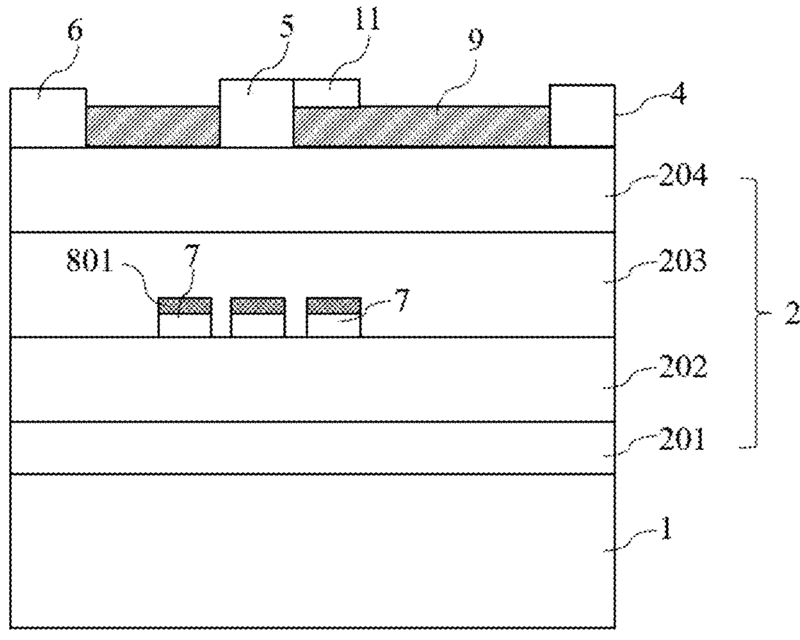

FIG. 7 is a cross-sectional view of the semiconductor device shown in FIG. 6 along a line A-A.

Figure 8:
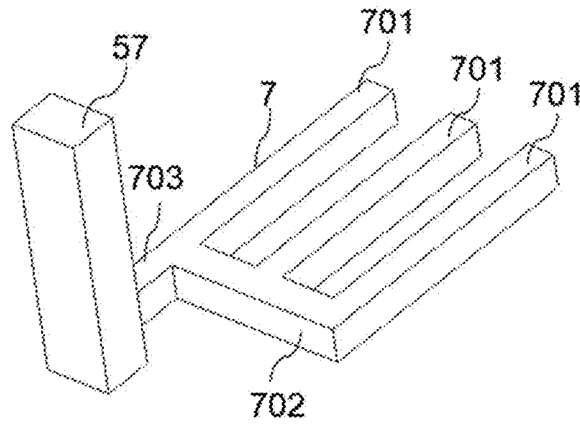

FIG. 8 illustrates a conductive layer and an electrocoupling structure of the semiconductor device shown in FIG. 6.

Figure 9A:
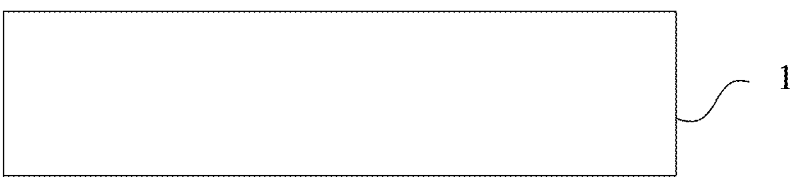

FIG. 9*a* is a view of a fabrication process for the semiconductor device according to Embodiment II of the present disclosure.

Figure 9B:
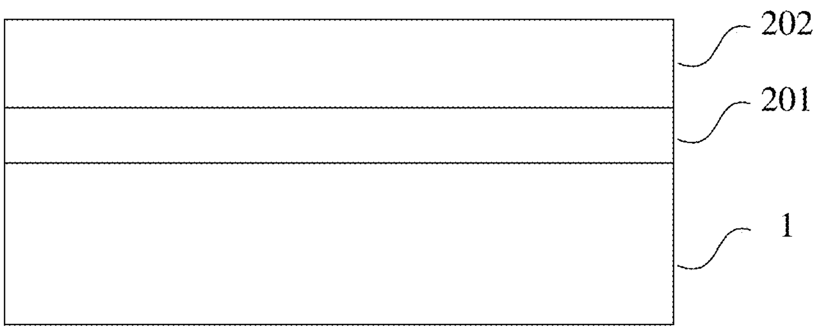

FIG. 9*b* is another view of the fabrication process for the semiconductor device according to Embodiment II of the present disclosure.

Figure 9C:
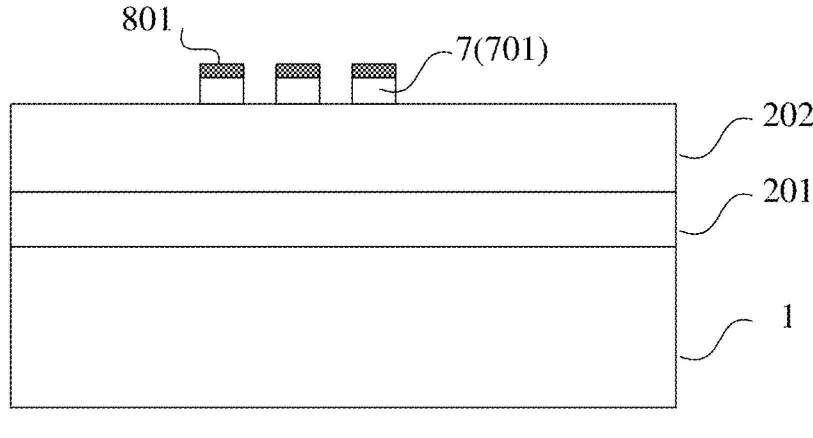

FIG. 9*c* is further another view of the fabrication process for the semiconductor device according to Embodiment II of the present disclosure.

Figure 9D:
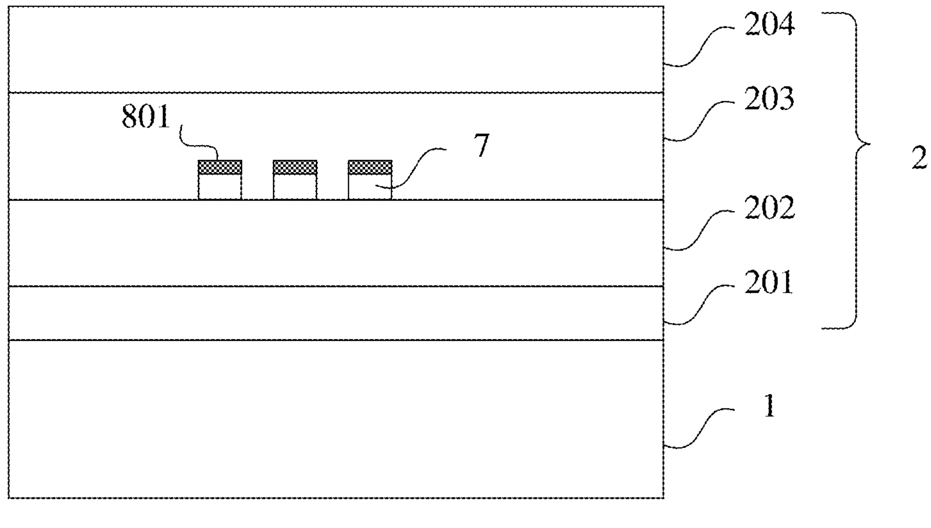

FIG. 9*d* is still another view of the fabrication process for the semiconductor device according to Embodiment II of the present disclosure.

Figure 9E:
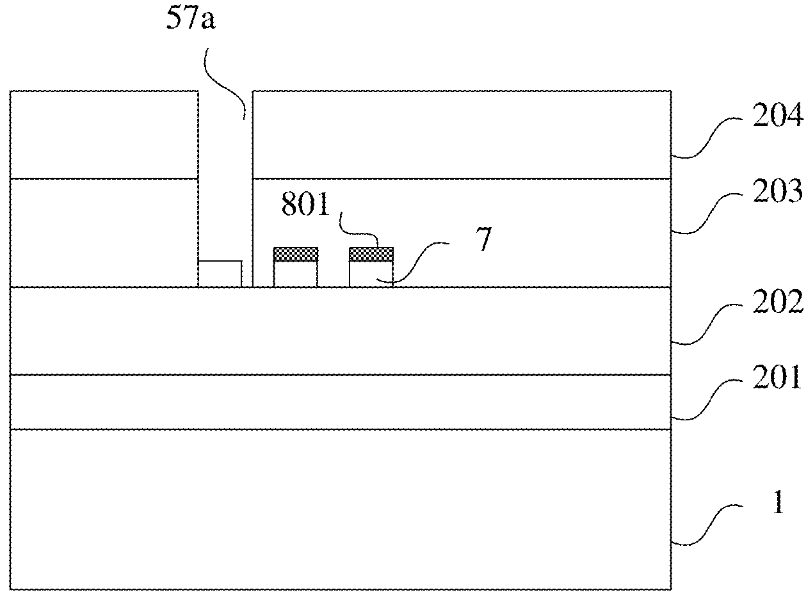

FIG. 9*e* is still another view of the fabrication process for the semiconductor device according to Embodiment II of the present disclosure.

Figure 9F:
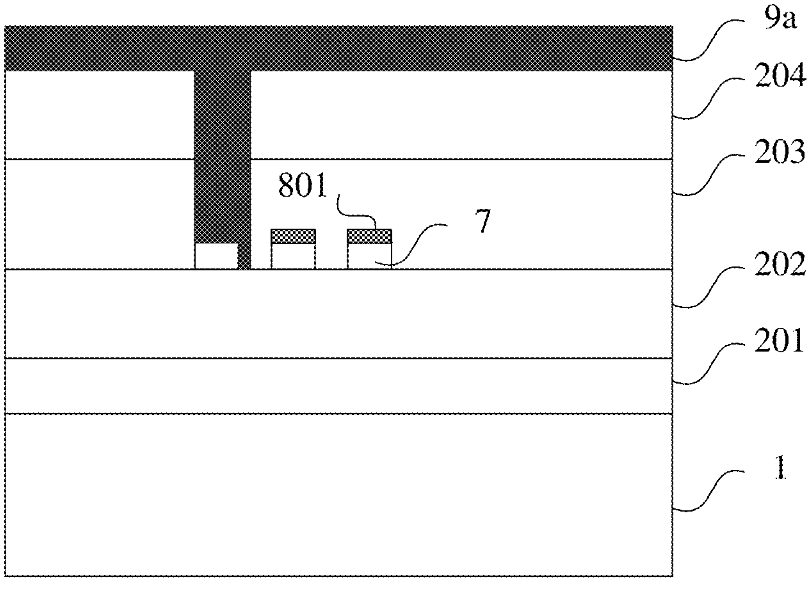

FIG. 9*f* is still another view of the fabrication process for the semiconductor device according to Embodiment II of the present disclosure.

Figure 9G:
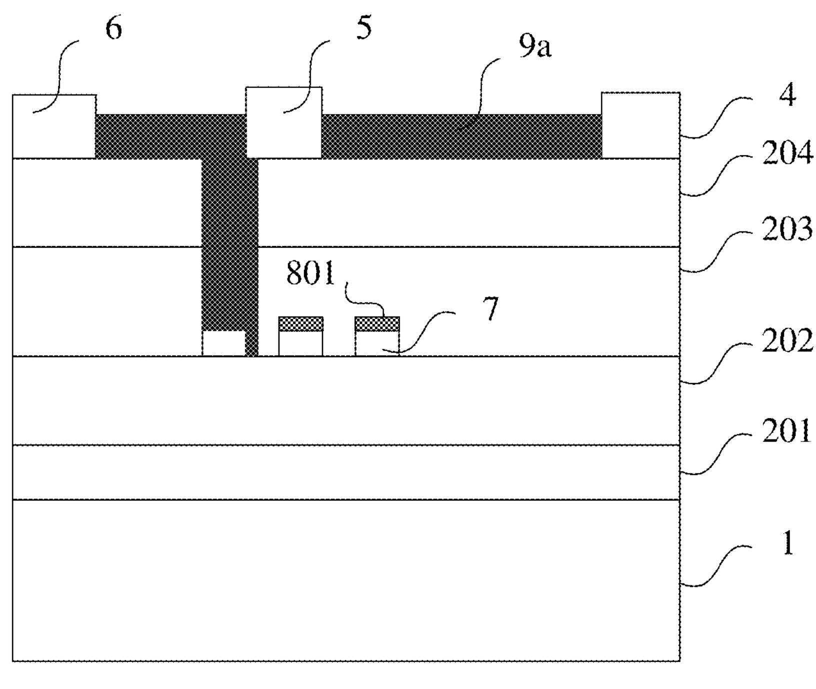

FIG. 9*g* is still another view of the fabrication process for the semiconductor device according to Embodiment II of the present disclosure.

Figure 9H:
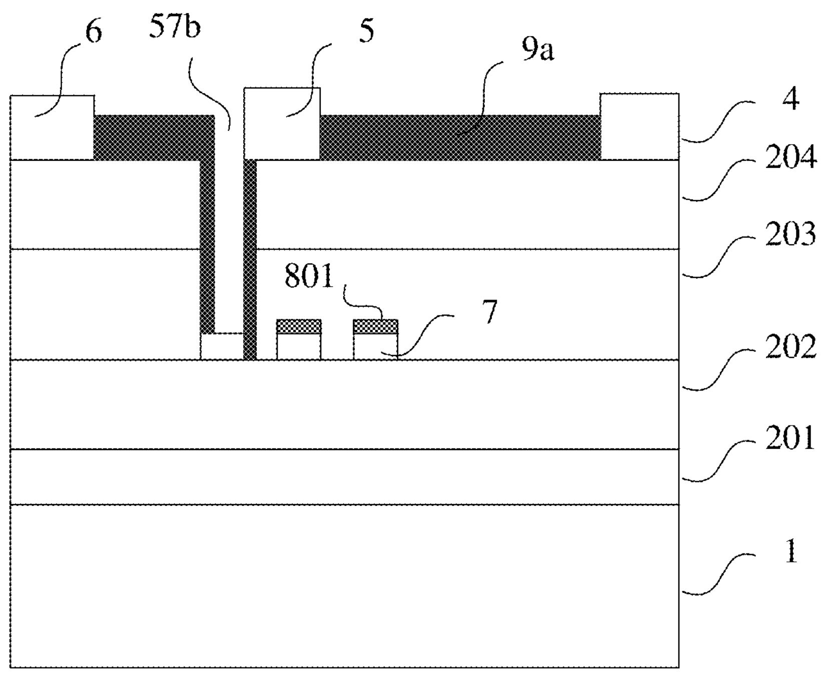

FIG. 9*h* is still another view of the fabrication process for the semiconductor device according to Embodiment II of the present disclosure.

Figures 9I, 10:
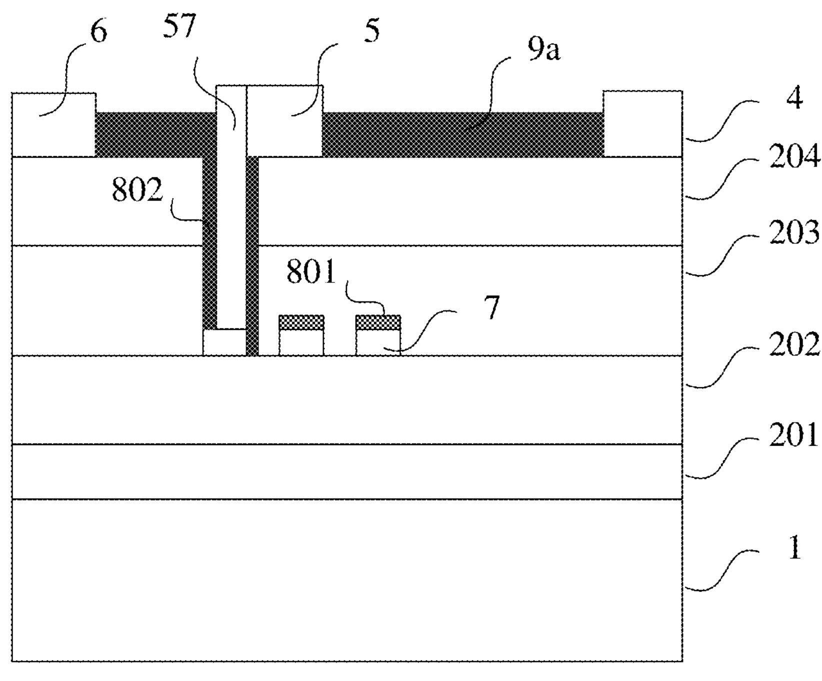

FIG. 9*i* is still another view of the fabrication process for the semiconductor device according to Embodiment II of the present disclosure.

FIG. 10 is a schematic view of a top view structure of a semiconductor device according to Embodiment III of the present disclosure.

Figure 11:
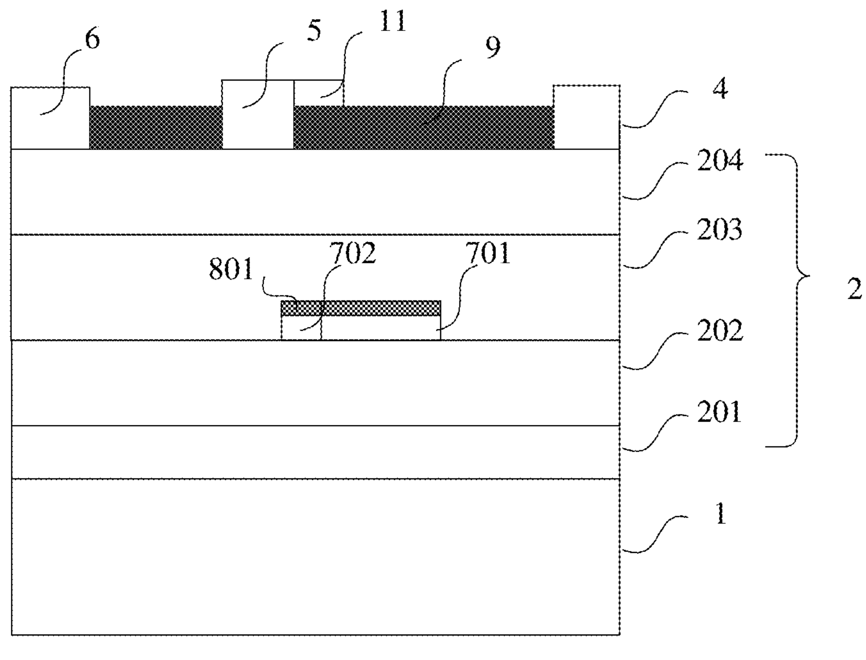

FIG. 11 is a cross-sectional view of the semiconductor device shown in FIG. 10 along a line A-A.

Figure 12A:
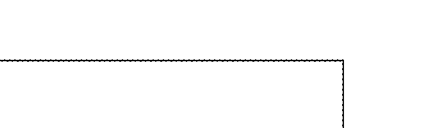

FIG. 12*a* is a view of a fabrication process for the semiconductor device according to Embodiment III of the present disclosure.

Figure 12B:
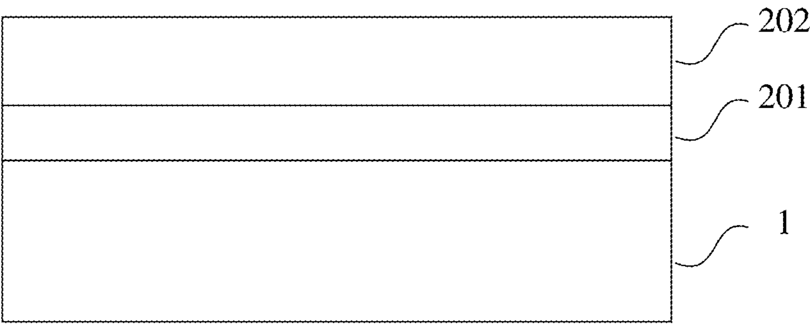

FIG. 12*b* is another view of the fabrication process for the semiconductor device according to Embodiment III of the present disclosure.

Figure 12C:
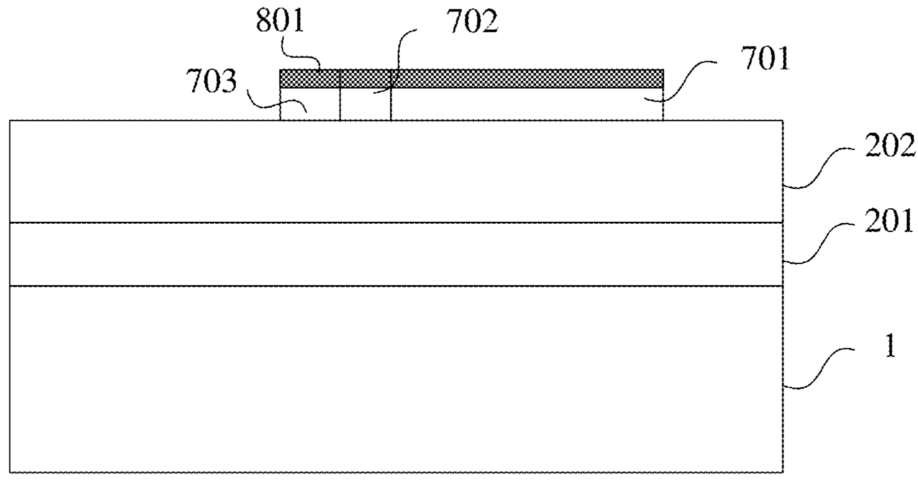

FIG. 12*c* is further another view of the fabrication process for the semiconductor device according to Embodiment III of the present disclosure.

Figure 12D:
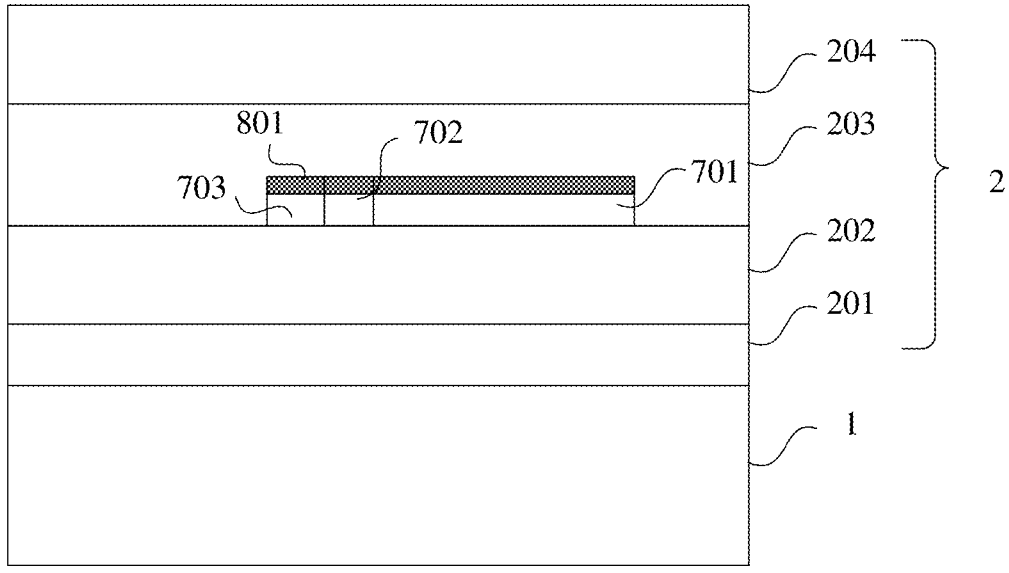

FIG. 12*d* is still another view of the fabrication process for the semiconductor device according to Embodiment III of the present disclosure.

Figure 12E:
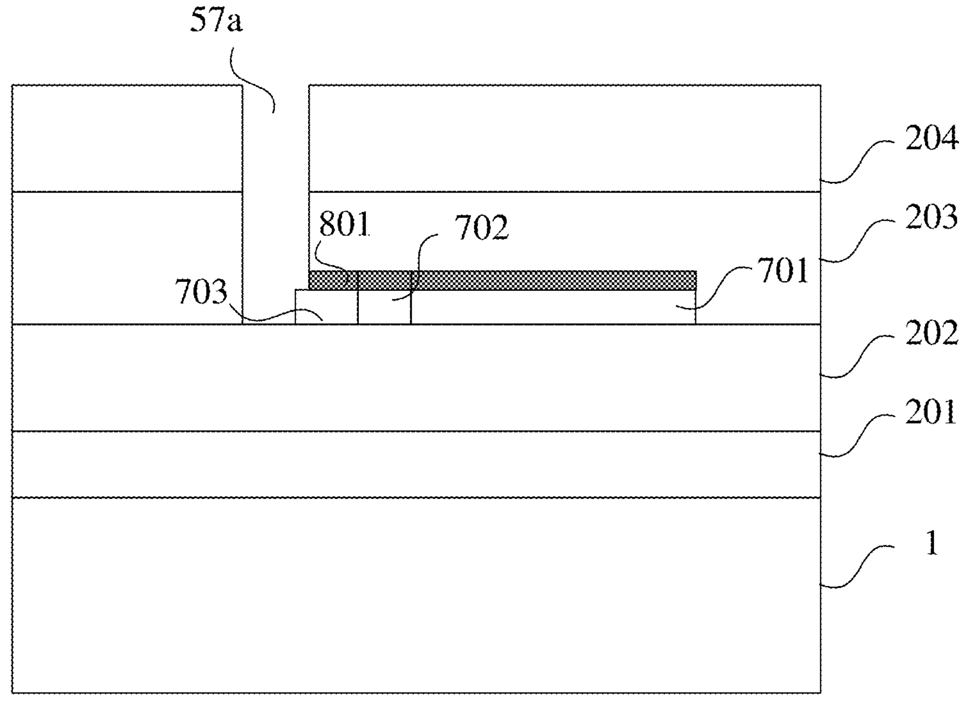

FIG. 12*e* is still another view of the fabrication process for the semiconductor device according to Embodiment III of the present disclosure.

Figure 12F:
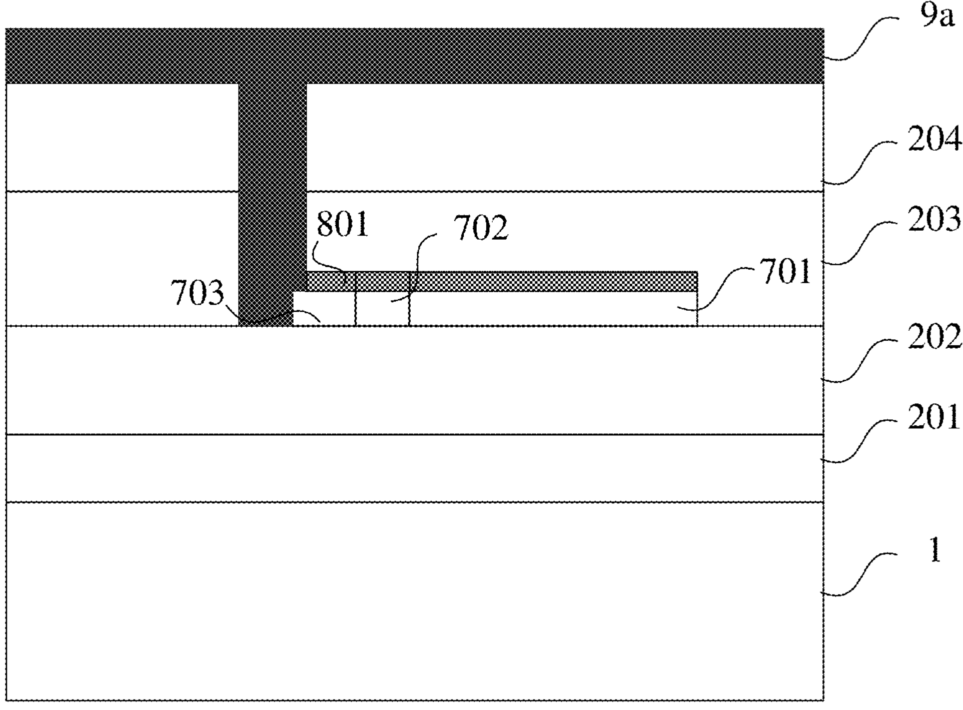

FIG. 12*f* is still another view of the fabrication process for the semiconductor device according to Embodiment III of the present disclosure.

Figures 12G, 12H:
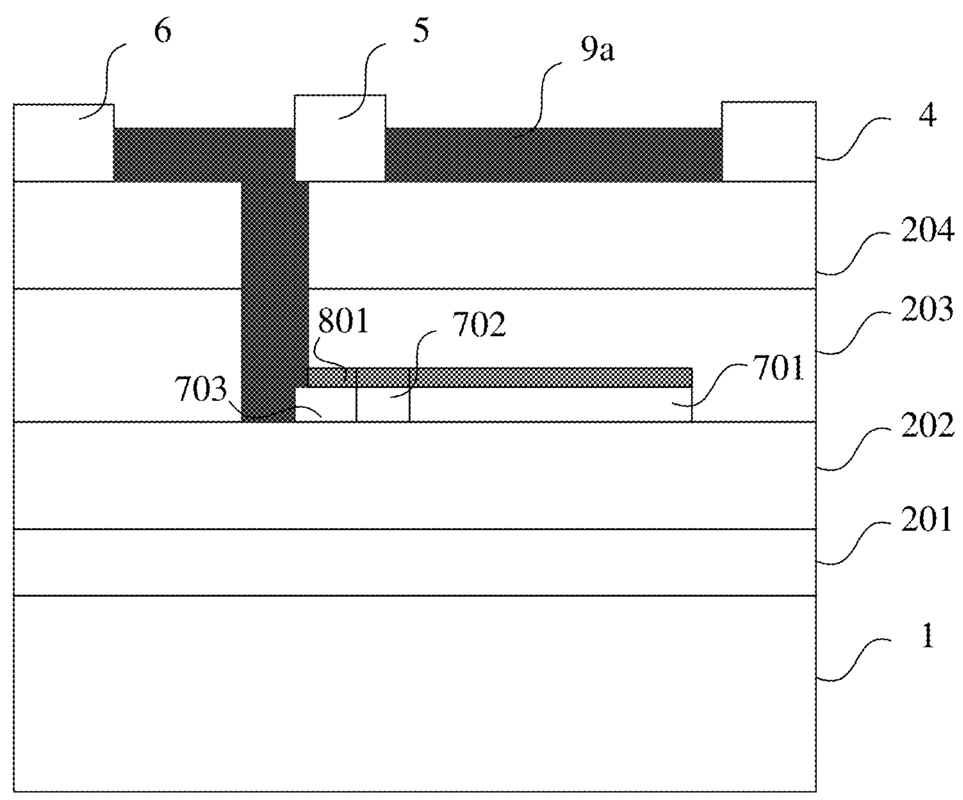

FIG. 12*g* is still another view of the fabrication process for the semiconductor device according to Embodiment III of the present disclosure.

FIG. 12*h* is still another view of the fabrication process for the semiconductor device according to Embodiment III of the present disclosure.

Figure 12I:
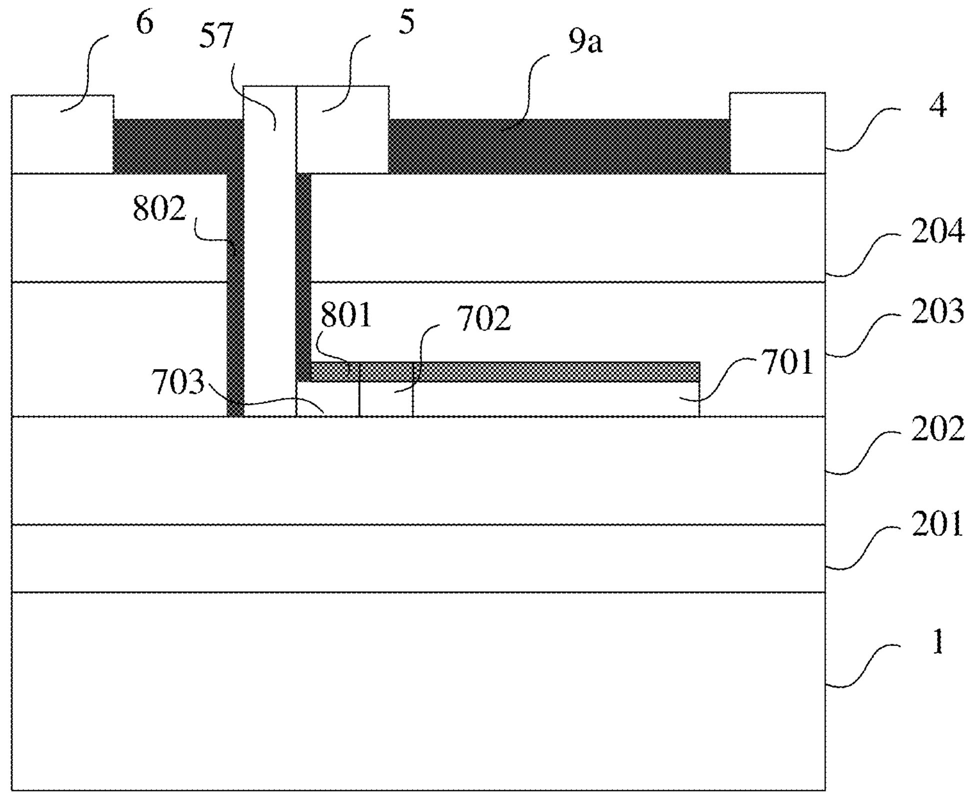

FIG. 12*i* is still another view of the fabrication process for the semiconductor device according to Embodiment III of the present disclosure.

Figure 13:
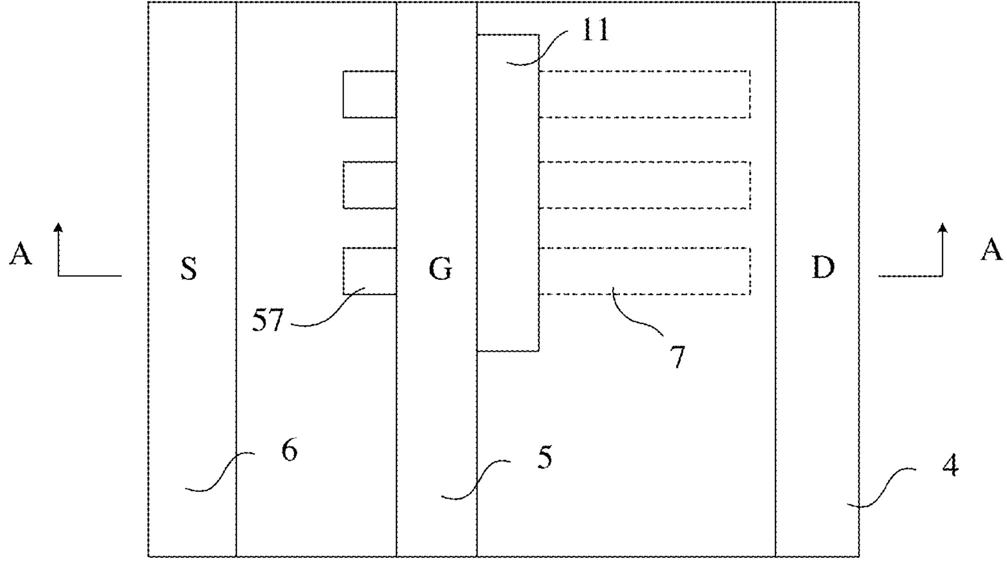

FIG. 13 is a schematic view of a top view structure of a semiconductor device according to Embodiment IV of the present disclosure.

Figure 14:
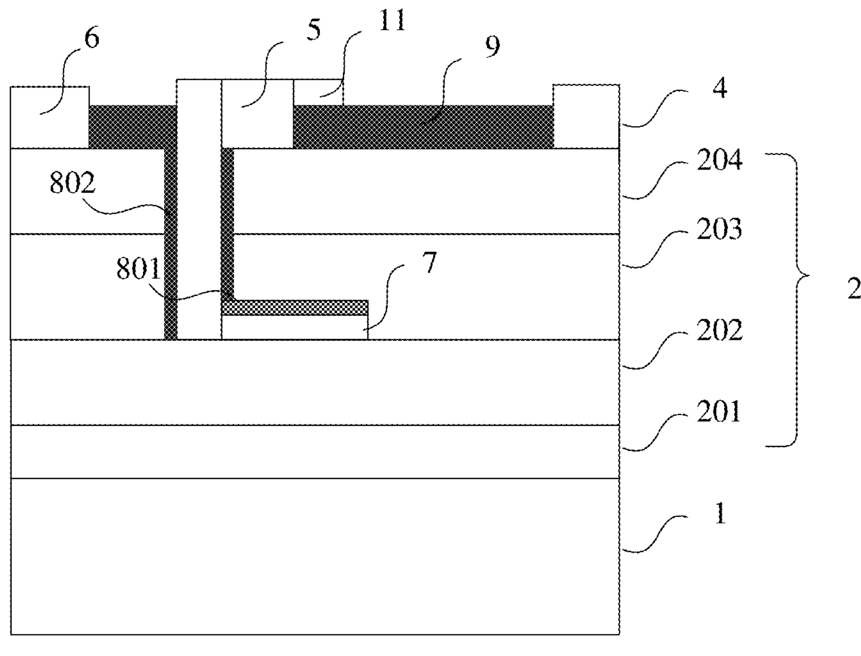

FIG. 14 is a cross-sectional view of the semiconductor device shown in FIG. 13 along a line A-A.

Figure 15A:
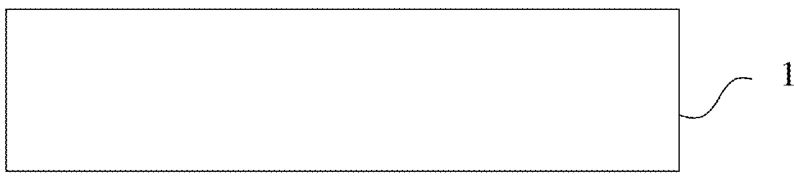

FIG. 15*a* is a view of a fabrication process for the semiconductor device according to Embodiment IV of the present disclosure.

Figure 15B:
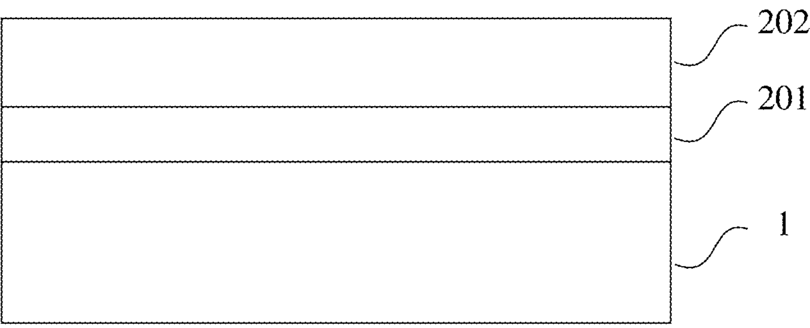

FIG. 15*b* is another view of the fabrication process for the semiconductor device according to Embodiment IV of the present disclosure.

Figure 15C:
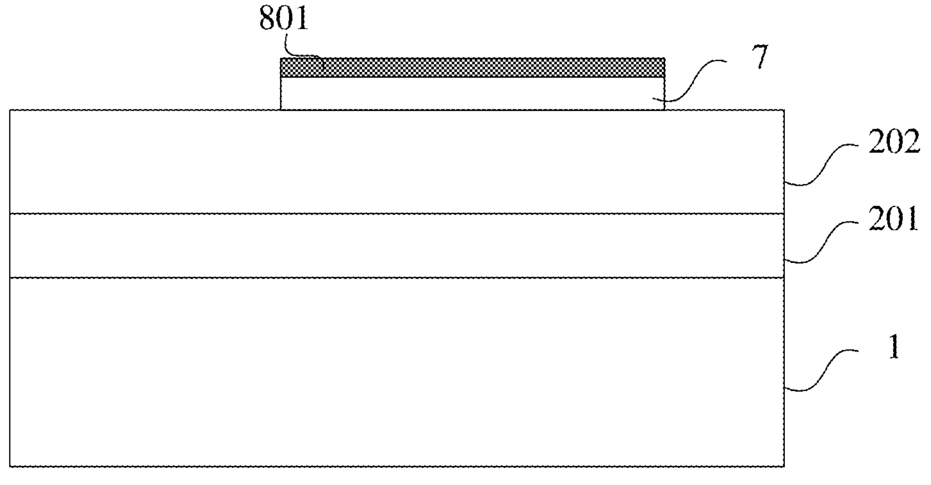

FIG. 15*c* is further another view of the fabrication process for the semiconductor device according to Embodiment IV of the present disclosure.

Figure 15D:
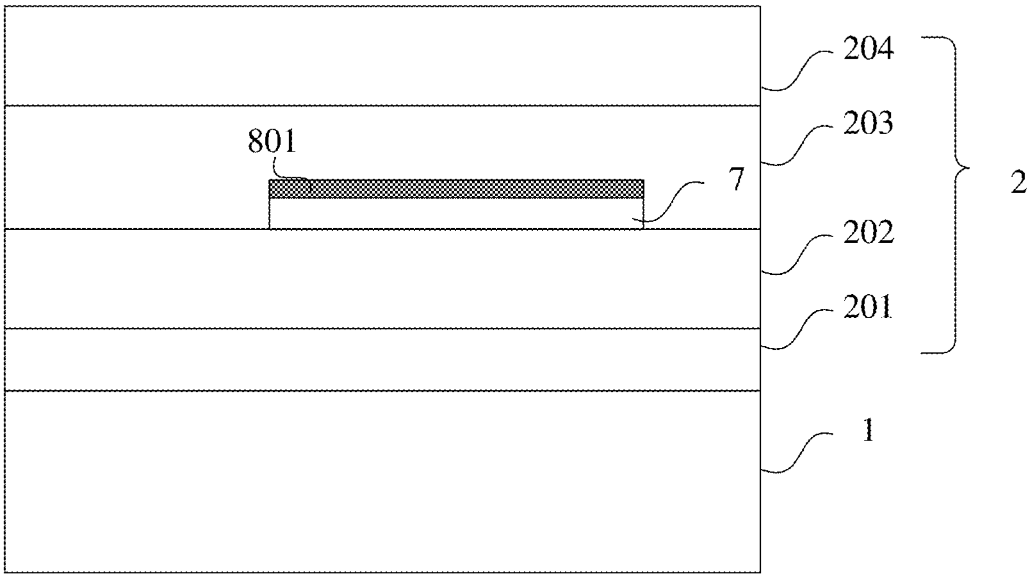

FIG. 15*d* is still another view of the fabrication process for the semiconductor device according to Embodiment IV of the present disclosure.

Figure 15E:
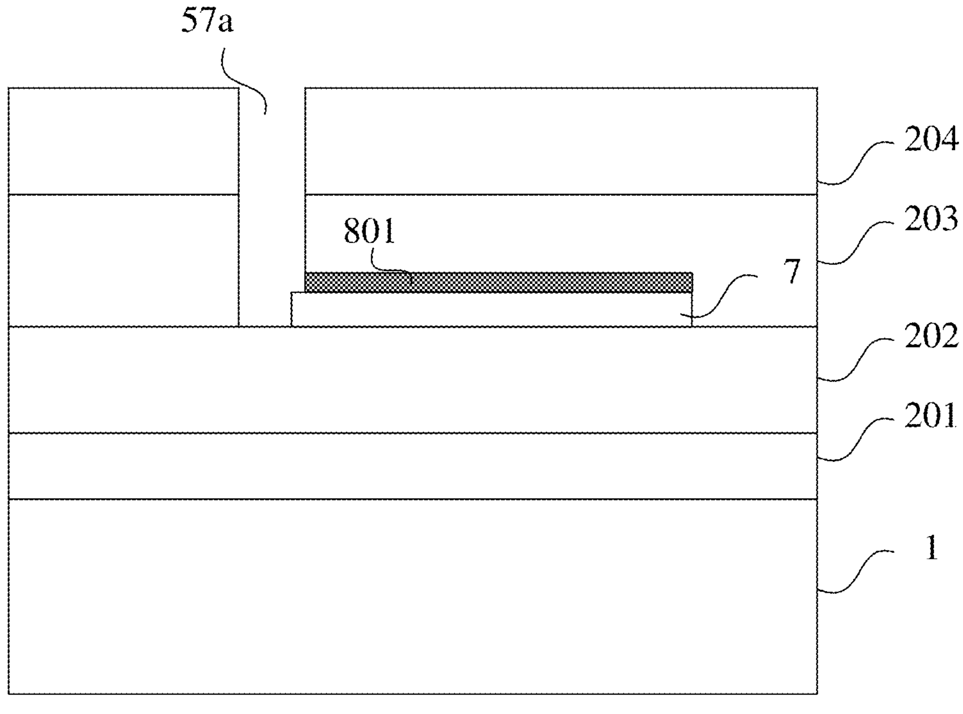

FIG. 15*e* is still another view of the fabrication process for the semiconductor device according to Embodiment IV of the present disclosure.

Figure 15F:
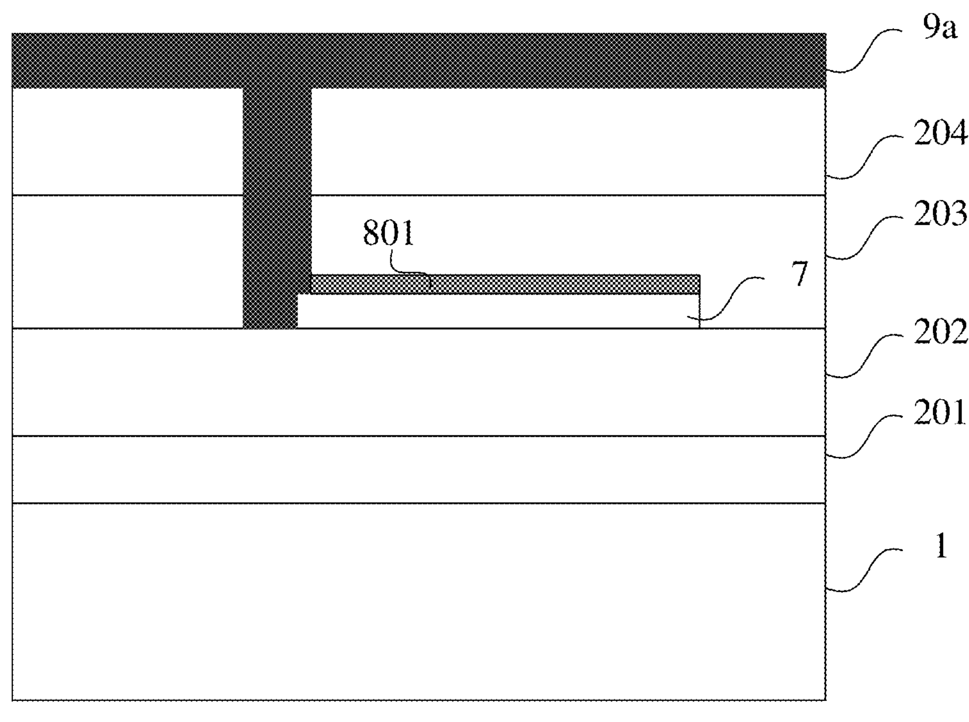

FIG. 15*f* is still another view of the fabrication process for the semiconductor device according to Embodiment IV of the present disclosure.

Figure 15G:
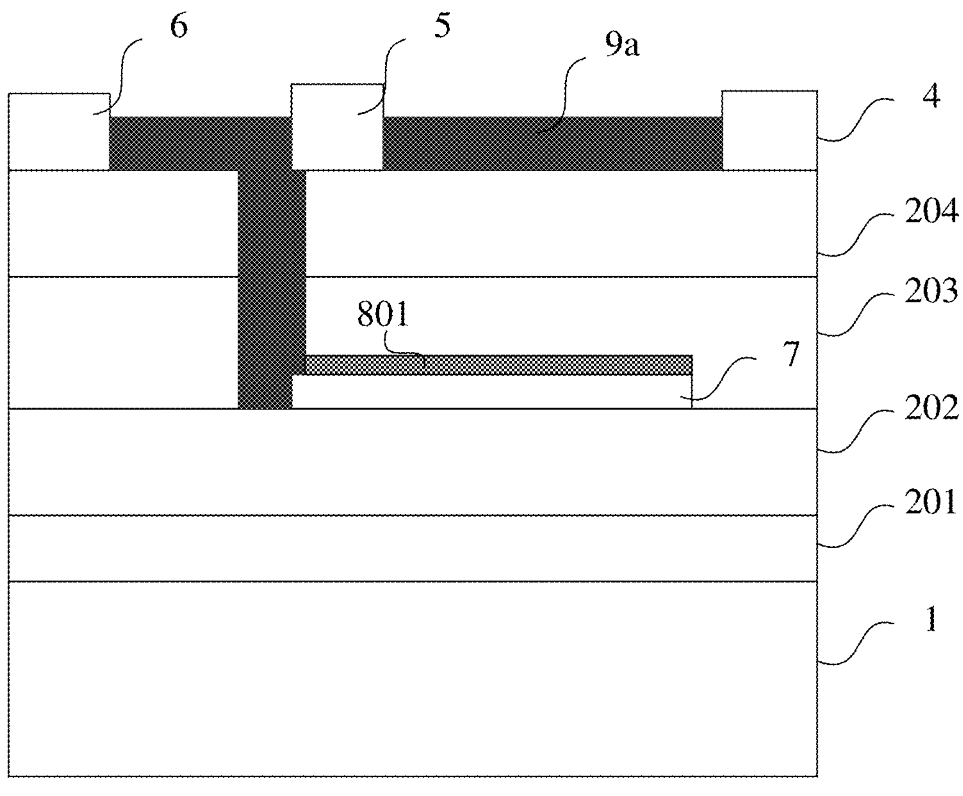

FIG. 15*g* is still another view of the fabrication process for the semiconductor device according to Embodiment IV of the present disclosure.

Figure 15H:
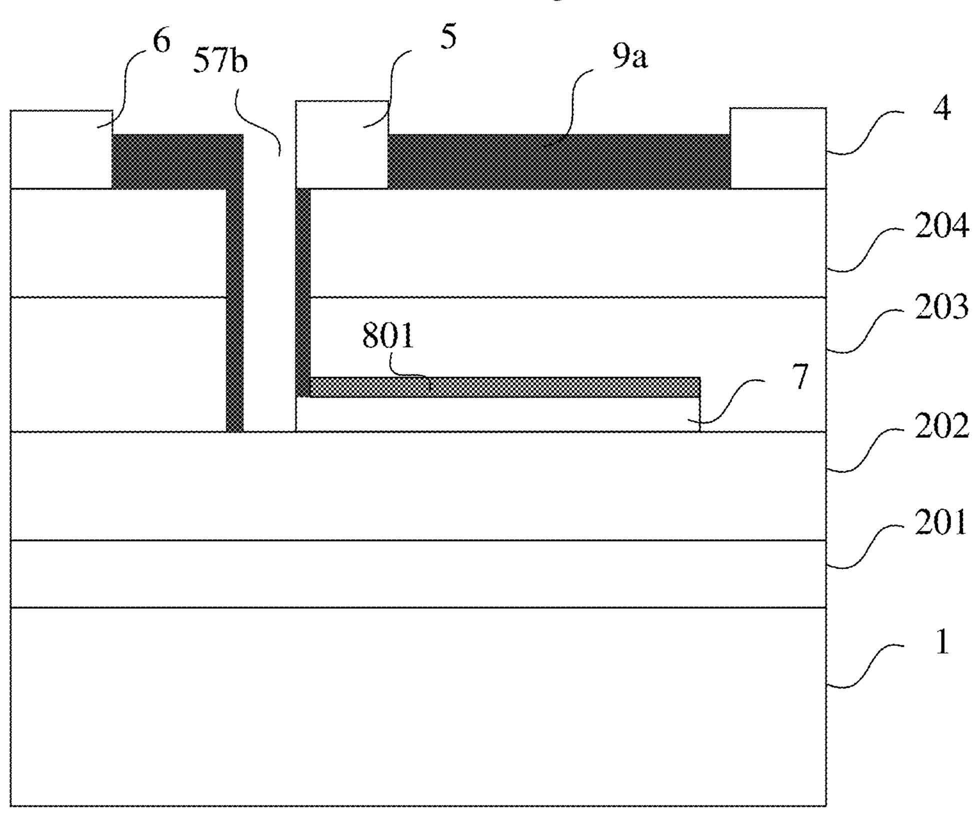

FIG. 15*h* is still another view of the fabrication process for the semiconductor device according to Embodiment IV of the present disclosure.

Figure 15I:
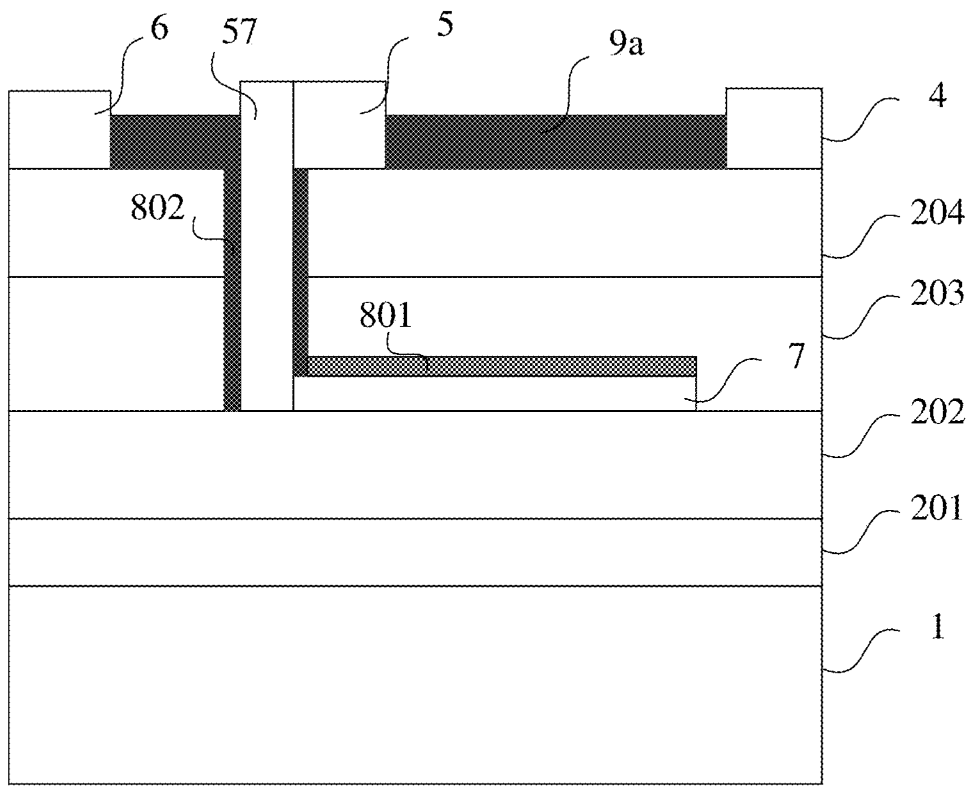

FIG. 15*i* is still another view of the fabrication process for the semiconductor device according to Embodiment IV of the present disclosure.

Figure 16:
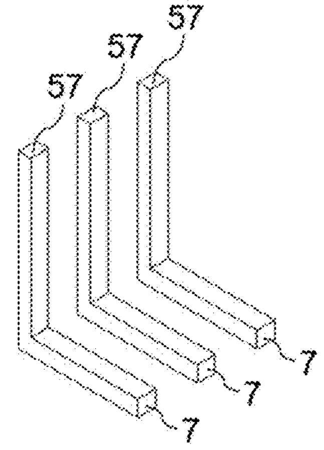

FIG. 16 illustrates a conductive layer and an electrocoupling structure of the semiconductor device shown in FIG. 13.

Figure 17:
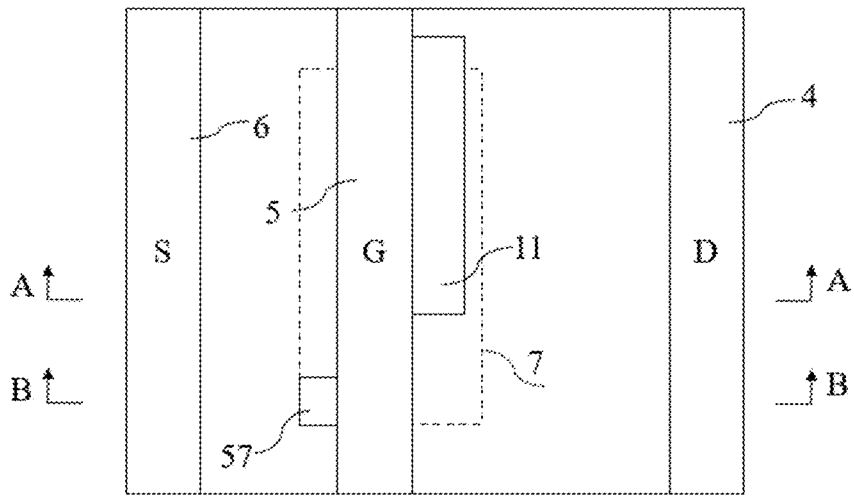

FIG. 17 is a schematic view of a top view structure of a semiconductor device according to Embodiment V of the present disclosure.

Figure 18:
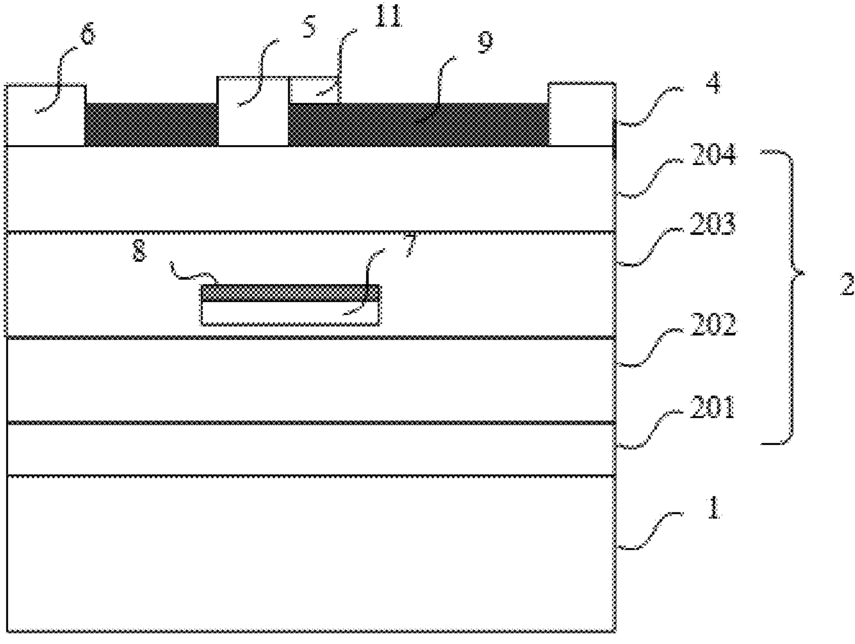

FIG. 18 is a cross-sectional view of the semiconductor device shown in FIG. 17 along a line A-A.

Figure 19A:
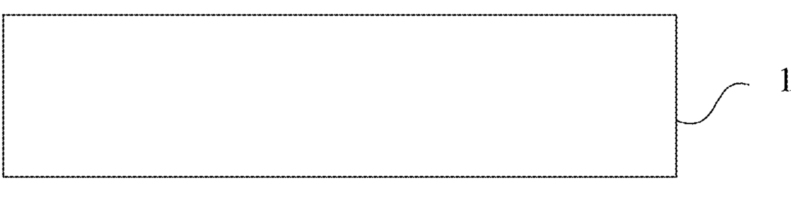

FIG. 19*a* is a view of a fabrication process for the semiconductor device according to Embodiment V of the present disclosure.

Figure 19B:
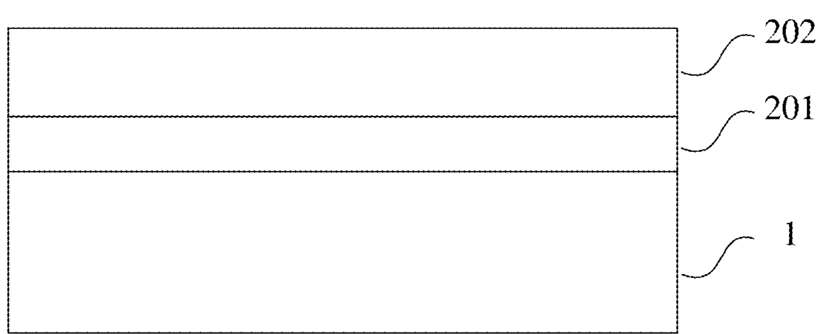

FIG. 19*b* is another view of the fabrication process for the semiconductor device according to Embodiment V of the present disclosure.

Figure 19C:
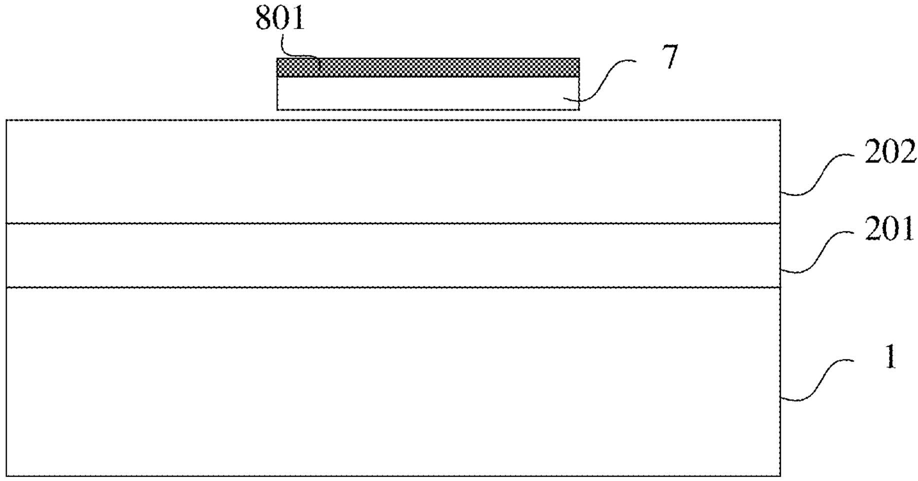

FIG. 19*c* is further another view of the fabrication process for the semiconductor device according to Embodiment V of the present disclosure.

Figure 19D:
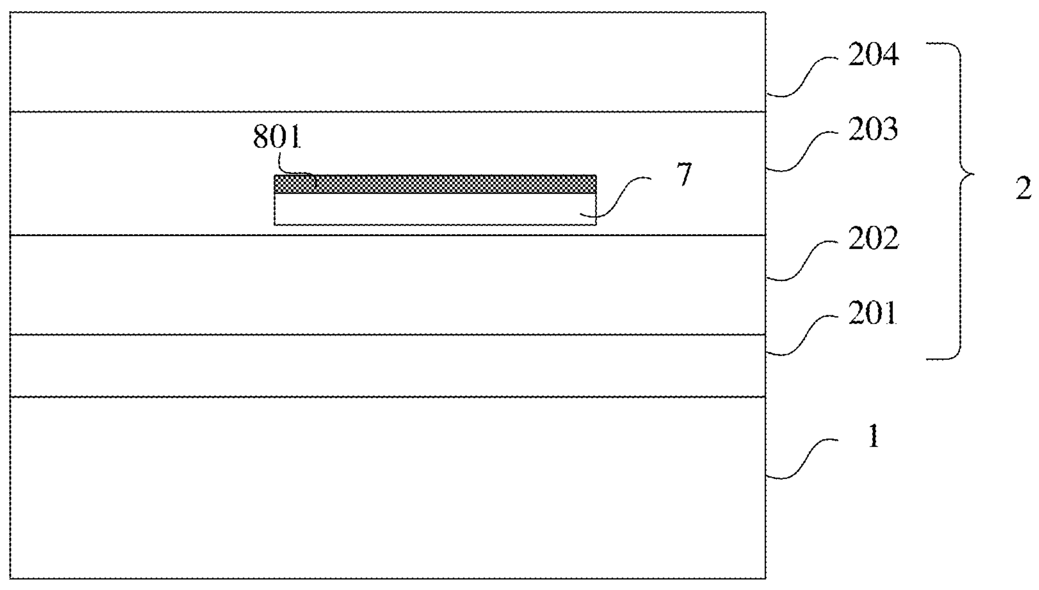

FIG. 19*d* is still another view of the fabrication process for the semiconductor device according to Embodiment V of the present disclosure.

Figure 19E:
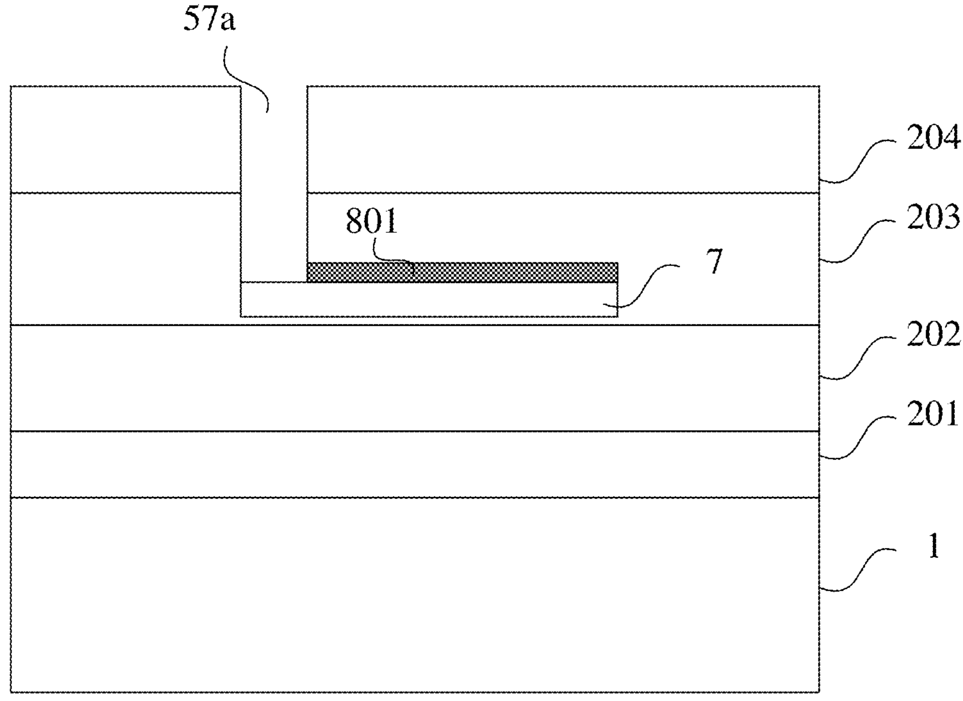

FIG. 19*e* is still another view of the fabrication process for the semiconductor device according to Embodiment V of the present disclosure.

Figure 19F:
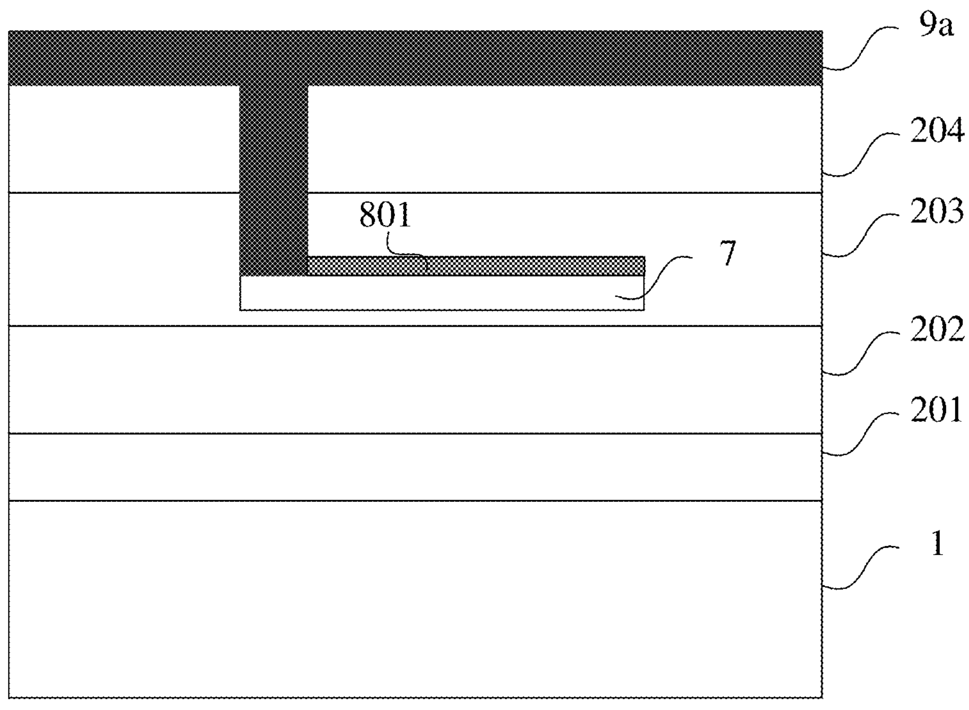

FIG. 19*f* is still another view of the fabrication process for the semiconductor device according to Embodiment V of the present disclosure.

Figure 19G:
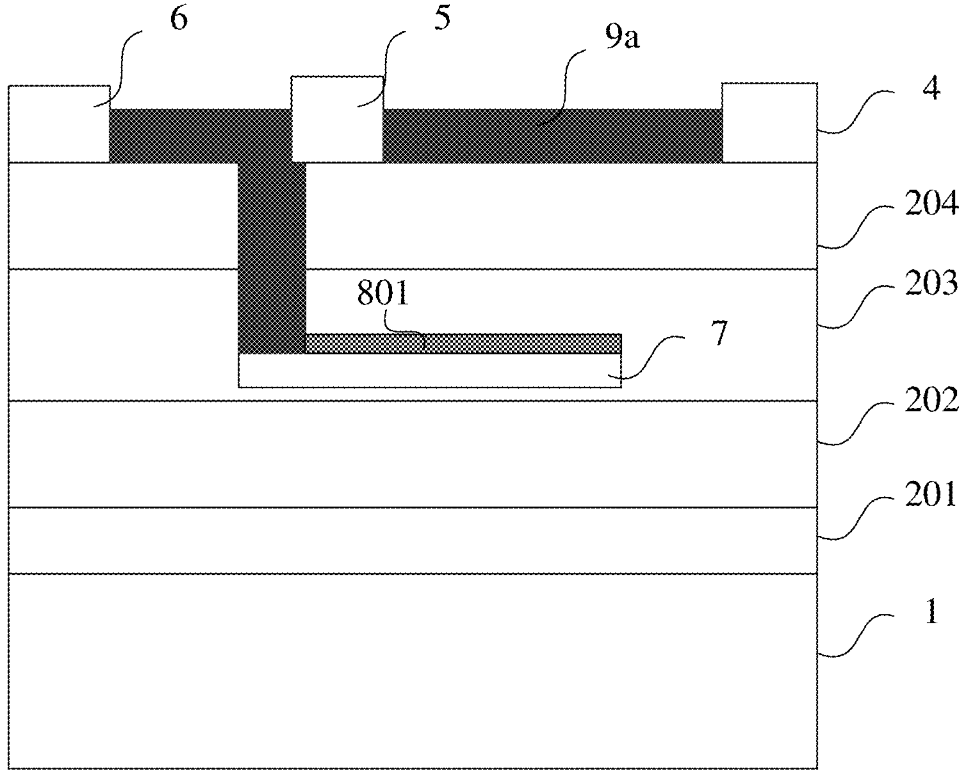

FIG. 19*g* is still another view of the fabrication process for the semiconductor device according to Embodiment V of the present disclosure.

Figure 19H:
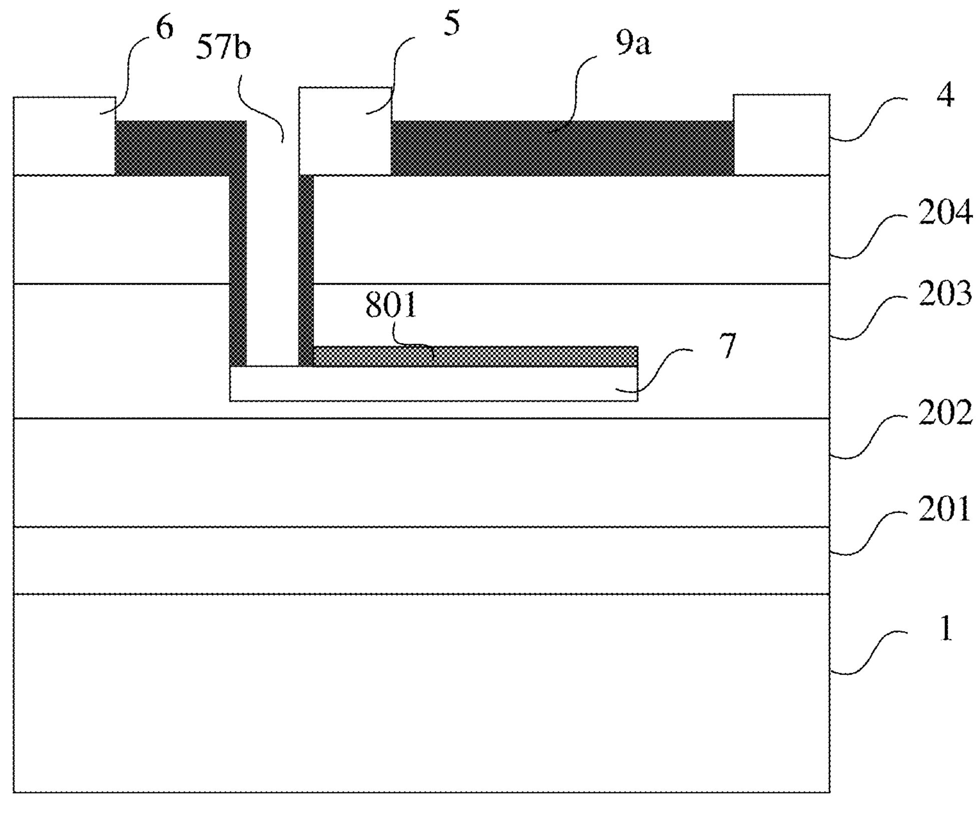

FIG. 19*h* is still another view of the fabrication process for the semiconductor device according to Embodiment V of the present disclosure.

Figures 19I, 20:
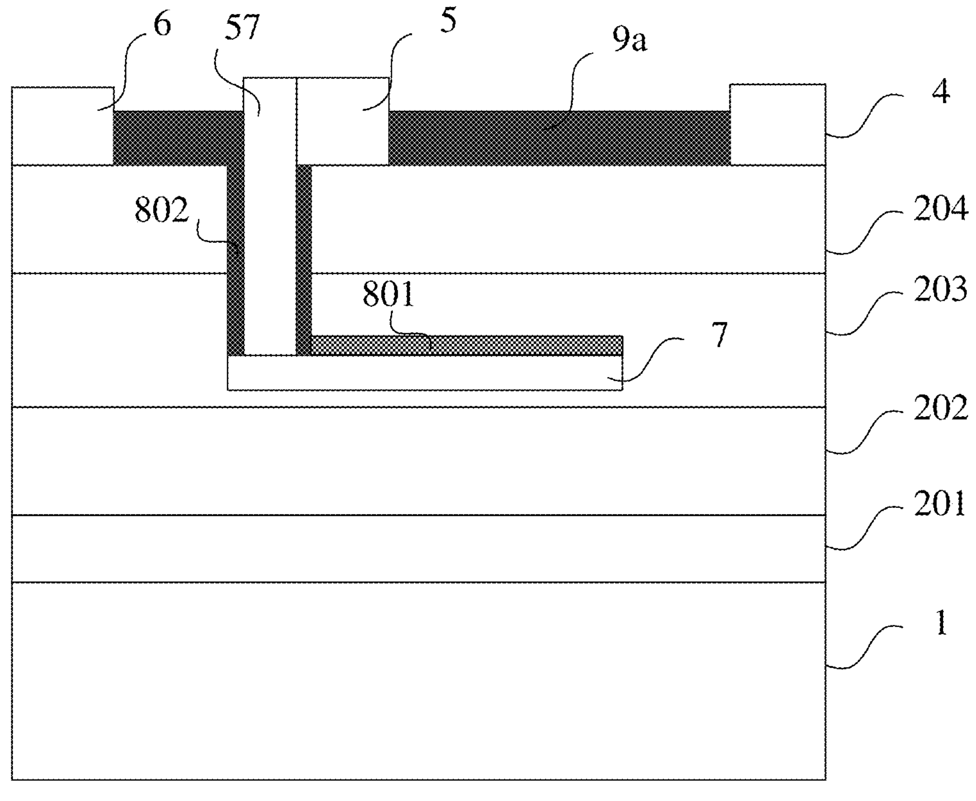

FIG. 19*i* is still another view of the fabrication process for the semiconductor device according to Embodiment V of the present disclosure.

FIG. 20 is a schematic view of a top view structure of a semiconductor device according to Embodiment VI of the present disclosure.

Figure 21:
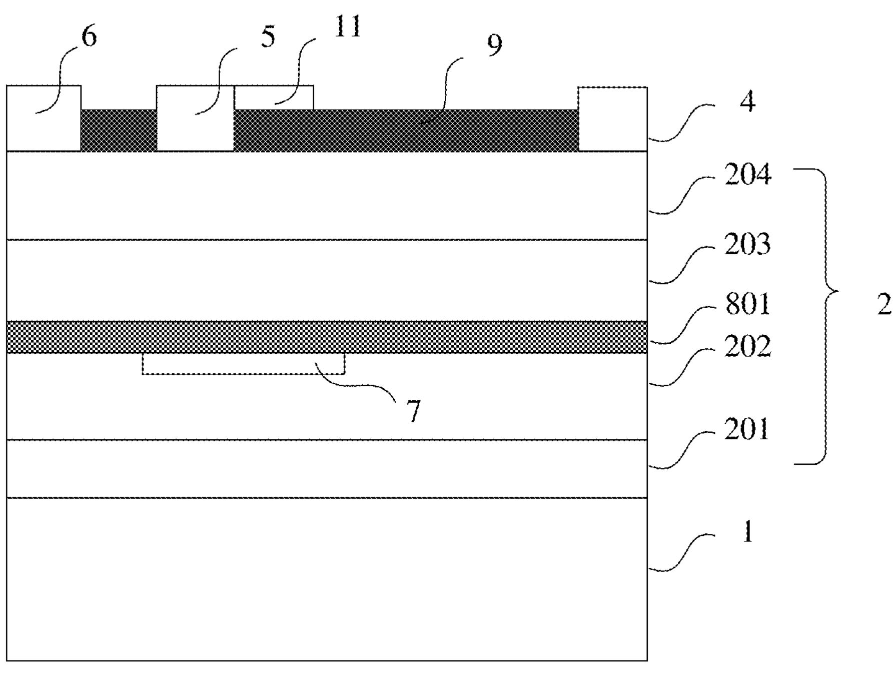

FIG. 21 is a cross-sectional view of the semiconductor device shown in FIG. 20 along a line A-A.

Figure 22A:
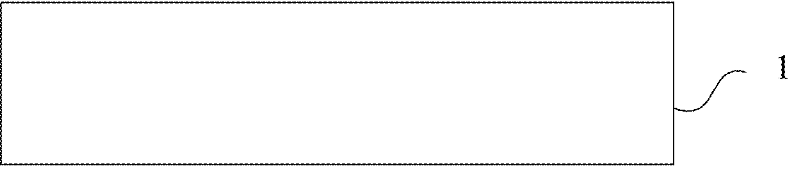

FIG. 22*a* is a view of a fabrication process for the semiconductor device according to Embodiment VI of the present disclosure.

Figure 22B:
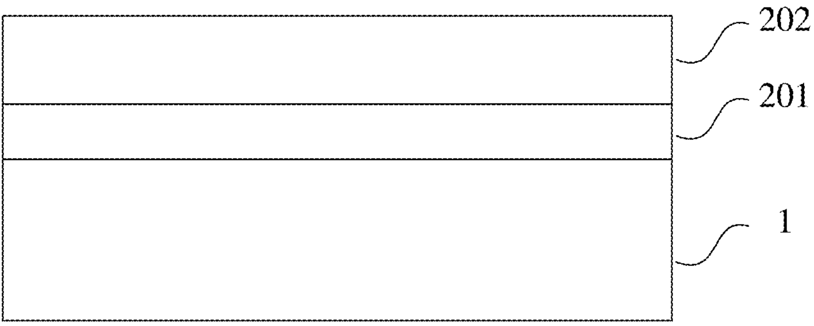

FIG. 22*b* is another view of the fabrication process for the semiconductor device according to Embodiment VI of the present disclosure.

Figure 22C:
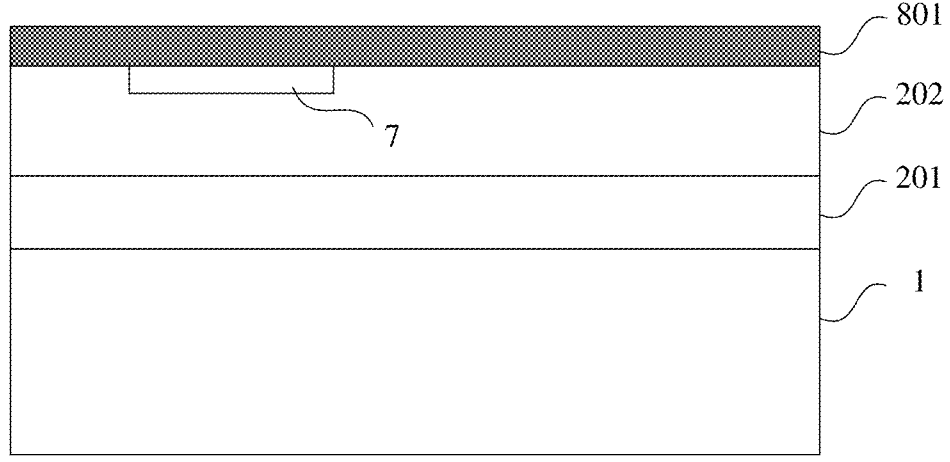

FIG. 22*c* is further another view of the fabrication process for the semiconductor device according to Embodiment VI of the present disclosure.

Figure 22D:
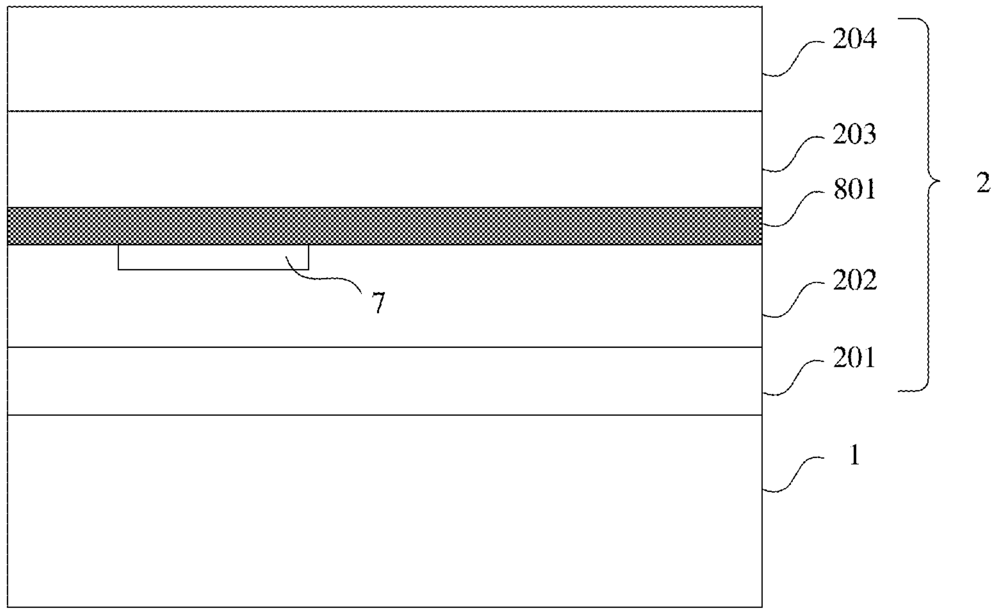

FIG. 22*d* is still another view of the fabrication process for the semiconductor device according to Embodiment VI of the present disclosure.

Figures 22E, 22F:
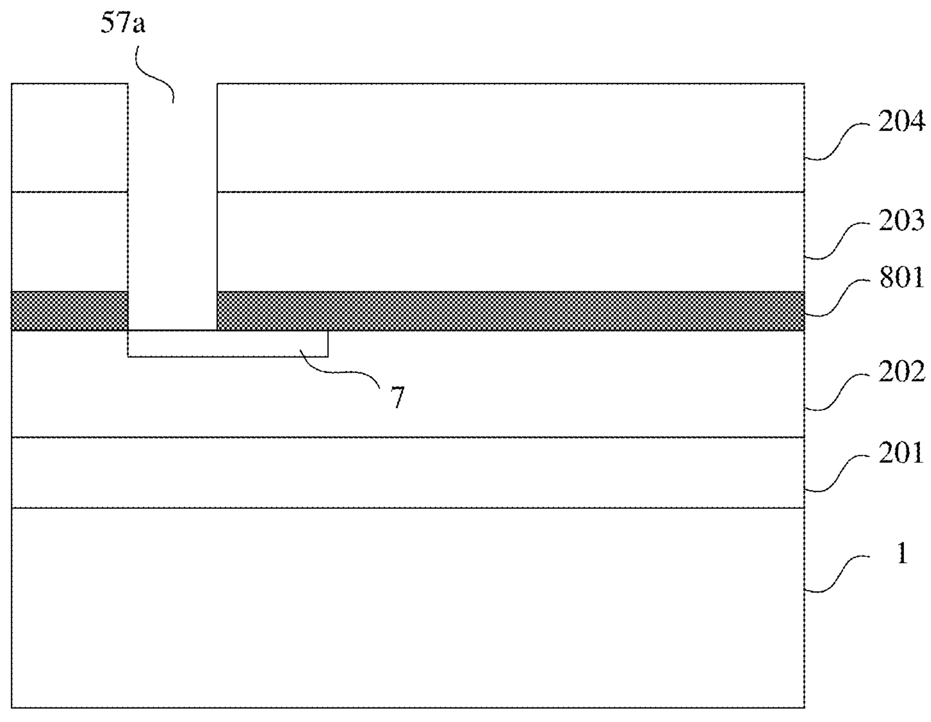

FIG. 22*e* is still another view of the fabrication process for the semiconductor device according to Embodiment VI of the present disclosure.

FIG. 22*f* is still another view of the fabrication process for the semiconductor device according to Embodiment VI of the present disclosure.

Figure 22G:
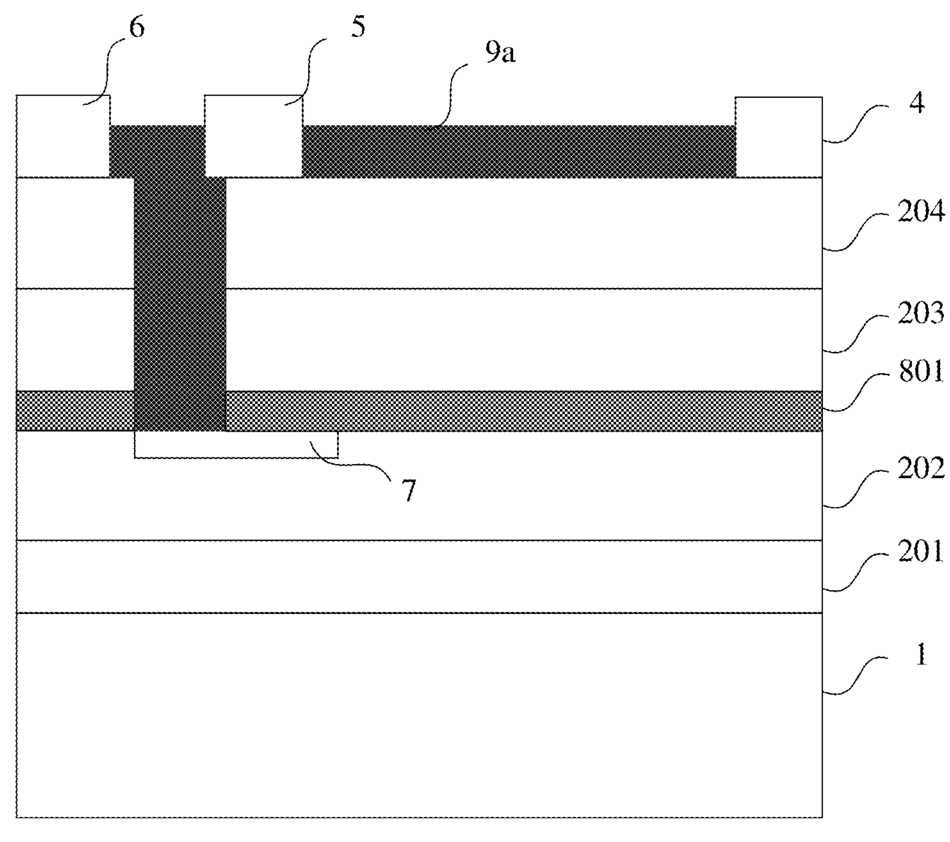

FIG. 22*g* is still another view of the fabrication process for the semiconductor device according to Embodiment VI of the present disclosure.

Figure 22H:
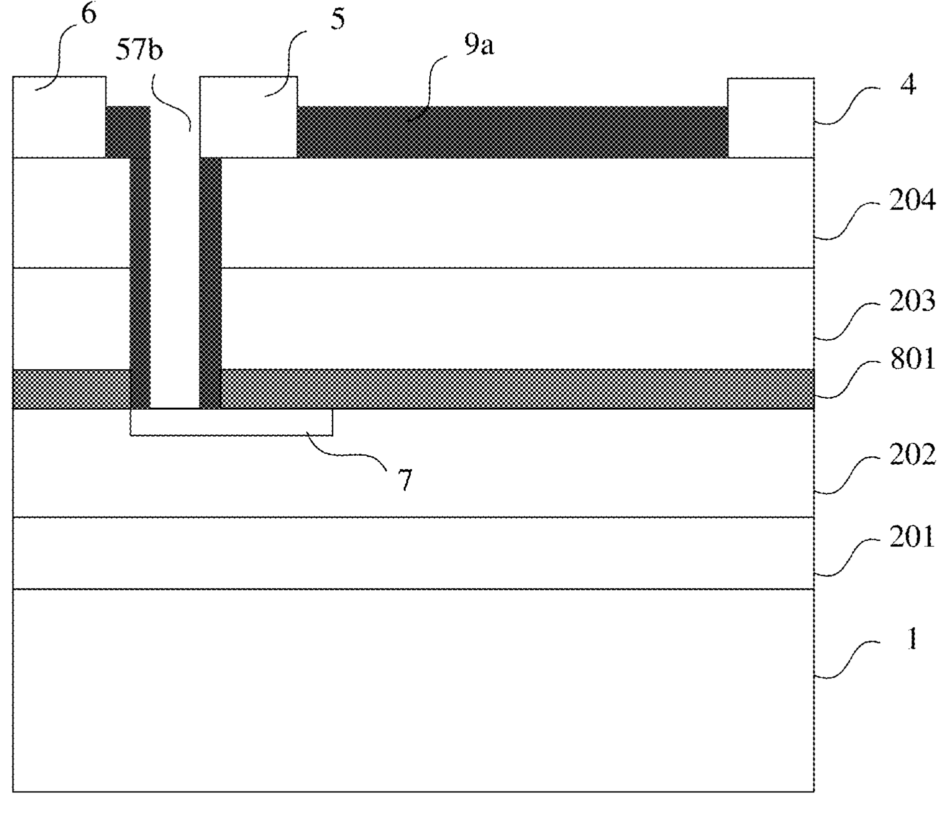

FIG. 22*h* is still another view of the fabrication process for the semiconductor device according to Embodiment VI of the present disclosure.

Figure 22I:
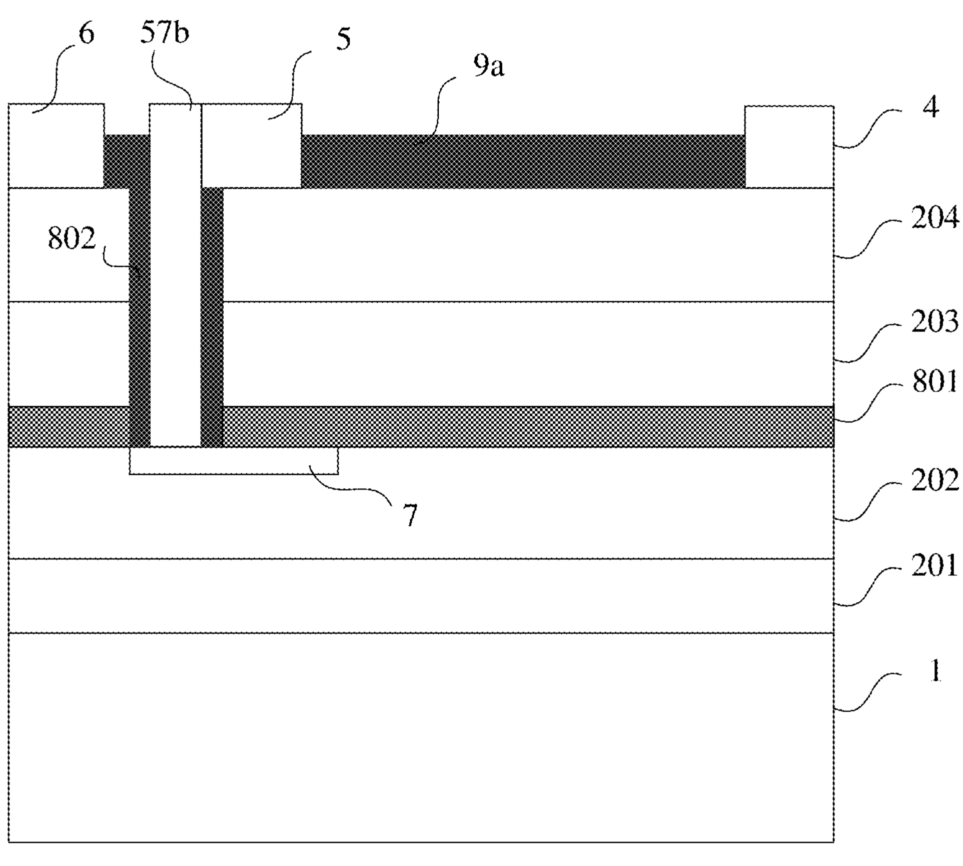

FIG. 22*i* is still another view of the fabrication process for the semiconductor device according to Embodiment VI of the present disclosure.

Figure 23:
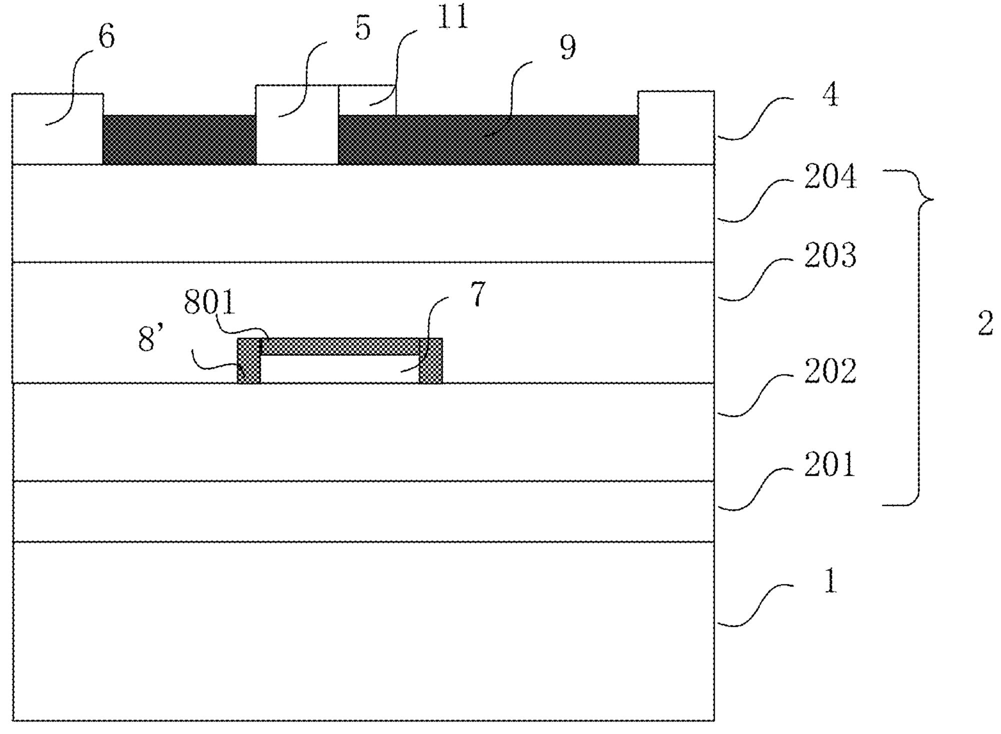

FIG. 23 is a cross-sectional view of a semiconductor device according to Embodiment VII of the present disclosure along a line A-A.

Figure 24:
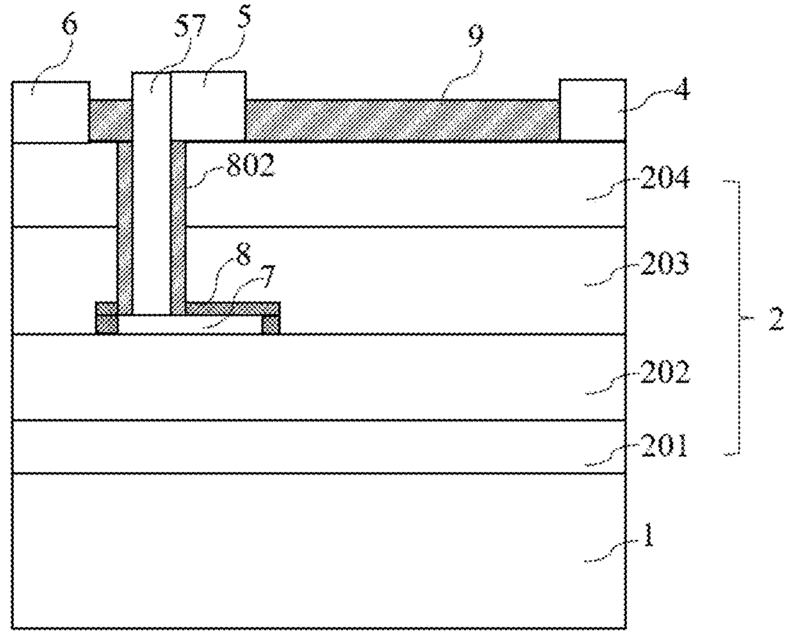

FIG. 24 is a cross-sectional view of the semiconductor device shown in FIG. 23 along a line B-B.

Figure 25A:
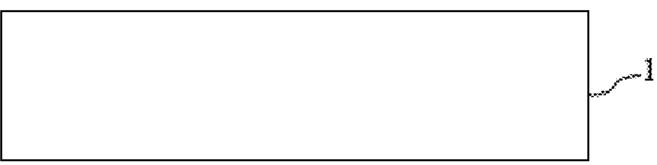

FIG. 25*a* is a view of a fabrication process for the semiconductor device according to Embodiment VII of the present disclosure.

Figure 25B:
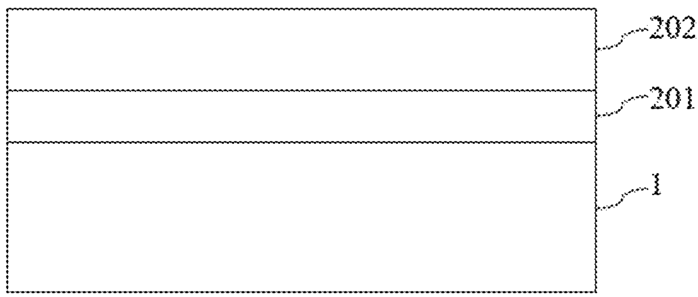

FIG. 25*b* is another view of the fabrication process for the semiconductor device according to Embodiment VII of the present disclosure.

Figure 25C:
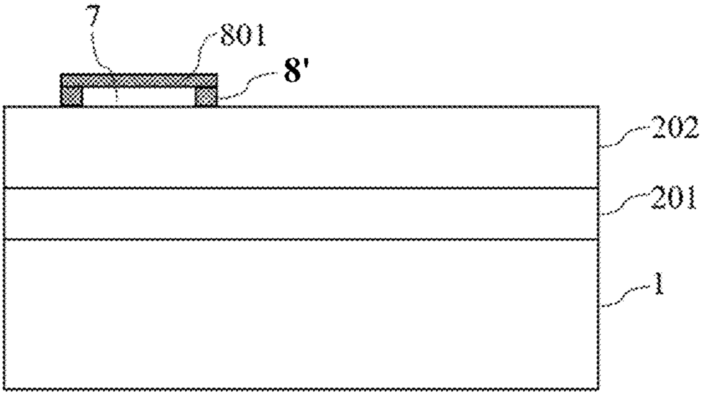

FIG. 25*c* is further another view of the fabrication process for the semiconductor device according to Embodiment VII of the present disclosure.

Figure 25D:
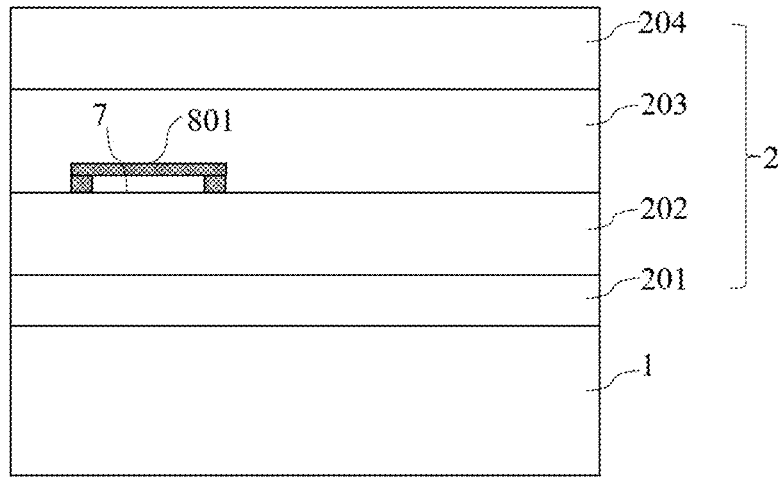

FIG. 25*d* is still another view of the fabrication process for the semiconductor device according to Embodiment VII of the present disclosure.

Figure 25E:
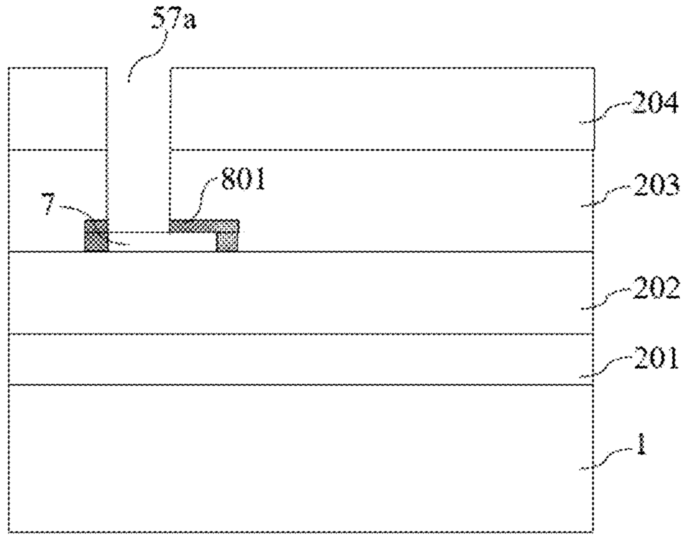

FIG. 25*e* is still another view of the fabrication process for the semiconductor device according to Embodiment VII of the present disclosure.

Figure 25F:
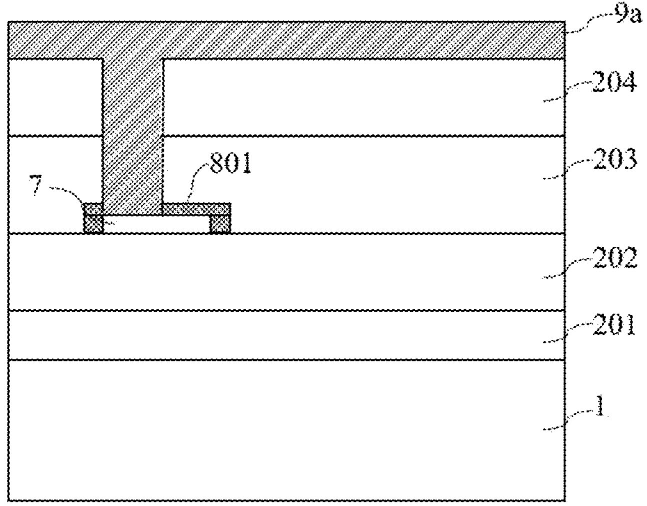

FIG. 25*f* is still another view of the fabrication process for the semiconductor device according to Embodiment VII of the present disclosure.

Figure 25G:
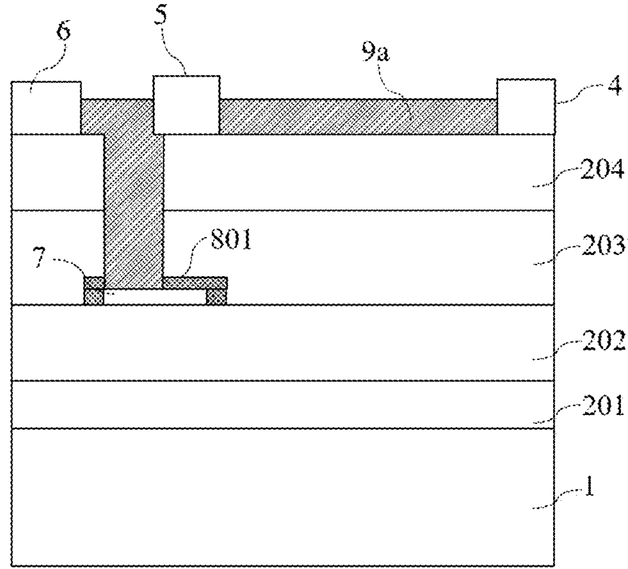

FIG. 25*g* is still another view of the fabrication process for the semiconductor device according to Embodiment VII of the present disclosure.

Figure 25H:
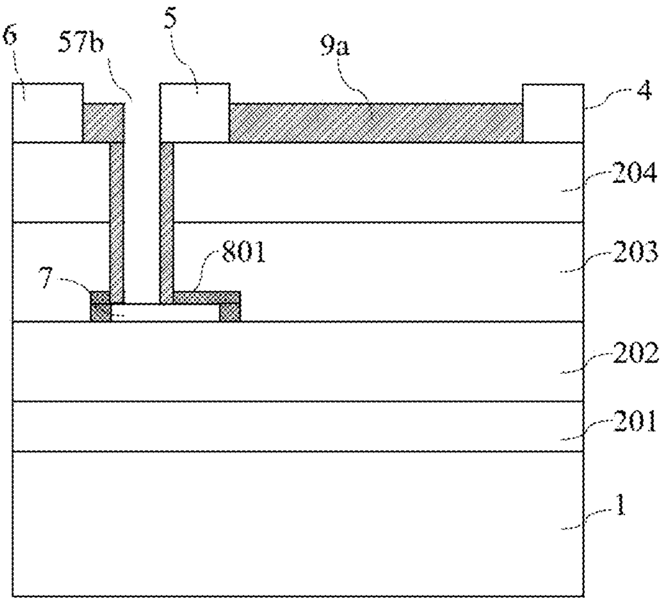

FIG. 25*h* is still another view of the fabrication process for the semiconductor device according to Embodiment VII of the present disclosure.

Figure 25I:
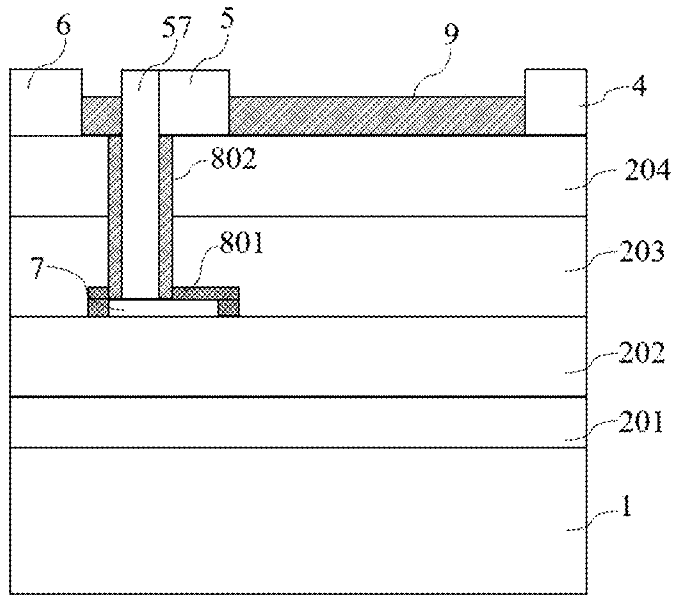

FIG. 25*i* is still another view of the fabrication process for the semiconductor device according to Embodiment VII of the present disclosure.

Figure 26:
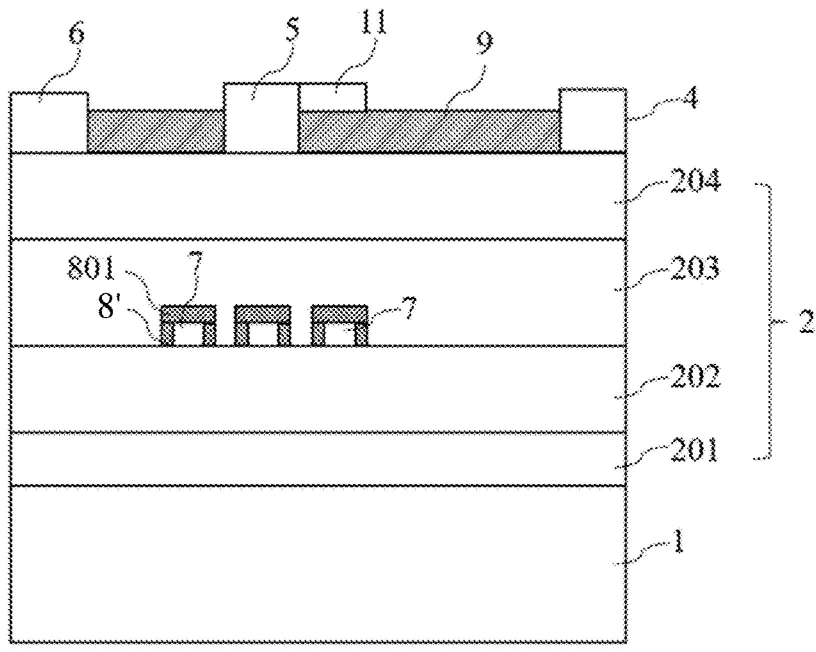

FIG. 26 is a cross-sectional view of a semiconductor device according to Embodiment VIII of the present disclosure along a line A-A.

Figure 27A:
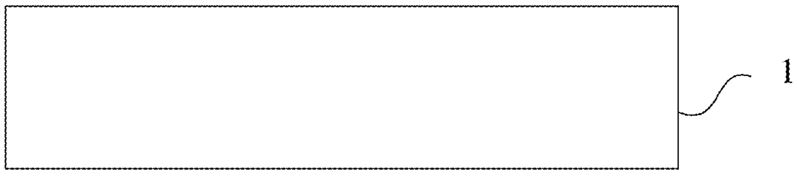

FIG. 27*a* is a view of a fabrication process for the semiconductor device according to Embodiment VIII of the present disclosure.

Figure 27B:
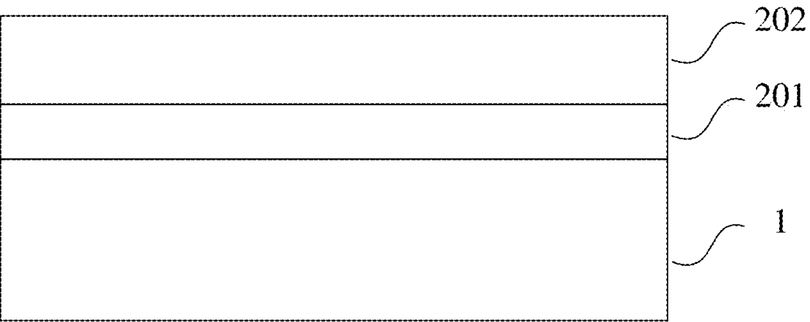

FIG. 27*b* is another view of the fabrication process for the semiconductor device according to Embodiment VIII of the present disclosure.

Figure 27C:
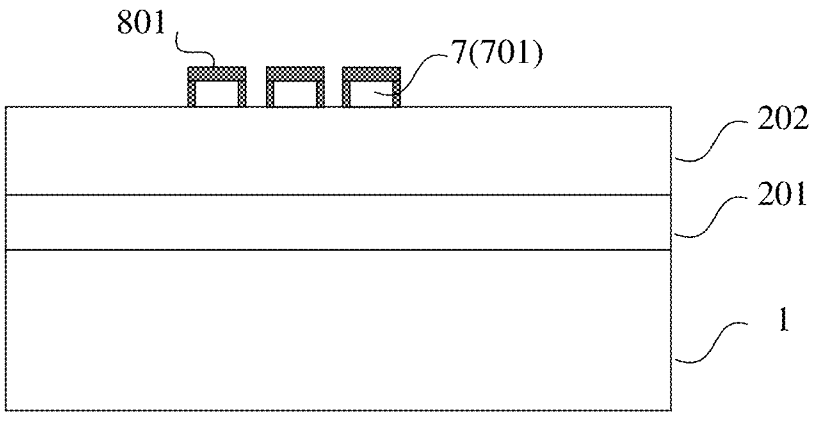

FIG. 27*c* is further another view of the fabrication process for the semiconductor device according to Embodiment VIII of the present disclosure.

Figure 27D:
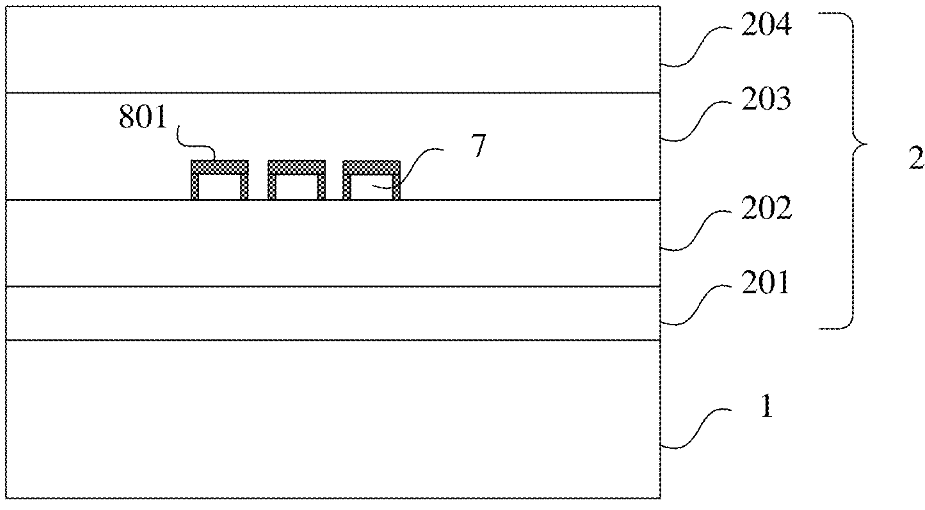

FIG. 27*d* is still another view of the fabrication process for the semiconductor device according to Embodiment VIII of the present disclosure.

Figure 27E:
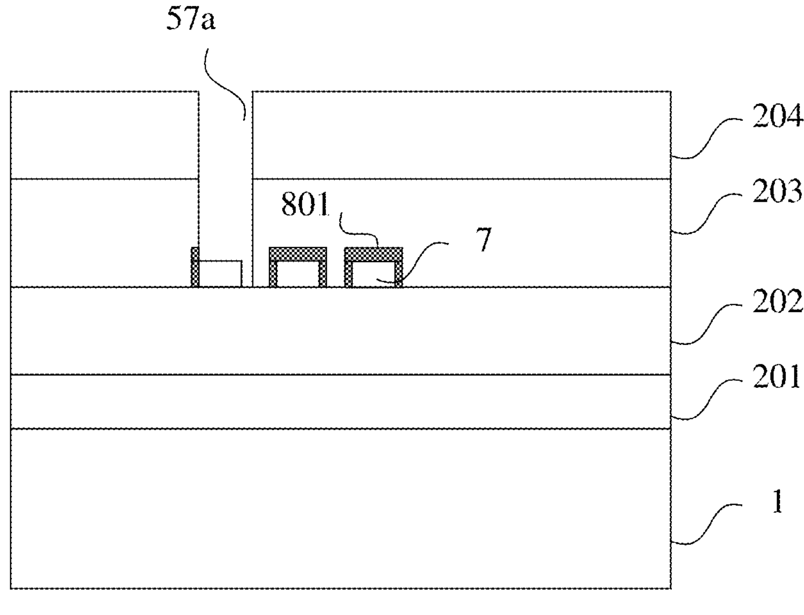

FIG. 27*e* is still another view of the fabrication process for the semiconductor device according to Embodiment VIII of the present disclosure.

Figure 27F:
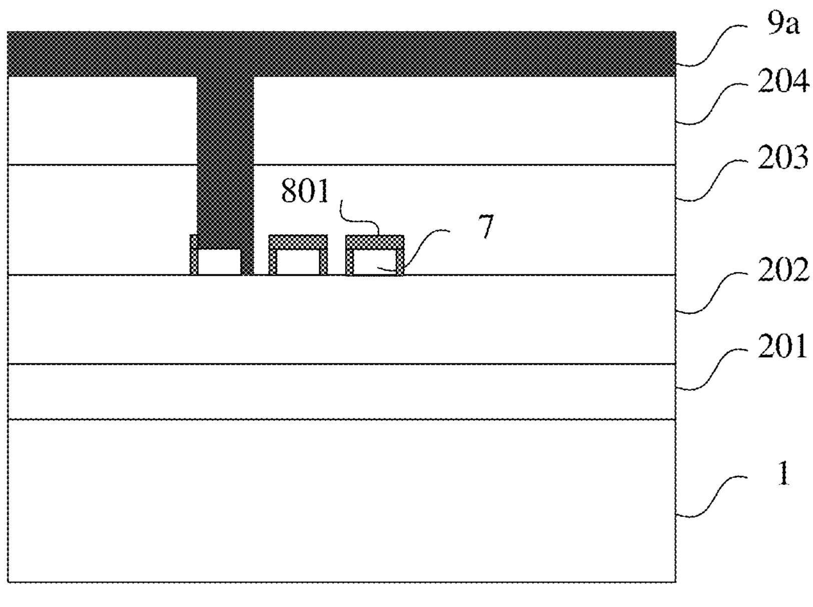

FIG. 27*f* is still another view of the fabrication process for the semiconductor device according to Embodiment VIII of the present disclosure.

Figure 27G:
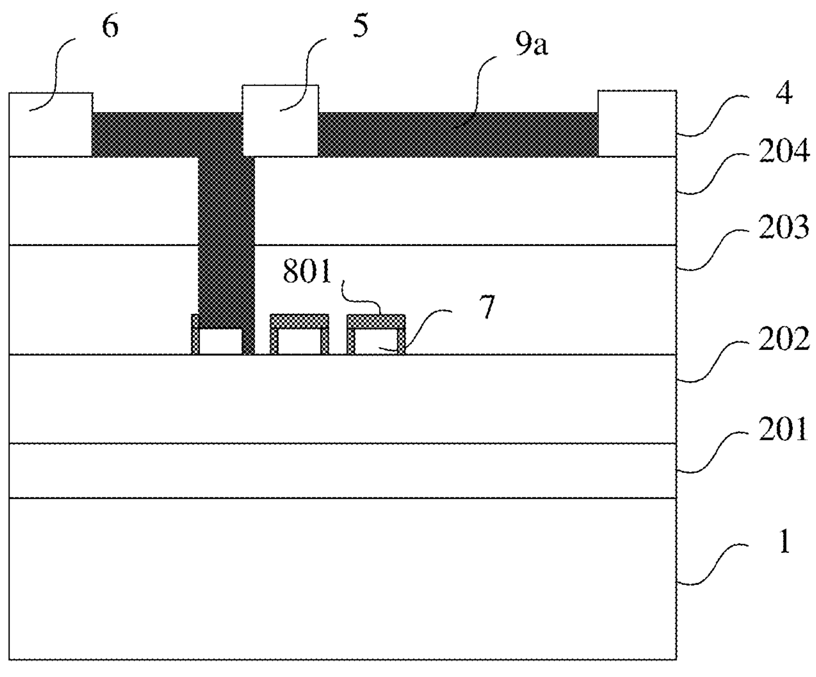

FIG. 27*g* is still another view of the fabrication process for the semiconductor device according to Embodiment VIII of the present disclosure.

Figure 27H:
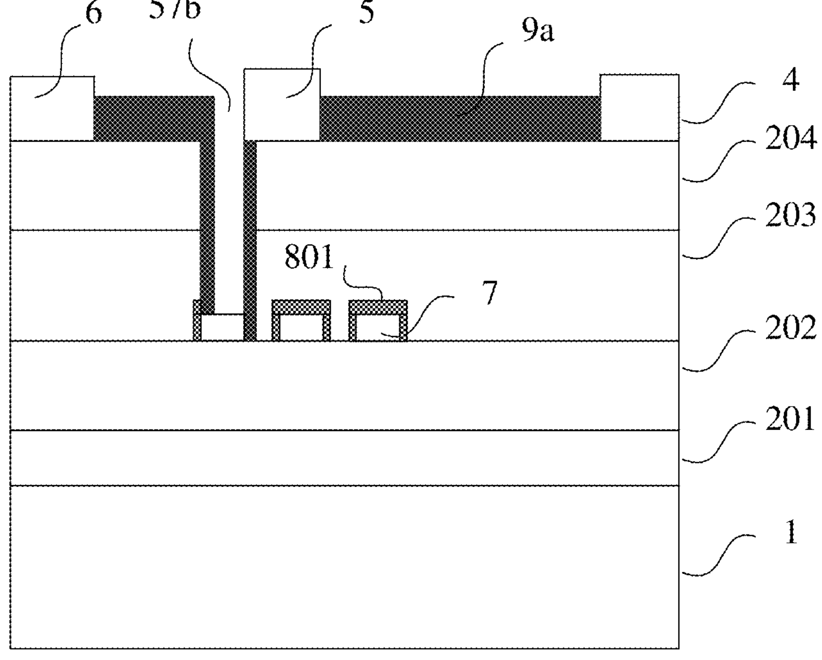

FIG. 27*h* is still another view of the fabrication process for the semiconductor device according to Embodiment VIII of the present disclosure.

Figure 27I:
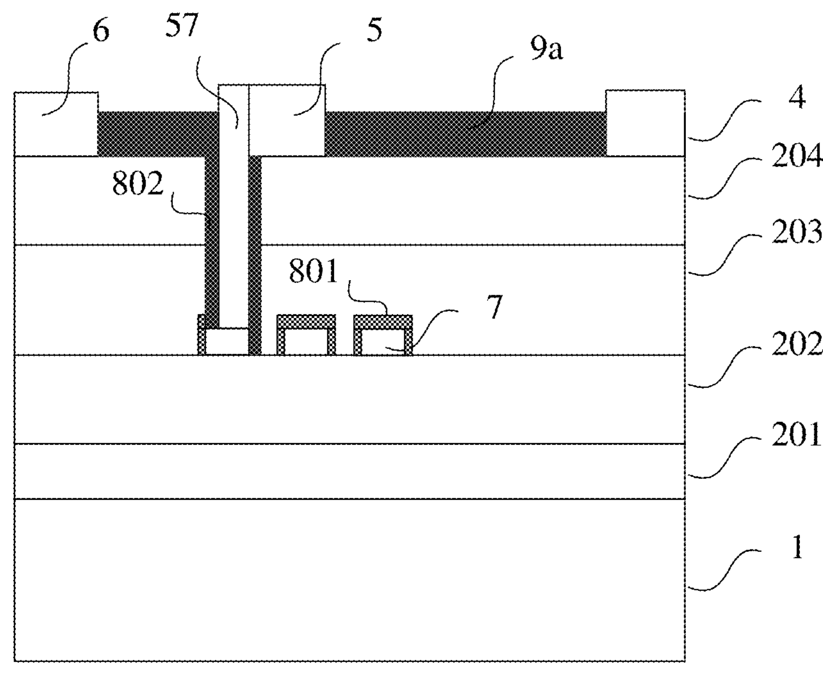

FIG. 27*i* is still another view of the fabrication process for the semiconductor device according to Embodiment VIII of the present disclosure.

Figure 28:
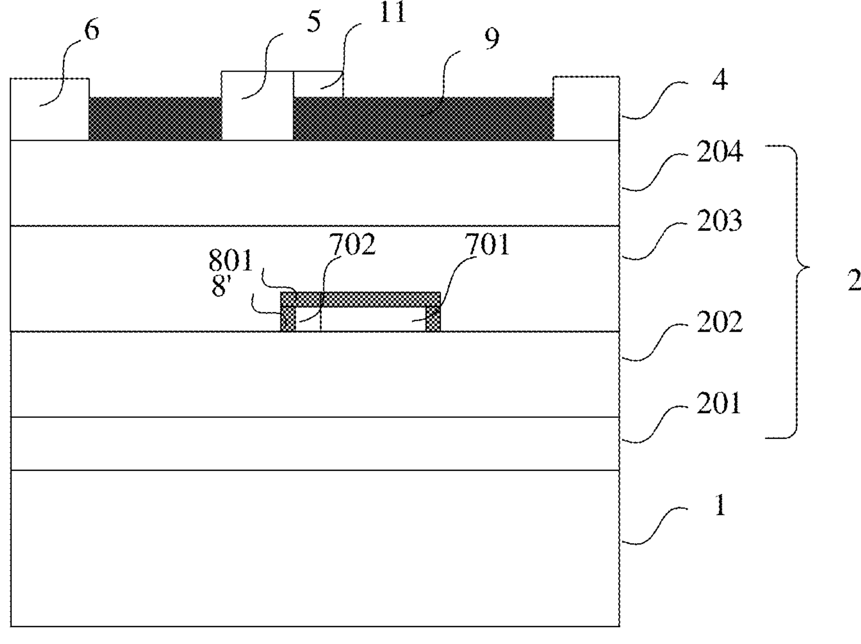

FIG. 28 is a cross-sectional view of a semiconductor device according to Embodiment IX of the present disclosure along a line A-A.

Figure 29:
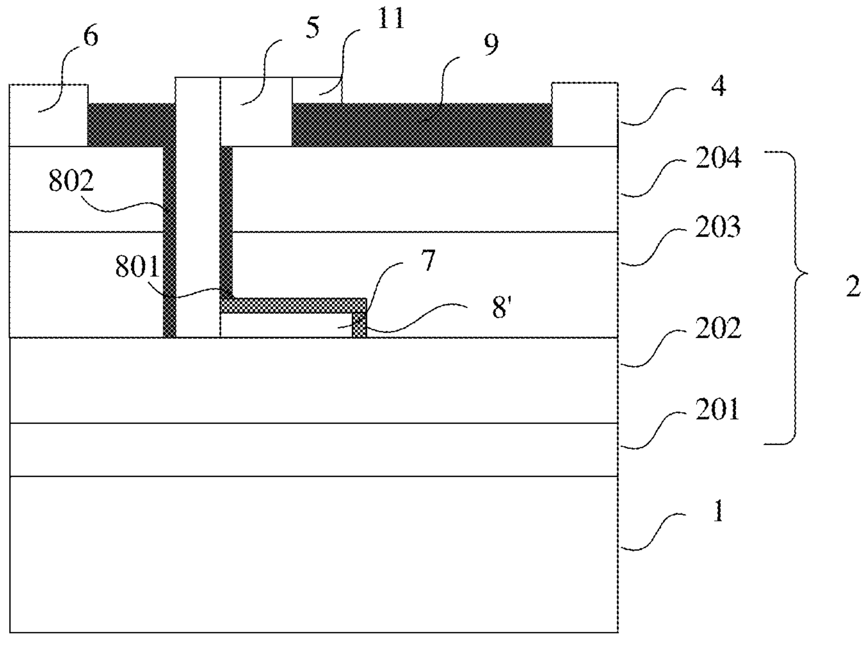

FIG. 29 is a cross-sectional view of a semiconductor device according to Embodiment X of the present disclosure along a line A-A.

Figure 30:
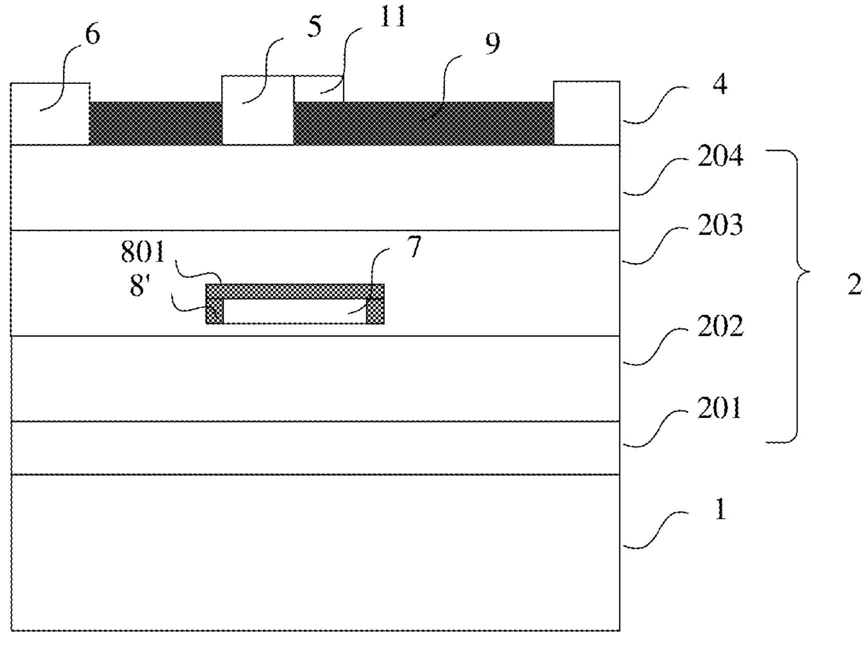

FIG. 30 is a cross-sectional view of a semiconductor device according to Embodiment XI of the present disclosure along a line A-A.

Figure 31:
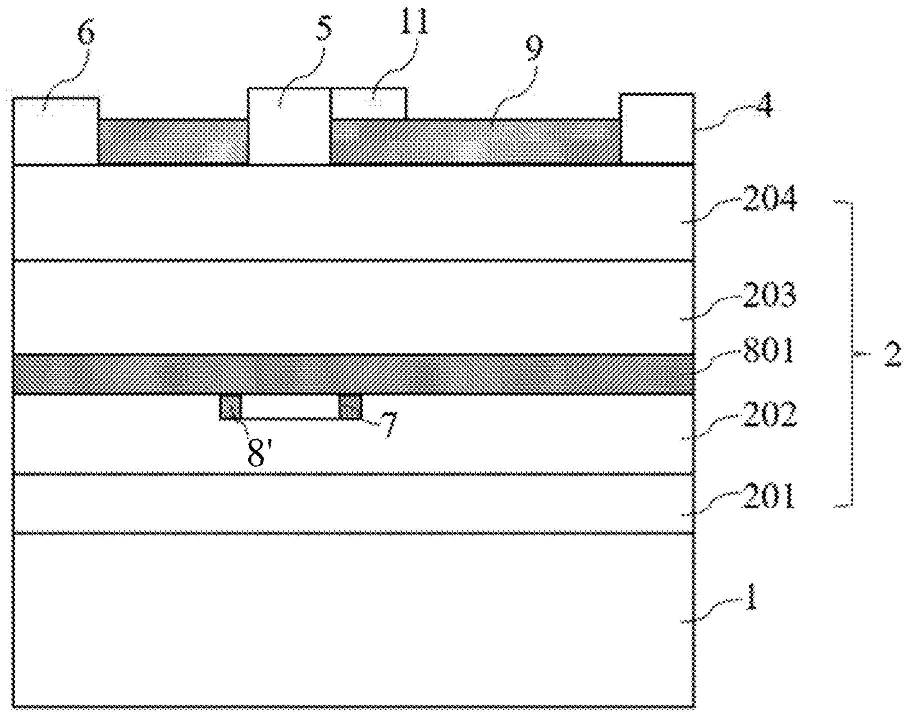

FIG. 31 is a cross-sectional view of a semiconductor device according to Embodiment XII of the present disclosure along a line A-A.

Figure 32:
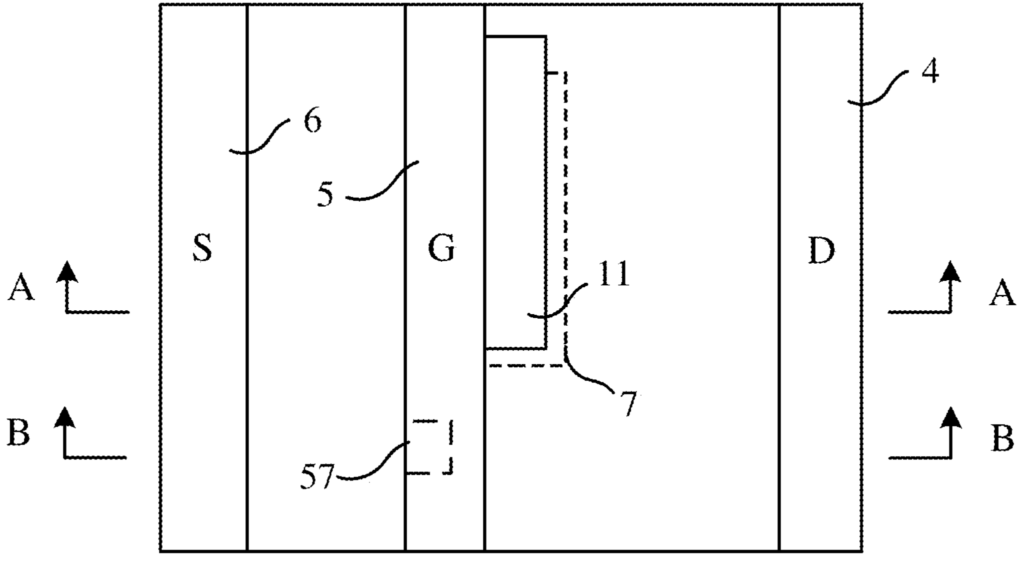

FIG. 32 is a schematic view of a top view structure of a semiconductor device according to Embodiment XIII of the present disclosure along a line A-A.

Figure 33:
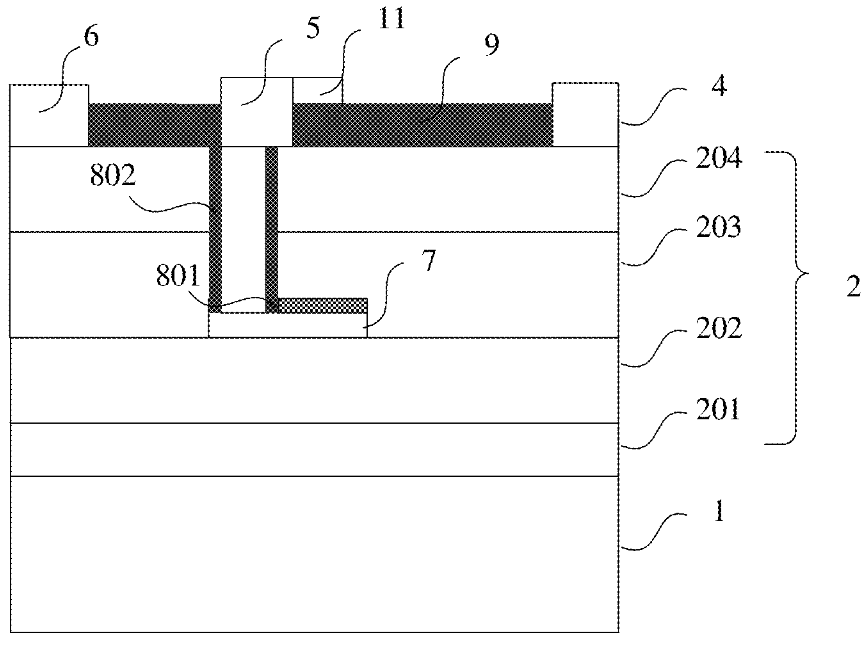

FIG. 33 is a cross-sectional view of the semiconductor device shown in FIG. 32 along a line A-A.

Figure 34:
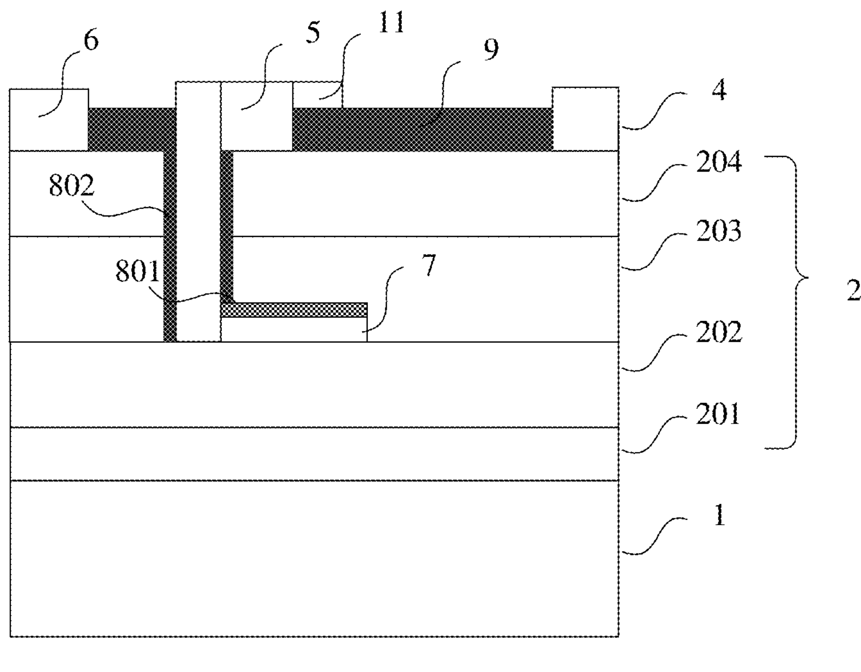

FIG. 34 is a cross-sectional view of a semiconductor device according to Embodiment XIV of the present disclosure along a line A-A.

Figure 35:
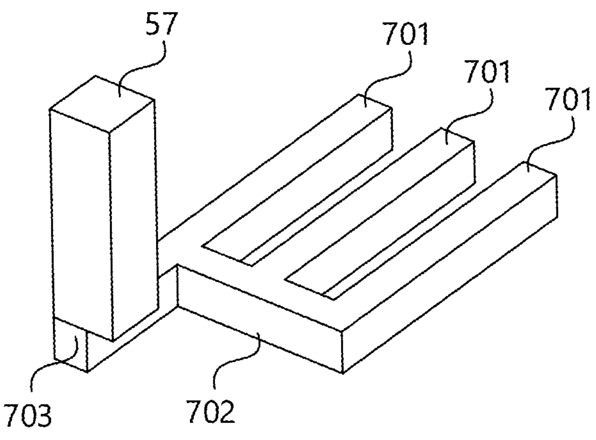

FIG. 35 illustrates a conductive layer and an electrocoupling structure of a semiconductor device according to Embodiment XV of the present disclosure.

In the accompanying drawings, same parts may be labeled with same reference numerals. The accompanying drawings are not drawn to actual scale.

DETAILED DESCRIPTION

The present disclosure will be further described below in conjunction with the accompanying drawings.

In the description of the present disclosure, "epitaxial growth" refers to the growth of a layer structure with certain requirements on a material to be processed. Techniques involving "epitaxial growth" may include metal-organic chemical vapor deposition (MOCVD), liquid phase epitaxy (LPE), vapor phase epitaxy (VPE), molecular beam epitaxy (MBE), atomic layer deposition (ALD), etc. For those skilled in the art, a suitable epitaxial growth technique may be selected according to actual situations.

In the description of the present disclosure, "etching" shall be broadly construed as growing a layer of photoresist on a surface of the material to be processed, selectively exposing and developing the photoresist through a mask to leave a photoresist layer on the surface of the material to be processed that is identical to the pattern of the mask, then selectively etching the material to be processed by a chemical or physical method, and finally stripping the photoresist layer to form a structure corresponding to the pattern of the mask on the material to be processed.

In the description of the present disclosure, an "ion implantation method" involves growing a layer of photoresist on a surface of the material to be processed, selectively exposing and developing the photoresist through a mask to leave a layer of photoresist on the surface of the material to be processed that is identical to the pattern of the mask, and then accelerating charged ions to a certain high energy and injecting them into the material to be processed, and finally stripping the photoresist layer to form a structure corresponding to the pattern of the mask on the material to be processed. A negative effect of the ion injection method is that lattice fracture or damage occurs in the material to be processed due to ion collisions. Therefore, an annealing process is required to eliminate the fracture or damage.

In the description of the present disclosure, an orientation or positional relationship indicated by "up" or "down" is based on the orientation or positional relationship shown in the accompanying drawings, is only for the purpose of facilitating the description of the present disclosure and simplifying the description, and is not intended to indicate or imply that the device or element referred to must have a particular orientation, or be constructed and operated in a particular orientation, and therefore is not to be construed as limitations of the present disclosure.

Various embodiments of the present disclosure provide a semiconductor device, also called a high electron mobility transistor, having advantages such as high breakdown voltage and high conductivity, which may serve as a semiconductor power device or a semiconductor radio frequency device, widely applied in the fields of base station communications, the Internet of Things, aerospace, radar systems, etc.

As shown in FIGS. 1-3, 6-7, 10-11, 13-14, 17-18, 20-21, 23-24, 26, 28-31, the semiconductor device includes a substrate 1 and a semiconductor layer 2 disposed on the substrate 1.

Exemplarily, as shown in FIGS. 1-2, and 23-24, the substrate 1 may be made of silicon (Si), silicon carbide (SiC), or sapphire. The semiconductor layer 2 includes a first semiconductor stack layer and a second semiconductor layer disposed on the first semiconductor stack layer. In some embodiments, the second semiconductor layer includes a barrier layer 204, a main fabrication material of which may be an alloy nitride, in particular aluminum gallium nitride (AlGaN), with a thickness of 5 nm-50 nm. The first semiconductor stack layer includes a buffer layer 202 and a channel layer 203 disposed on the buffer layer 202, where a main fabrication material of the channel layer 203 may be selected as a Group III-V nitride, in particular a gallium nitride (GaN), with a thickness of 100 nm-1000 nm. When the channel layer 203 includes a Group III-V nitride and the barrier layer 204 includes an alloy nitride, the channel layer 203 and the barrier layer 204 are heterogeneous structures, and two-dimensional electron gas (2DEG) is formed at an interface between the channel layer 203 and the barrier layer 204, due to a large polarization intensity difference and forbidden band width difference between the two. Each of the channel layer 203 and the barrier layer 204 may be of a one-layer or multi-layer structure. In some embodiments, the channel layer 203 includes a 300 nm high-resistance gallium nitride layer and a 200 nm high-temperature gallium nitride layer sequentially distributed in a direction away from the substrate 1, while the barrier layer 204 includes a 1 nm aluminum nitride layer, a 20 nm aluminum gallium nitride layer, and a 2 nm gallium nitride layer sequentially distributed in a direction away from the channel layer 203.

Exemplarily, the semiconductor layer 2 may further include a nucleation layer 201 disposed on the substrate 1, with the buffer layer 202 disposed on the nucleation layer 201. The nucleation layer 201 is made of aluminum carbide (AlN) or gallium nitride (GaN) with a thickness of 10 nm-500 nm, for improving the growth quality of the buffer layer 202 and having an isolation effect. And the buffer layer 202 is made of iron-doped gallium nitride, carbon-doped gallium nitride, gallium nitride (GaN), or aluminum gallium nitride (AlGaN), with a thickness of 100 nm-10 um, for improving the growth quality of the Group III-V nitride. The buffer layer 202 may be of a one-layer or multi-layer structure. When the substrate 1 is selected as a silicon material, the buffer layer 202 may be of a three-layer structure, with the first layer being AlGaN with an aluminum content of 75% and an entire layer thickness of 400 nm, the second layer being AlGaN with an aluminum content of 50% and an entire layer thickness of 900 nm, and the third layer being AlGaN with an aluminum content of 25% and an entire layer thickness of 1500 nm.

As shown in FIGS. 1-3, 6-7, 10-11, 13-14, 17-18, 20-21, 23-24, 26, 28-31, the semiconductor device further includes a terminal layer arranged on the second semiconductor layer.

Exemplarily, as shown in FIGS. 1-2, and 23-24, the semiconductor device further includes a terminal layer disposed on the barrier layer 204. The terminal layer includes a gate 5, a drain 4, and a source 6 that are spaced apart. Each of the source 6 and the drain 4 may be of a one-layer or a multi-layer structure, and exemplarily, each of the drain 4 and the source 6 may include a titanium (Ti) layer, an aluminum (Al) layer, a nickel (Ni) layer, and a gold (Au) layer that are sequentially connected. The source 6 is in ohmic contact with the barrier layer 204 and is electrically coupled to the two-dimensional electron gas. The drain 4 is also in ohmic contact with the barrier layer 204 and is electrically coupled to the two-dimensional electron gas. The gate 5 primarily includes one or both of a nickel (Ni) layer and a gold (Au) layer and is in Schottky contact with the barrier layer 204. When using the semiconductor device, varying the electric field of the gate 5 may modulate the two-dimensional electron gas and control the turn-on and turn-off of the source 6 and drain 4.

Exemplarily, the semiconductor device further includes a passivation layer 9. The passivation layer 9 is disposed on the barrier layer 204 and in avoidance with the gate 5, the drain 4, and the source 6. That is, the passivation layer 9 defines avoidance holes for penetration of the gate 5, the drain 4, and the source 6, respectively, such that the passivation layer 9 may provide insulating insulation for the gate 5, the drain 4, and the source 6 to prevent the semiconductor device from malfunctioning due to the occurrence of erroneous turn-on between the terminals. The fabrication material of the passivation layer 9 includes one of insulating compounds such as silicon dioxide, silicon nitride, aluminum nitride, and alumina.

As shown in FIGS. 1-3, 6-7, 10-11, 13-14, 17-18, 20-21, 23-24, 26, 28-31, the semiconductor device further includes a conductive layer 7, disposed within the semiconductor layer 2 and between the substrate 1 and the two-dimensional electron gas; and an electrocoupling structure 57, extending from the gate 5 towards within the semiconductor layer 2 and connected to the conductive layer 7, for coupling the conductive layer 7 to the gate 5.

Figure 3:
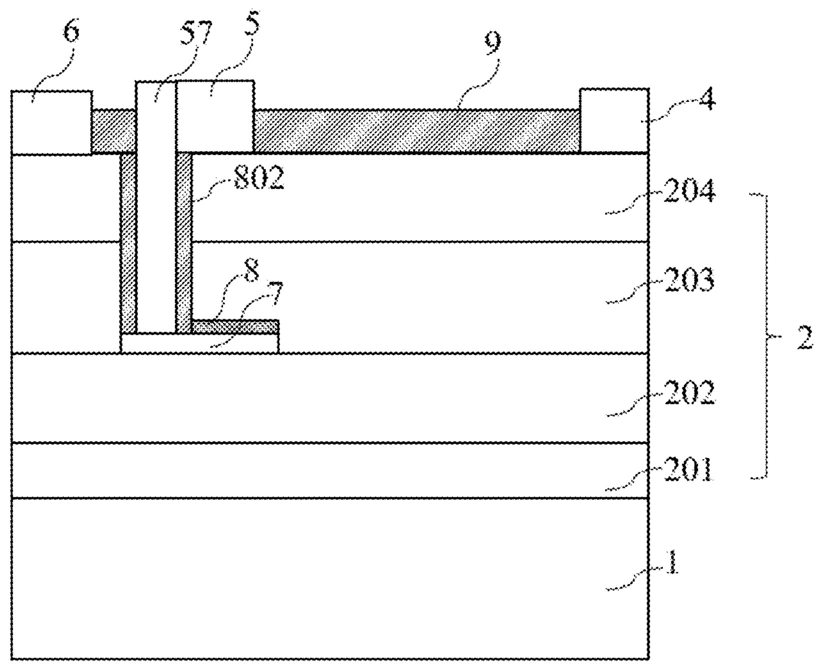
FIG. 3 is a cross-sectional view of the semiconductor device shown in FIG. 1 along a line B-B.

Exemplarily, the electrocoupling structure 57 may be a rod-like structure, as shown in FIGS. 3 and 24.

Based on this, in some embodiments, as shown in FIGS. 3 and 24, the passivation layer 9 is disposed on the second semiconductor layer, between the electrocoupling structure 57 and the source 6, and between the gate 5 and the drain 4. In other words, the passivation layer may define an avoidance hole through which the electrocoupling structure 57 passes, such that an end of the electrocoupling structure 57 is inside the semiconductor layer 2 and connected to a connection region of the conductive layer 7, while the other end of the electrocoupling structure 57 is outside the semiconductor layer 2 and connected to a side of the gate 5 facing the source 6. The electrocoupling structure 57, which is presented as the rod-like structure, not only realizes the electrical coupling between the conductive layer 7 and the gate 5, but also the structure applied is very simple. Exemplarily, the electrocoupling structure 57 may be perpendicular to the conductive layer 7 and made of a metal material to be suitable for being formed by deposition and etching methods. The metal may be one or more of high temperature resistant materials such as tungsten, molybdenum, tantalum, and nickel.

Figure 3A:
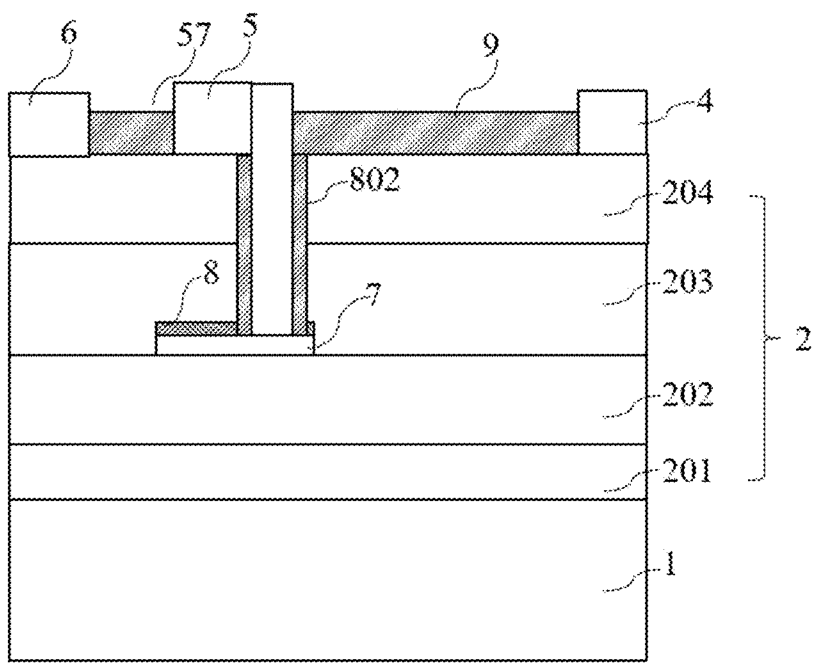
FIG. 3A is a cross-sectional view of a semiconductor device in another embodiment along a line B-B.

It is noted that embodiments of the present disclosure do not limit that the end of the electrocoupling structure 57 is connected to the side of the gate 5 facing the source 6. That is, in some embodiments, an end of the electrocoupling structure 57 may be inside the semiconductor layer 2 and connected to the connection region of the conductive layer 7, while the other end of the electrocoupling structure 57 is outside the semiconductor layer 2 and connected to a side of the gate 5 facing the drain 4, referring to FIG. 3A.

In some embodiments, the conductive layer 7 includes a first surface away from the substrate 1 and a second surface opposite to the first surface and near the substrate 1, and a side surface connected to the first surface and the second surface. The number of the conductive layer 7 may be one, and a positive projection of the conductive layer 7 on the substrate 1 is intersected with a positive projection of the gate 5 on the substrate 1. When an electric potential is applied to the gate 5 of the semiconductor device, the source 6 and the drain 4 may be connected through the two-dimensional electron gas, and the conductive layer 7 may regulate an electric field distribution between the channel layer 203 and the barrier layer 204, reduce a peak electric field strength near the gate 5, and increase a breakdown voltage of the device, thereby improving the device's operating characteristics at high voltages, high powers, and/or high frequencies.

In other embodiments, since the peak electric field strength occurs between the gate 5 and the drain 4 and immediately adjacent to the gate 5, the positive projection of the conductive layer 7 on the substrate 1 is closer to a positive projection of the drain 4 on the substrate 1 than the positive projection of the gate 5 on the substrate 1, whereby the conductive layer 7 may further reduce the peak electric field strength near the gate 5 and further improve the breakdown voltage of the device.

In some embodiments, the conductive layer 7 is disposed in the channel layer 203.

In some embodiments, both the first surface of the conductive layer 7 and the second surface of the conductive layer 7 are disposed within the channel layer 203, such that the conductive layer 7 is suitable to be formed by the ion implantation method and tempering activation. On the other hand, the channel layer 203 includes at least two layers to ensure that the conductive layer 7 is suitable to be formed between the at least two layers by the epitaxial growth method (for the conductive layer 7 made of semiconductor material)/deposition method (for the conductive layer 7 made of metal material) and etching method.

In other embodiments, the first surface of the conductive layer 7 is disposed within the channel layer 203, and the second surface of the conductive layer 7 is connected to an interface between the buffer layer 202 and the channel layer 203. In this way, in the process of ensuring that the conductive layer 7 is suitable to be formed by the epitaxial growth method/deposition method and the etching method, one layer of the conductive layer may be prepared prior to the growth of the channel layer 203, thereby simplifying the fabrication process of the device.

In other embodiments, the conductive layer 7 is disposed within the buffer layer, such that the insulating properties of the buffer layer may be utilized to strengthen the insulation between the conductive layer 7 and the two-dimensional electron gas. In this way, the buffer layer 202 includes at least two layers to ensure that the conductive layer 7 is suitable to be formed between the at least two layers by epitaxial growth method/deposition method and etching method. In some embodiments, in order to simplify the fabrication process of the conductive layer, the first surface of the conductive layer 7 is connected to a side of the buffer layer 202 away from the substrate 1, and the second surface of the conductive layer 7 is disposed within the buffer layer 202, enabling that the conductive layer 7 is suitable to be formed by the ion implantation method and by tempering activation. On the other hand, the buffer layer 202 includes a first layer structure and a second layer structure, where a conductive material layer is grown on the first layer structure, the conductive material layer is etched to obtain the conductive layer 7, and then the second layer structure wrapping the conductive layer 7 is grown on the first layer structure. When the thickness of the second layer structure is the same as the thickness of the conductive layer 7, the first surface of the conductive layer 7 is connected to the side of the buffer layer 202 away from the substrate 1.

Figure 4:
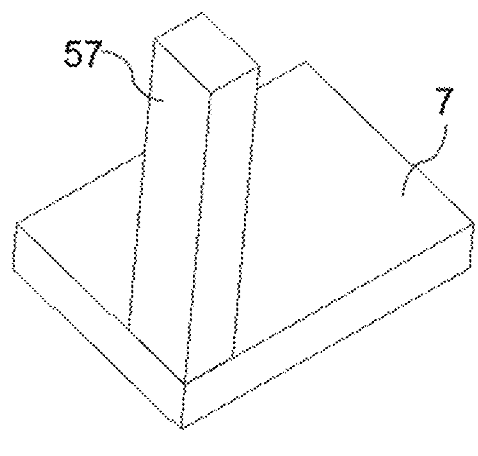
FIG. 4 illustrates a conductive layer and an electrocoupling structure of the semiconductor device shown in FIG. 1.

In some embodiments, the conductive layer 7 may be a rectangular body that is easy to mold, as detailed in FIG. 4. The thickness of the conductive layer 7 is 10 nm-1000 nm, and may be 100 nm. Exemplarily, the conductive layer 7 may be made of a metal material suitable for being formed by deposition and etching methods. The metal may be one or more of high temperature resistant materials such as tungsten, molybdenum, tantalum, and nickel. Exemplarily, the conductive layer may be made of a semiconductor material suitable for being formed by the epitaxial growth method and the etching method. The conductive layer 7 may be an n-type or p-type GaN conductive layer.

The size of the conductive layer 7 along a first direction (i.e., an arrangement direction between the source 6 and the drain 4) is larger than the size of the conductive layer 7 along a second direction (i.e., an arrangement direction between the substrate 1 and the semiconductor layer 2), resulting in a flattened structure, thereby reducing the occupancy ratio of the conductive layer 7 to the semiconductor layer 2, for example, the occupancy ratio to the channel layer 203, and effectively avoiding the concentration of the two-dimensional electron gas from dropping significantly due to the large size of the conductive layer 7, which may ensure that the switching characteristics of the semiconductor device remain useful and efficient.

In some embodiments, as shown in FIGS. 1-22, the conductive layer 7 is made of a semiconductor material. In this case, the semiconductor device further includes a high-resistance structure 8, which is at least partially disposed between the conductive layer 7 and the two-dimensional electron gas, and between the electrocoupling structure 57 and the two-dimensional electron gas.

Figure 2:
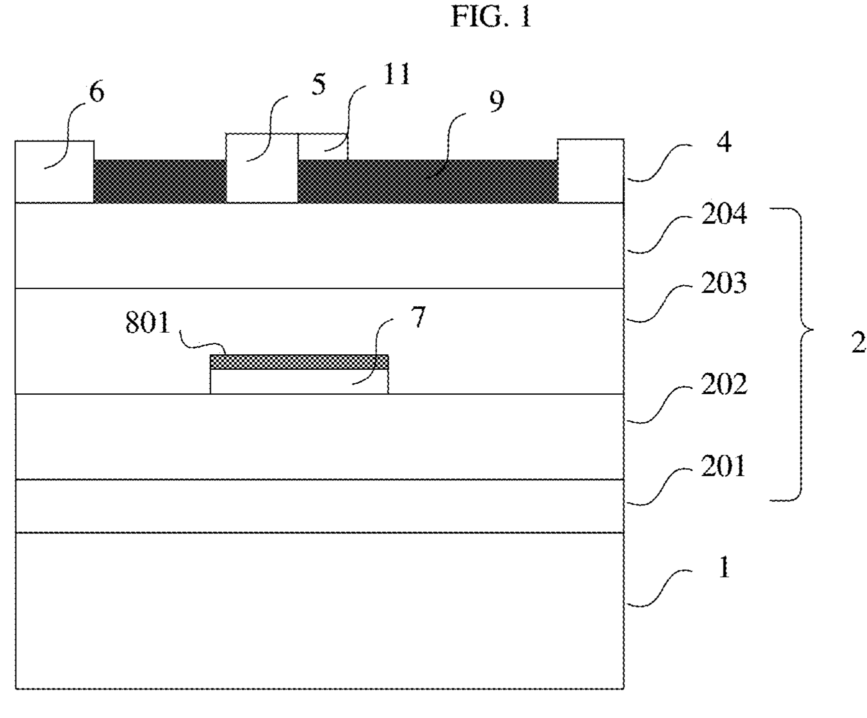
FIG. 2 is a cross-sectional view of the semiconductor device shown in FIG. 1 along a line A-A.

In some embodiments, as shown in FIG. 2, the high-resistance structure 8 includes a first high-resistance portion 801, which is disposed above the conductive layer 7 for insulating the conductive layer 7 from the two-dimensional electron gas, such that leakage currents generated by the two-dimensional electron gas flowing toward the conductive layer 7 may be intercepted, and thus the risk of the semiconductor device failing or being damaged as a result of this in the process of the high-voltage operation may be effectively reduced.

In some embodiments, as shown in FIG. 2, the first high-resistance portion 801 is disposed above the conductive layer 7 for insulating the conductive layer 7 from the two-dimensional electron gas. Exemplarily, referring again to FIG. 4, it is to be added that the first surface of the conductive layer 7 includes the connection region to be connected to the electrocoupling structure 57, and the first high-resistance portion 801 is disposed on the first surface of the conductive layer 7 other than the connection region. The fabrication material of the first high-resistance portion 801 is one of silicon dioxide, silicon nitride, aluminum nitride, and alumina, and the thickness may be 5 nm-1000 nm to ensure that it is suitable to be formed by the epitaxial growth method and the etching method.

In some embodiments, the high-resistance structure 8 further includes a second high-resistance portion 802 wrapping the electrocoupling structure 57 for insulating the electrocoupling structure 57 from the two-dimensional electron gas, such that leakage currents generated by the two-dimensional electron gas flowing toward the electrocoupling structure 57 may be intercepted, and thus the risk of the semiconductor device failing or being damaged as a result of this in the process of the high-voltage operation may be effectively reduced. The second high-resistance portion 802 is similar to a sleeve structure, which is made of one of silicon dioxide, silicon nitride, aluminum nitride, and alumina, and the thickness may be 5 nm-1000 nm to ensure that it is suitable for being formed by the epitaxial growth method and the etching method.

In some embodiments, the high-resistance structure 8 covers the first surface of the conductive layer 7 as well as covers the side of the buffer layer 202 away from the substrate 1, and is disposed on a side of the channel layer 203 near the substrate 1. In this way, the high-resistance structure 8 may be constructed as a layer structure directly between the channel layer 203 and the buffer layer 202.

In other embodiments, as shown in FIGS. 23-31, the conductive layer 7 is made of a metal material. In this case, in order to prevent the conductive layer 7 from reacting (i.e., corrosive action) with the ammonia used during the subsequent device fabrication process and in particular for the epitaxial growth, the semiconductor device further includes a high-resistance structure 8 and a barrier material 8'. The high-resistance structure 8 is disposed at least partially between the conductive layer 7 and the two-dimensional electron gas, and between the electrocoupling structure 57 and the two-dimensional electron gas. The barrier material 8' is connected to the first high-resistance portion 801 and covers a side of the conductive layer 7.

It is to be noted that in some embodiments, the first high-resistance portion 801 covers at least an upper surface of the conductive layer 7 and the barrier material 8' covers at least the side of the conductive layer 7. A transition for covering the upper surface of the conductive layer 7 with the side of the conductive layer 7 may be the first high-resistance portion 801 or the barrier material 8'. That is, the barrier material 8' may be connected to the first high-resistance portion 801 to cover the upper surface and the side of the conductive layer 7 as a whole, thereby insulating the conductive layer 7 from epitaxial layers on its sides and above it.

It should be noted that both the high-resistance structure 8 and the barrier material 8' are each made of a high-resistance material, which facilitates the insulation between the conductive layer 7 and the semiconductor layer 2.

In some embodiments, as shown in FIG. 23, the high-resistance structure 8 includes a first high-resistance portion 801, which is disposed above the conductive layer 7 for insulating the conductive layer 7 from the two-dimensional electron gas, such that leakage currents generated by the two-dimensional electron gas flowing toward the conductive layer 7 may be intercepted, and thus the risk of the semiconductor device failing or being damaged as a result of this in the process of the high-voltage operation may be effectively reduced.

In some embodiments, as shown in FIG. 23, the first high-resistance portion 801 is disposed above the conductive layer 7 for insulating the conductive layer 7 from the two-dimensional electron gas. Exemplarily, referring again to FIG. 23, it is to be added that the first surface of the conductive layer 7 includes the connection region to be connected to the electrocoupling structure 57, and the first high-resistance portion 801 is disposed on the first surface of the conductive layer 7 other than the connection region. The fabrication material of the first high-resistance portion 801 is one of silicon dioxide, silicon nitride, aluminum nitride, and alumina, and the thickness may be 5 nm-1000 nm to ensure that it is suitable to be formed by the epitaxial growth method and the etching method.

In some embodiments, the high-resistance structure 8 further includes a second high-resistance portion 802 wrapping the electrocoupling structure 57 for insulating the electrocoupling structure 57 from the two-dimensional electron gas, such that leakage currents generated by the two-dimensional electron gas flowing toward the electrocoupling structure 57 may be intercepted, and thus the risk of the semiconductor device failing or being damaged as a result of this in the process of the high-voltage operation may be effectively reduced. The second high-resistance portion 802 is similar to a sleeve structure, which is made of one of silicon dioxide, silicon nitride, aluminum nitride, and alumina, and the thickness may be 5 nm-1000 nm to ensure that it is suitable for being formed by the epitaxial growth method and the etching method.

In some embodiments, the high-resistance structure 8 covers the first surface of the conductive layer 7 as well as covers the side of the buffer layer 202 away from the substrate 1, and is disposed on a side of the channel layer 203 near the substrate 1. In this way, the high-resistance structure 8 may be constructed as a layer structure directly between the channel layer 203 and the buffer layer 202.

In some embodiments, the fabrication steps and the materials selected for the barrier material 8' and the first high-resistance portion 801 of the high-resistance structure 8 may be the same or different.

For both of the above basic embodiments, as shown in FIGS. 13-14 and 29, the number of the conductive layers 7 may be plural and the conductive layers 7 are spaced apart along a third direction (i.e., a direction that is perpendicular to the first direction and the second direction).

In some embodiments, referring again to FIGS. 13-14 and 29, each of the conductive layers 7 is in the same size, and a total size of the conductive layers 7 along the first direction is larger than a size of each conductive layer 7 in the second direction, where the second direction is the arrangement direction between the substrate 1 and the semiconductor layer 2. Based on this, the number of the electrocoupling structures 57 is also plural correspondingly, where each electrocoupling structure 57 may be a rod perpendicular to a corresponding conductive layer 7. An end of each electrocoupling structure 57 is connected to the connection region of the corresponding conductive layer 7, and the other end of each electrocoupling structure 57 is connected to the gate 5.

In other embodiments, in order to reduce the number of the electrocoupling structures, the conductive layer 7 includes, as shown in FIGS. 6-7, 10-11, 26, and 28: first conductive layers 701 that are spaced apart and a second conductive layer 702 connecting the first conductive layers 701. Exemplarily, the second conductive layer 702 is perpendicular to the first conductive layers 701. In this way, since the spaced-apart first conductive layers 701 are connected by the second conductive layer 702, only one electrocoupling structure 57 electrically coupled to the gate 5 is required to realize the electrical coupling between the conductive layer 7 and the gate 5.

In some embodiments, as shown in FIGS. 6-7, 8, and 26, the first conductive layers 701 are spaced apart along the first direction, where the first direction is the arrangement direction between the source 6 and the drain 4.

In some embodiments, the first conductive layers 701 are spaced apart along the third direction, as shown in FIGS. 10-11, 8, and 28.

In some embodiments, as shown in FIGS. 6-7, 10-11, 26, and 28, the connection region 703 of the conductive layer 7 is disposed on one of the first conductive layers 701; the electrocoupling structure 57 is one in number, and an end of the electrocoupling structure 57 is connected to the first conductive layer 701 having the connection region and the other end of the electrocoupling structure 57 is connected to the gate 5.

In some embodiments, as shown in FIGS. 6-7, 10-11, 26, and 28, the connection region 703 is disposed on an extended region where the first conductive layer 701 having the connection region 703 extends back from the second conductive layer 702. That is, the columnar first conductive layer 701 has a free end and a connecting end that is connected to the second conductive layer 702, and the free end and the connecting end are opposite to each other. The connection region 703 extends from the connecting end in a direction away from the second conductive layer.

In the above embodiments, by arranging the conductive layer 7, capable of electrically coupling with the gate 5, within the semiconductor device, and by isolating the conductive layer 7 from the two-dimensional electron gas, and the electrocoupling structure 57 from the two-dimensional electron gas by means of the high-resistance structure 8, the electric field strength of the gate 5 at high voltages of the semiconductor device may be effectively reduced by the conductive layer 7 to which the gate 5 is connected, so as to increase the breakdown voltage of the device.

As described above, the material of the conductive layer 7 is a conductive doped semiconductor material or a metal material.

When the conductive layer 7 is mainly made of metal, the metal is prone to react with the ammonia gas during the epitaxial growth in the subsequent epitaxial growth process of the device, and the conductive layer is isolated in the first high-resistance portion 801 of the high-resistance structure 8 and the barrier material 8' by the high-resistance structure 8 and the barrier material 8', such that corrosion of the conductive layer 7 by ammonia in epitaxial growth may be reduced, thereby ensuring that the conductive layer 7 can help reduce the electric field near the gate 5 by being electrically connected to the gate 5. In this way, the first high-resistance portion 801 of the high-resistance structure 8 and the barrier material 8' in the embodiments of the present disclosure may also prevent the conductive layer 7 from reacting with the ammonia gas used in its subsequent device fabrication process, especially within the epitaxial growth, to ensure that it can successfully realize the aforementioned effects.

In some embodiments, as shown in FIGS. 2 and 23, the semiconductor device may further include a gate field plate 11, which is disposed on the passivation layer 9 between the gate 5 and the drain 4. The gate field plate 11 may assist the conductive layer 7 in regulating the electric field distribution between the channel layer 203 and the barrier layer 204, thereby further reducing the peak electric field strength near the gate 5, and substantially increasing the breakdown voltage of the device.

In the above embodiments, by arranging the conductive layer 7 similar to a gate field plate 11 within the device and utilizing the conductive layer 7 to increase the breakdown voltage of the device, the semiconductor device thereby has a higher breakdown voltage without using the gate field plate 11, and will have an even higher breakdown voltage with the use of the gate field plate 11. In fact, the conductive layer 7 may be connected to the gate 5 or the source 6, but since the potential of the source 6 is not as strong as that of the gate 5, and the peak electric field strength near the gate 5 is synchronized with the potential of the gate 5 but not with that of the source 6, the conductive layer 7 connected to the gate 5 is required to have a stronger and more accurate regulation of the electric field near the gate, which is conducive to ensuring that the peak electric field strength near the gate 5 is lower and that the breakdown voltage of the device is higher. When it is necessary to connect the conductive layer 7 to the source 6, because the source 6 can be directly extended to the conductive layer 7 and connected to the same, the conductive layer 7 connected to the source 6 is easy to realize in the fabrication method process. However, when it is necessary to connect the conductive layer 7 to the gate 5, because the gate 5 cannot be directly extended to the conductive layer 7 due to the problem of destroying the two-dimensional electron gas and, the conductive layer 7 connected to the gate 5 is difficult to realize in the fabrication method process. After painstaking research, it is found that the electrocoupling structure 57, that passes through the barrier layer 204 and the channel layer 203 and connects the conductive layer 7 and the gate 5, may be added, and in addition, the first barrier structure 8 may be added between the conductive layer 7 and the two-dimensional electron gas, and between the electrocoupling structure 57 and the two-dimensional electron gas, in order to facilitate the insulating isolation of the conductive layer 7 from the two-dimensional electron gas by the first barrier structure 8 and the insulating isolation of the electric coupling structure 57 and the two-dimensional electron gas, whereby leakage currents generated by the two-dimensional electron gas flowing toward the conductive layer 7 and the electric coupling structure 57 may be intercepted, effectively increasing the breakdown voltage of the device, such that the semiconductor device may be operated normally at a higher operating voltage.

Referring again to FIGS. 1-22, in the embodiments, the conductive layer 7 is made of a semiconductor material. Based on this, the embodiments of the present disclosure further provide a fabrication method of a semiconductor device, the method including:

- providing a semiconductor epitaxial structure; where the semiconductor epitaxial structure includes a substrate 1 and a semiconductor layer 2; the semiconductor layer 2 includes a first semiconductor stack layer and a second semiconductor layer disposed on the first semiconductor stack layer; a two-dimensional electron gas is formed at an interface between the first semiconductor stack layer and the second semiconductor layer;
- forming a conductive layer 7 within the semiconductor layer 2 and between the substrate 1 and the two-dimensional electron gas;
- forming an electrocoupling structure 57 and a high-resistance structure 8 within the semiconductor layer 2; where the electrocoupling structure extends from the semiconductor layer 2 towards into the semiconductor layer 2 and is connected to the conductive layer 7; the high-resistance structure 8 is at least partially disposed between the conductive layer 7 and the two-dimensional electron gas, and between the electrocoupling structure 57 and the two-dimensional electron gas; and
- forming a terminal layer including a source 6, a drain 4, and a gate 5 on the second semiconductor layer, and connecting the gate 5 to the electrocoupling structure 57.

In this way, the semiconductor device prepared by the method described above, by arranging the conductive layer 7 capable of being electrically coupled to the gate 5 inside the device, and by isolating between the conductive layer 7 and the two-dimensional electron gas and between the electrocoupling structure 57 and the two-dimensional electron gas by the high-resistance structure 8, is able to effectively reduce the electric field strength of the gate 5 at a high voltage of the semiconductor device, thereby increasing the breakdown voltage of the device.

In some embodiments, the first semiconductor stack layer includes: a buffer layer 202 near the substrate 1, and a channel layer 203 disposed on the buffer layer 202; and the forming a conductive layer 7 within the semiconductor layer 2 includes:

- forming the conductive layer 7 in the channel layer 203.

In this way, the conductive layer 7 is disposed within the channel layer 203, which may reduce the distance between the conductive layer 7 and the gate 5 while ensuring that the conductive layer 7 is disposed below the two-dimensional electron gas.

In some embodiments, the forming the conductive layer 7 in the channel layer 203 includes:

- growing a conductive material layer formed from a conductive doped semiconductor material on the buffer layer 202, etching the conductive material layer to obtain the conductive layer 7 formed from a remaining conductive material layer.

In some embodiments, the forming the conductive layer 7 in the channel layer 203 includes:

- injecting a conductive dopant into the channel layer 203 at a fixed region and a fixed depth by ion implantation, and tempering for activation to obtain the conductive layer 7.

Of course, as shown in FIGS. 17-19, for the way of arranging the conductive layer 7 within the channel layer 203, not only the ion implantation method described above is possible, but it is also possible to form the conductive layer 7 by: carrying out a first epitaxial growth of the channel layer 203 to a certain height, growing the conductive material layer using the growth method and etching to obtain the conductive layer 7, and then carrying out a second epitaxial growth for the remaining channel layer 203. In comparison to this approach, the process of injecting the conductive dopant into the channel layer 203 at a fixed region and a fixed depth by ion implantation, followed by tempering for activation to obtain the conductive layer 7, is simpler to realize and less costly.

In other embodiments, the first semiconductor stack layer includes: a buffer layer 202 near the substrate 1, and a channel layer disposed on the buffer layer 202; and the forming a conductive layer 7 within the semiconductor layer 2 includes:

- forming the conductive layer 7 in the buffer layer 202.

In some embodiments, the forming the conductive layer 7 in the buffer layer 202 includes:

- injecting a conductive dopant into the buffer layer 202 at a fixed region and a fixed depth by ion implantation, and tempering for activation to obtain the conductive layer 7 Similar to the above embodiments formed in the channel layer 203, the process of injecting a conductive dopant into the buffer layer 202 at a fixed region and a fixed depth by ion implantation, followed by tempering for activation to obtain the conductive layer 7, is simpler to realize and less costly.

Referring again to FIGS. 23-31, in the embodiments, the conductive layer 7 is made of a metal material. Based on this, the embodiments of the present disclosure further provide a fabrication method of a semiconductor device, the method including:

- providing a semiconductor epitaxial structure; where the semiconductor epitaxial structure includes a substrate 1 and a semiconductor layer 2; the semiconductor layer 2 includes a first semiconductor stack layer and a second semiconductor layer disposed on the first semiconductor stack layer; a two-dimensional electron gas is formed at an interface between the first semiconductor stack layer and the second semiconductor layer;
- forming a conductive layer 7 within the semiconductor layer 2 and between the substrate 1 and the two-dimensional electron gas;
- forming a source 6, a drain 4, and a gate 5 on the second semiconductor layer; forming an electrocoupling structure 57 by extending from the gate 5 towards into the semiconductor layer 2 and electrically connecting to the conductive layer 7;
- arranging a high-resistance structure 8 on a side of the conductive layer 7 away from the substrate 1, where the high-resistance structure 8 is configured to insulate the conductive layer 7 and the electrocoupling structure 57 from the two-dimensional electron gas;

arranging a barrier material 8' on a side of the conductive layer 7, where the side is adjacent to the side of the conductive layer 7 away from the substrate 1.

In this way, the semiconductor device prepared by the method described above, by arranging the conductive layer 7 capable of being electrically connected to the gate 5 inside the device, and by isolating the conductive layer 7 from the two-dimensional electron gas and the electrocoupling structure 57 from the two-dimensional electron gas by the high-resistance structure 8, is able to effectively reduce the electric field strength of the gate 5 at a high voltage in the semiconductor device by means of the conductive layer 7 to which the gate 5 is connected, thereby increasing the breakdown voltage of the device. In addition, the barrier material 8' may prevent the conductive layer 7 from reacting with the ammonia gas used in the subsequent device fabrication process, especially in the epitaxial growth, to ensure the conductivity of the conductive layer 7.

In some embodiments, the first semiconductor stack layer includes: a buffer layer 202 near the substrate 1, and a channel layer 203 disposed on the buffer layer 202; and the forming a conductive layer 7 within the semiconductor layer 2 includes:

forming the conductive layer 7 in the channel layer 203.

In this way, the conductive layer 7 is disposed within the channel layer 203, which may reduce the distance between the conductive layer 7 and the gate 5 while ensuring that the conductive layer 7 is disposed below the two-dimensional electron gas.

In some embodiments, the forming the conductive layer 7 in the channel layer 203 includes:

growing a conductive material layer formed from a metal material on the buffer layer 202, etching the conductive material layer to obtain the conductive layer 7 formed from a remaining layer of conductive material.

Of course, for the way of arranging the conductive layer 7 within the channel layer 203, the conductive layer 7 may be formed by: carrying out a first epitaxial growth of the channel layer 203 to a certain height, growing the conductive material layer using the growth method and etching to obtain the conductive layer 7, and then carrying out a second epitaxial growth for the remaining channel layer 203.

In other embodiments, the arranging a high-resistance structure 8 on a side of the conductive layer 7 away from the substrate 1, and the arranging a barrier material 8' on a side of the conductive layer 7 include:

growing a high-resistance material layer formed by an insulating compound on the conductive layer 7, and etching the high-resistance material layer to obtain a first high-resistance portion 801 of the high-resistance structure 8 disposed on top of the conductive layer 7, and the barrier material 8' disposed on the side of the conductive layer 7, that are formed by a remaining high-resistance material layer.

With respect to the method in the above embodiments, the specific manner in which each of the method execution steps is performed has been described in detail in the embodiments relating to the device, and will not be described in detail herein.

In order to be able to further understand the semiconductor device provided in the embodiments of the present disclosure and the fabrication method of the semiconductor device, the above disclosure is further described below by means of the following specific embodiments.

In the description of the present disclosure, the embodiments other than Embodiment I are written in a manner that avoids repetition as much as possible, i.e., the focus is on documenting that each of them is different from other embodiments. In these embodiments, any technical features that are not explicitly documented can be found in the corresponding description of Embodiment I.

Embodiment I

The embodiment provides a semiconductor device, which is also known as a high electron mobility transistor, having the advantages of high breakdown voltage and high electrical conductivity, which may serve as a semiconductor power device or a semiconductor radio frequency device, widely applied in the fields of base station communications, the Internet of Things, aerospace, radar systems, etc.

As shown in FIGS. 2 and 3, the semiconductor device includes a substrate 1 and a semiconductor layer 2 (also known as an epitaxial layer) disposed on the substrate 1. The substrate 1 may be made of silicon (Si), silicon carbide (SiC), or sapphire. The semiconductor layer 2 includes a first semiconductor stack layer and a second semiconductor layer disposed on the first semiconductor stack layer. The second semiconductor layer includes a barrier layer 204, a main fabrication material of which may be an alloy nitride, in particular aluminum gallium nitride (AlGaN), with a thickness of 5 nm-50 nm. The first semiconductor stack layer includes a buffer layer 202 and a channel layer 203 disposed on the buffer layer 202, where a main fabrication material of the channel layer 203 may be selected as a Group III-V nitride, in particular a gallium nitride (GaN), with a thickness of 100 nm-1000 nm. When the channel layer 203 includes a Group III-V nitride and the barrier layer 204 includes an alloy nitride, the channel layer 203 and the barrier layer 204 are heterogeneous structures, and two-dimensional electron gas (2DEG) is formed at an interface between the channel layer 203 and the barrier layer 204, due to a large polarization intensity difference and forbidden band width difference between the two. Each of the channel layer 203 and the barrier layer 204 may be of a one-layer or multi-layer structure. In some embodiments, the channel layer 203 includes a 300 nm high-resistance gallium nitride layer and a 200 nm high-temperature gallium nitride layer sequentially distributed in a direction away from the substrate 1, while the barrier layer 204 includes a 1 nm aluminum nitride layer, a 20 nm aluminum gallium nitride layer, and a 2 nm gallium nitride layer sequentially distributed in a direction away from the channel layer 203.

The semiconductor layer 2 may further include a nucleation layer 201 disposed on the substrate 1, with the buffer layer 202 disposed on the nucleation layer 201. The nucleation layer 201 is made of aluminum carbide (AlN) or gallium nitride (GaN) with a thickness of 10 nm-500 nm, for improving the growth quality of the buffer layer 202 and having an isolation effect. And the buffer layer 202 is made of iron-doped gallium nitride, carbon-doped gallium nitride, gallium nitride (GaN), or aluminum gallium nitride (AlGaN), with a thickness of 100 nm-10 um, for improving the growth quality of the Group III-V nitride. The buffer layer 202 may be of a one-layer or multi-layer structure. When the substrate 1 is selected as a silicon material, the buffer layer 202 may be of a three-layer structure, with the first layer being AlGaN with an aluminum content of 75% and an entire layer thickness of 400 nm, the second layer being AlGaN with an aluminum content of 50% and an entire layer thickness of 900 nm, and the third layer being AlGaN with an aluminum content of 25% and an entire layer thickness of 1500 nm.

The semiconductor device further includes a terminal layer disposed primarily on the barrier layer 204. The terminal layer includes a gate 5, a drain 4, and a source 6. Each of the source 6 and the drain 4 may be of a one-layer or a multi-layer structure, and may include a titanium (Ti) layer, an aluminum (Al) layer, a nickel (Ni) layer, and a gold (Au) layer that are sequentially connected. The source 6 is in ohmic contact with the barrier layer 204 and is electrically coupled to the two-dimensional electron gas. The drain 4 is also in ohmic contact with the barrier layer 204 and is electrically coupled to the two-dimensional electron gas. The gate 5 primarily includes one or both of a nickel (Ni) layer and a gold (Au) layer and is in Schottky contact with the barrier layer 204. When using the semiconductor device, varying the electric field of the gate 5 may modulate the two-dimensional electron gas and control the turn-on and turn-off of the source 6 and drain 4.

The semiconductor device further includes a passivation layer 9. The passivation layer 9 is disposed on the barrier layer 204 and in avoidance with the gate 5, the drain 4, and the source 6. That is, the passivation layer 9 defines avoidance holes for penetration of the gate 5, the drain 4, and the source 6, respectively, such that the passivation layer 9 may provide insulating isolation for the gate 5, the drain 4, and the source 6 to prevent the semiconductor device from malfunctioning due to occurrence of erroneous turn-on between the terminals. The fabrication material of the passivation layer 9 includes one of insulating compounds such as silicon dioxide, silicon nitride, aluminum nitride, and alumina.

As shown in FIGS. 3 and 4, the semiconductor device further includes a conductive layer 7 disposed within the channel layer 203, and an electrocoupling structure 57 for electrically coupling the conductive layer 7 to the gate 5. The conductive layer 7 is made of a conductive doped semiconductor material or a metal material. The conductive layer 7 includes a first surface away from the substrate 1 and a second surface opposite to the first surface and near the substrate 1, and a side surface connected to the first surface and the second surface. The number of the conductive layer 7 may be one, and a positive projection of the conductive layer 7 on the substrate 1 is intersected with a positive projection of the gate 5 on the substrate 1. When an electric potential is applied to the gate 5 of the semiconductor device, the source 6 and the drain 4 may be connected through the two-dimensional electron gas, and the conductive layer 7 may regulate an electric field distribution between the channel layer 203 and the barrier layer 204, reduce a peak electric field strength near the gate 5, and increase a breakdown voltage of the device, thereby improving the operating characteristics of the device at high voltages, high powers, and/or high frequencies. However, since the peak electric field strength occurs between the gate 5 and the drain 4 and immediately adjacent to the gate 5, it is proposed to set up in such a way that the positive projection of the conductive layer 7 on the substrate 1 is closer to a positive projection of the drain 4 on the substrate 1 than the positive projection of the gate 5 on the substrate 1, whereby the conductive layer 7 may further reduce the peak electric field strength near the gate 5 and further improve the breakdown voltage of the device.

The first surface of the conductive layer 7 is disposed within the channel layer 203, and the second surface of the conductive layer 7 abuts against the interface between the buffer layer 202 and the channel layer 203 to ensure that the conductive layer 7 is suitable for being formed by the epitaxial growth method and the etching method. The conductive layer 7 may be a rectangular body that can be easily molded, as detailed in FIG. 4. The thickness of the conductive layer 7 is 10 nm-1000 nm, and may be 100 nm. The conductive layer 7 may be a structure made of a metal material suitable for being formed by the epitaxial growth method and the etching method. The metal may be one or more of high temperature resistant materials such as tungsten, molybdenum, tantalum, and nickel. The size of the conductive layer 7 along a first direction (i.e., an arrangement direction between the source 6 and the drain 4) is larger than the size of the conductive layer 7 along a second direction (i.e., an arrangement direction between the substrate 1 and the semiconductor layer 2), resulting in a flattened structure, thereby reducing the occupancy ratio of the conductive layer 7 to the channel layer 203, thereby effectively avoiding the concentration of the two-dimensional electron gas from dropping significantly due to the large size of the conductive layer 7, which may ensure that the switching characteristics of the semiconductor device remain useful and efficient.

The electrocoupling structure 57 is a rod-like structure, and the passivation layer 9 defines an avoidance hole through which the electrocoupling structure 57 passes, such that an end of the electrocoupling structure 57 is inside the semiconductor layer 2 and connected to a connection region of the conductive layer 7, while the other end of the electrocoupling structure 57 is outside the semiconductor layer 2 and connected to a side of the gate 5 facing the source 6. The electrocoupling structure 57, which is presented as the rod-like structure, not only enables the electrical coupling between the conductive layer 7 and the gate 5, but also the structure applied is very simple. In some embodiments, the electrocoupling structure 57 may be perpendicular to the conductive layer 7 and made of a metal material to be suitable for being formed by the epitaxial growth method and the etching method. The metal may be one or more of high temperature resistant materials such as tungsten, molybdenum, tantalum, and nickel.

The high-resistance structure 8 includes a first high-resistance portion 801, which is disposed above the conductive layer 7 for insulating the conductive layer 7 from the two-dimensional electron gas, such that leakage currents generated by the two-dimensional electron gas flowing toward the conductive layer 7 may be intercepted, and thus the risk of the semiconductor device failing or being damaged as a result of this in the process of the high-voltage operation may be effectively reduced. In addition, the high-resistance structure 8 further prevents the conductive layer 7 from reacting with the ammonia gas used during the subsequent device fabrication process and in particular for the epitaxial growth, thereby ensuring the effectiveness of the conductive layer 7. In some embodiments, the first high-resistance portion 801 is disposed on the first surface of the conductive layer 7 other than the connection region. The fabrication material of the first high-resistance portion 801 is one of silicon dioxide, silicon nitride, aluminum nitride, and alumina, and the thickness may be 5 nm-1000 nm to ensure that it is suitable to be formed by the epitaxial growth method and the etching method.

The high-resistance structure 8 further includes a second high-resistance portion 802 wrapping the electrocoupling structure 57 for insulating the electrocoupling structure 57 from the two-dimensional electron gas, such that leakage currents generated by the two-dimensional electron gas flowing toward the electrocoupling structure 57 may be intercepted, and thus the risk of the semiconductor device failing or being damaged as a result of this in the process of the high-voltage operation may be effectively reduced. The second high-resistance portion 802 is similar to a sleeve structure, which is made of one of silicon dioxide, silicon nitride, aluminum nitride, and alumina, and the thickness may be 5 nm-1000 nm to ensure that it is suitable for being formed by the epitaxial growth method and the etching method.

The semiconductor device may further include a gate field plate 11 disposed on the passivation layer 9 and connected to the gate 5. The gate field plate 11 may assist the conductive layer 7 in regulating the electric field distribution between the channel layer 203 and the barrier layer 204, thereby further reducing the peak electric field strength near the gate 5, and substantially increasing the breakdown voltage of the device.

Next, a fabrication method of the semiconductor device is described, and the steps of the fabrication method include: providing a substrate 1, referring to FIG. 5*a* for details; growing a nucleation layer 201 on the substrate 1; growing a buffer layer 202 on the nucleation layer 201, referring to FIG. 5*b* for details; growing a conductive material layer formed from a metal material on the buffer layer 202; etching the conductive material layer to obtain a conductive layer 7 formed from a remaining conductive material layer; growing a high-resistance material layer formed by an insulating compound on the buffer layer 202 and the conductive layer 7; etching the high-resistance material layer to obtain a first high-resistance portion 801 of a high-resistance structure 8 formed by a remaining high-resistance material layer and disposed on a top of the conductive layer 7; growing a channel layer 203 capable of covering the first high-resistance portion 801 of the high-resistance structure 8 on the buffer layer 202; and growing a barrier layer 204 on the channel layer 203, referring to FIG. 5*d* for details.

Next, opening holes on the barrier layer 204, the channel layer 203, and the first high-resistance portion 801 of the high-resistance structure 8 by etching to obtain a first slot hole 57*a* exposing the conductive layer 7, referring to FIG. 5*e* for details; growing an insulating material 9*a* on the barrier layer 204 and in the first slot hole 57*a*, referring to FIG. 5*f* for details; opening holes on the insulating material 9*a* that is on the barrier layer 204 by etching to obtain a source hole region, a gate hole region, and a drain hole region; forming a source 6, a gate 5, and a drain 4 in the source hole region, the gate hole region, and the drain hole region, respectively, by means of growth, etching, and tempering, and at the same time forming a gate field plate 11 connected to the gate 5 on the insulating material 9*a*, referring to FIG. 5*g* for details; opening holes on the insulating material 9*a* that is in the first slot hole 57*a* by etching, to obtain a second slot hole 57*b* that exposes the conductive layer 7 and is thinner than the first slot hole 57*a*, referring to FIG. 5*h* for details; growing a conductive material inside the second slot hole 57*b*, and etching the conductive material to obtain an electrocoupling structure 57 formed by the conductive material and connecting the conductive layer 7 to the gate 5, and obtaining a passivation layer 9 formed by the remaining insulating material 9*a* and disposed on the barrier layer 204, and a second high-resistance portion 802 of the high-resistance structure 8 to cover the electrocoupling structure 57, referring to FIG. Si for details.

Embodiment II

As shown in FIGS. 6-8, different from Embodiment I, the conductive layer 7 includes first conductive layers 701 spaced apart along a first direction (i.e., an arrangement direction between the source 6 and the drain 4) and a second conductive layer 702 connecting the first conductive layer 701, and a connection region (third conductive layer) 703 is arranged on one of the first conductive layers 701 in contact with the electrocoupling structure 57. In some embodiments, the connection region 703 is disposed on an extended region where the first conductive layer 701 having the connection region 703 extends back from the second conductive layer 702. In some embodiments, the second conductive layer 702 and the first conductive layer 701 are perpendicular to each other to reduce fabrication difficulty. A positive projection of each of at least one first conductive layer 701 on the substrate 1 is intersected with a positive projection of the gate 5 on the substrate 1. When an electric potential is applied to the gate 5 of the semiconductor device, the source 6 and the drain 4 may be connected through the two-dimensional electron gas, and the conductive layer 7 uniformly regulates the electric field distribution between the channel layer 203 and the barrier layer 204 mainly with the aid of the first conductive layers 701. Compared to the semiconductor device in Embodiment I, the semiconductor device having the first conductive layers 701 and the second conductive layer 702 is able to reduce the peak electric field strength near the gate 5 more effectively, and further increase the breakdown voltage of the device, thereby improving the operating characteristics of the device at high voltage, high power, and/or high frequency. However, since the peak electric field strength occurs between the gate 5 and the drain 4 and immediately adjacent to the gate 5, it is proposed that the positive projection of the first conductive layer 701, among the positive projections of the first conductive layers 701 on the substrate 1, which is closest to the drain 4 is closer to the positive projection of the drain 4 on the substrate 1 than the positive projection of the gate 5 on the substrate 1, whereby the first conductive layer 701 which is closest to the drain 4 may better reduce the peak electric field strength near the gate 5 and more effectively increase the breakdown voltage of the device.

The first surface of the conductive layer 7 is disposed within the channel layer 203, and the second surface of the conductive layer 7 is connected to the surface of the buffer layer 202 away from the substrate 1 to ensure that the conductive layer 7 is suitable for being formed by the epitaxial growth method and the etching method. Each first conductive layer 701 may be a rectangular body that is easy to mold. The conductive layer 7 has a thickness of 10 nm-1000 nm, which may be 100 nm. The conductive layer 7 may be a structure formed from a metal material suitable for being formed by the epitaxial growth method and the etching method. The metal may be one or more of high temperature resistant materials such as tungsten, molybdenum, tantalum, and nickel. The size of each first conductive layer 701 along the first direction is larger than the size of the first conductive layer 7 along the second direction (i.e., the arrangement direction between the substrate 1 and the semiconductor layer 2), thereby reducing the occupancy ratio of the conductive layer 7 to the channel layer 203, thereby avoiding a significant decrease in the concentration of the two-dimensional electron gas, and ensuring that the switching characteristics of the semiconductor device are still useful and efficient.

The electrocoupling structure 57 is a rod-like structure, and the passivation layer 9 defines an avoidance hole through which the electrocoupling structure 57 passes, such that an end of the electrocoupling structure 57 is inside the semiconductor layer 2 and connected to a connection region of the conductive layer 7, while the other end of the electrocoupling structure 57 is outside the semiconductor layer 2 and connected to a side of the gate 5 facing the source 6. The electrocoupling structure 57, which is presented as the rod-like structure, not only enables the electrical coupling between the conductive layer 7 and the gate 5, but also the structure applied is very simple. In some embodiments, the electrocoupling structure 57 may be perpendicular to the conductive layer 7 and made of a metal material to be suitable for being formed by the epitaxial growth method and the etching method. The metal may be one or more of high temperature resistant materials such as tungsten, molybdenum, tantalum, and nickel.

In some embodiments, the first high-resistance portion 801 is disposed on the first surface of the conductive layer 7 other than the connection region. The number of the first high-resistance portions 801 may be selected as one or more, and when the number of the first high-resistance portions 801 is selected as one, the first high-resistance portions 801 cover all of the first surfaces (i.e., the upper surfaces) of the first conductive layers 701 other than the connection region for connecting the electrocoupling structure 57. When the number of the first high-resistance portions 801 is selected to be more than one, one of the first high-resistance portions 801 covers the first surface of the first conductive layer 701 having the connection region other than the connection region for connecting the electrocoupling structure 57, and each of the remaining first high-resistance portions 801 may independently cover the first surface of a corresponding first conductive layer 701. The first high-resistance portion 801 is made of one of silicon dioxide, silicon nitride, aluminum nitride, and alumina, with a thickness of 5 nm-1000 nm, to be suitable for being formed by the epitaxial growth method and the etching method. The high-resistance structure 8 further includes a second high-resistance portion 802 wrapping the electrocoupling structure 57, for insulating the electrocoupling structure 57 from the two-dimensional electron gas, such that leakage currents generated by the two-dimensional electron gas flowing toward the electrocoupling structure 57 may be intercepted, and thus the risk of the semiconductor device failing or being damaged as a result of this in the process of the high-voltage operation may be effectively reduced. The fabrication material of the second high-resistance portion 802 is one of silicon dioxide, silicon nitride, aluminum nitride, and alumina, with a thickness of 5 nm-1000 nm, to be suitable for being formed by the epitaxial growth method and the etching method.

Next, a fabrication method of the semiconductor device is described, and the steps of the fabrication method include: providing a substrate 1; growing a nucleation layer 201 on the substrate 1; growing a buffer layer 202 on the nucleation layer 201; growing a conductive material layer formed from a metal material on the buffer layer 202; etching the conductive material layer to obtain a conductive layer 7 formed from a remaining conductive material layer; growing a high-resistance material layer formed by an insulating compound on the buffer layer 202 and the conductive layer 7; etching the high-resistance material layer to obtain a first high-resistance portion 801 of a high-resistance structure 8 formed by a remaining high-resistance material layer and disposed on a top of the conductive layer 7; growing a channel layer 203 capable of covering the first high-resistance portion 801 of the high-resistance structure 8 on the buffer layer 202; and growing a barrier layer 204 on the channel layer 203.

Next, opening holes on the barrier layer 204, the channel layer 203, and the first high-resistance portion 801 of the high-resistance structure 8 by etching to obtain a first slot hole **57*a* exposing the conductive layer 7; growing an insulating material on the barrier layer 204 and in the first slot hole 57*a*; opening holes on the insulating material that is on the barrier layer 204 by etching to obtain a source hole region, a gate hole region, and a drain hole region; forming a source 6, a gate 5, and a drain 4 in the source hole region, the gate hole region, and the drain hole region, respectively, by means of growth, etching, and tempering, and at the same time forming a gate field plate 11 connected the gate 5 on the insulating material; opening holes on the insulating material that is in the first slot hole 57*a* by etching, to obtain a second slot hole 57*b* that exposes the conductive layer 7 and is thinner than the first slot hole 57*a*; growing a conductive material inside the second slot hole 57*b*, and etching the conductive material to obtain an electrocoupling structure 57 formed by the conductive material and connecting the conductive layer 7 to the gate 5, and obtaining a passivation layer 9 formed by the remaining insulating material and disposed on the barrier layer 204, and a second high-resistance portion 802 of the high-resistance structure 8 to wrap the electrocoupling structure 57. Corresponding steps can be seen in FIGS. 9*a*-9*i*, and it can be appreciated that the steps of FIGS. 9*a*-9*i* correspond logically to FIGS. 5*a*-5*i*. Those skilled in the art may understand the operational steps of FIGS. 9*a*-9*i* with knowledge of FIGS. 5*a*-5*i***.

Embodiment III

As shown in FIGS. 8, 10-11, different from Embodiment II, the first conductive layers 701 are spaced apart along a third direction. The third direction is perpendicular to the first direction and second direction. That is, the first second and third directions form a right-angle coordinate system.

A fabrication method of the semiconductor device of the present embodiment may be seen in FIGS. **12*a*-12*i*. It will be appreciated that the steps of FIGS. 12*a*-12*i* correspond logically to FIGS. 5*a*-5*i*. Those skilled in the art may understand the operational steps of FIGS. 12*a*-12*i* with knowledge of FIGS. 5*a*-5*i***.

Embodiment IV

As shown in FIGS. 13-14 and 16, different from Embodiment II, the semiconductor device further includes multiple conductive layers 7 of equal dimensions disposed within the channel layer 203, and multiple electrocoupling structures 57 for electrically coupling each of the conductive layers 7 to the gate 5. The multiple conductive layers 7 are disposed at intervals in a third direction and each of the conductive layers 7 is arranged with a connection region for receiving the electrocoupling structure 57, as detailed in FIG. 16. It is to be understood that the connection relationship between each conductive layer 7 and the corresponding electrocoupling structure 57 may be such that the electrocoupling structure 57 is connected to an upper surface or a side (i.e., an end) of the conductive layer 7. A total size of the conductive layers 7 along the third direction is larger than a size of each conductive layer 7 along the second direction, and each conductive layer 7 includes a first surface away from the substrate 1 and a second surface opposite to the first surface and near the substrate 1. A positive projection of each of at least one conductive layer 7 on the substrate 1 is intersected with a positive projection of the gate 5 on the substrate 1. When an electric potential is applied to the gate 5 of the semiconductor device, the source 6 and the drain 4 may be connected through the two-dimensional electron gas, and the conductive layers 7 may regulate an electric field distribution between the channel layer 203 and the barrier layer 204. Compared to the semiconductor device having only one conductive layer, the semiconductor device having multiple conductive layers 7 may reduce the peak electric field strength near the gate 5 more efficiently and further increase the breakdown voltage of the device, thereby improving the operating characteristics of the device at high voltage, high power, and/or high frequency. However, since the peak electric field strength occurs between the gate 5 and the drain 4 and immediately adjacent to the gate 5, it is proposed that the positive projection of the conductive layer 7, among the positive projections of the conductive layers 7 on the substrate 1, which is closest to the drain 4 is closer to the positive projection of the drain 4 on the substrate 1 than the positive projection of the gate 5 on the substrate 1, whereby the conductive layer 7 which is closest to the drain 4 may better reduce the peak electric field strength near the gate 5, and more effectively improve the operating characteristics of the device at high voltage, high power, and/or high frequency, thereby more effectively increasing the breakdown voltage of the device.

The first surface of the conductive layer 7 is disposed within the channel layer 203, and the second surface of the conductive layer 7 is connected to an interface between the buffer layer 202 and the channel layer 203 to ensure that the conductive layer 7 is suitable to be formed by the epitaxial growth method and the etching method. The conductive layer 7 has a thickness of 10 nm-1000 nm, which may be 100 nm. The conductive layer 7 may be a conductive doped semiconductor structure, suitable for being formed by the epitaxial growth method and the etching method. Each conductive doped semiconductor structure may be one of an N-type doped semiconductor structure and a P-type doped semiconductor structure, in particular a structure formed by silicon-doped gallium nitride with a doping concentration of $10^{18}/cm^3$. The conductive layer 7 has high structural stability due to the use of the doped semiconductor material, and will not react with gases (e.g., ammonia) in subsequent processes of the device fabrication process, ensuring that it can successfully realize the effect of regulating the electric field. The size of the conductive layer 7 along the first direction is larger than the size of the conductive layer 7 along the second direction (i.e., the arrangement direction between the substrate 1 and the semiconductor layer 2), which reduces the occupancy ratio of the conductive layer 7 to the channel layer 203, thereby avoiding a significant decrease in the concentration of the two-dimensional electron gas, and ensuring that the switching characteristics of the semiconductor device are still useful and efficient.

The electrocoupling structure 57 is a rod-like structure, and the passivation layer 9 defines an avoidance hole through which the electrocoupling structure 57 passes, such that an end of the electrocoupling structure 57 is inside the semiconductor layer 2 and connected to a connection region of the conductive layer 7, while the other end of the electrocoupling structure 57 is outside the semiconductor layer 2 and connected to a side of the gate 5 facing the source 6. The number of the electrocoupling structures 57 is the same as the number of the conductive layers 7, such that each conductive layer 7 can be connected to the gate 5 through a corresponding electrocoupling structure 57 perpendicular to the conductive layer 7. The electrocoupling structure 57, which is presented as the rod-like structure, not only enables the electrically coupling between the conductive layer 7 and the gate 5, but also the structure applied is very simple. In some embodiments, the electrocoupling structure 57 may be perpendicular to the conductive layer 7 and made of a metal material to be suitable for being formed by the epitaxial growth method and the etching method. The metal may be one or more of high temperature resistant materials such as tungsten, molybdenum, tantalum, and nickel.

The high-resistance structure 8 includes a first high-resistance portion 801, which is disposed above the conductive layer 7 for insulating the conductive layer 7 from the two-dimensional electron gas, such that leakage currents generated by the two-dimensional electron gas flowing toward the conductive layer 7 may be intercepted, and thus the risk of the semiconductor device failing or being damaged as a result of this in the process of the high-voltage operation may be effectively reduced. In addition, the high-resistance structure 8 further prevents the conductive layer 7 from reacting with the ammonia gas used during the subsequent device fabrication process and in particular for the epitaxial growth, thereby ensuring the effectiveness of the conductive layer 7. The number of the first high-resistance sections 801 may be selected as one or more, and when the number of first high-resistance sections 801 is selected as one, the first high-resistance section 801 covers all of the first surfaces of the conductive layers 7 other than the connection region on each of the conductive layers 7 for connecting to the corresponding electrocoupling structure 57. When the number of the first high-resistance sections 801 is selected to be more than one, each of the first high-resistance sections 801 may independently cover a corresponding conductive layer 7 other than the connection region on the conductive layer 7 for connecting the corresponding electrocoupling structures 57. The first high-resistance portion 801 is made of one of silicon dioxide, silicon nitride, aluminum nitride, and alumina, with a thickness of 5 nm-1000 nm, to be suitable for being formed by the epitaxial growth method and the etching method.

The high-resistance structure 8 further includes a second high-resistance portion 802 wrapping the electrocoupling structure 57, for insulating the electrocoupling structure 57 from the two-dimensional electron gas, such that leakage currents generated by the two-dimensional electron gas flowing toward the electrocoupling structure 57 may be intercepted, and thus the risk of the semiconductor device failing or being damaged as a result of this in the process of the high-voltage operation may be effectively reduced. The number of the second high-resistance portions 802 may be selected as one or more, and when the number of the second high-resistance portions 802 is selected as one, the second high-resistance portion 802 wraps all of the electrocoupling structures 57; and when the number of the second high-resistance portions 802 is selected as more than one, each of the second high-resistance portions 802 may independently wrap a corresponding electrocoupling structure 57 and ensure that each of the electrocoupling structures 57 is wrapped by one second high-resistance portion 802. The second high-resistance portion 802 is made of one of silicon dioxide, silicon nitride, aluminum nitride, and alumina, with a thickness of 5 nm-1000 nm, to be suitable for being formed by the epitaxial growth method and the etching method.

Next, a fabrication method of the semiconductor device is described, the steps of the fabrication method include: providing a substrate 1; growing a nucleation layer 201 on the substrate 1; growing a buffer layer 202 on the nucleation layer 201; growing a conductive material layer formed from a conductive doped semiconductor material on the buffer layer 202; growing a high-resistance material layer formed from an insulating compound on the conductive material layer; etching the conductive material layer and the high-resistance material layer, to obtain a conductive layer 7 formed from a remaining conductive material layer and to obtain a first high-resistance portion 801 of a high-resistance structure 8 formed by a remaining high-resistance material layer and disposed on a top of the conductive layer 7; growing a channel layer 203 capable of covering the conductive layer 7 and the first high-resistance portion 801 on the buffer layer 202; growing a barrier layer 204 on the channel layer 203; and opening holes on the barrier layer 204, the channel layer 203, and the first high-resistance portion 801 of the high-resistance structure 8 by etching to obtain a first slot hole 57*a* exposing the conductive layer 7.

Next, growing an insulating material on the barrier layer 204 and in the first slot hole 57*a*; opening holes on the insulating material that is on the barrier layer 204 by etching to obtain a source hole region, a gate hole region, and a drain hole region; forming a source 6, a gate 5, and a drain 4 in the source hole region, the gate hole region, and the drain hole region, respectively, by means of growth, etching, and tempering, and at the same time forming a gate field plate 11 connected the gate 5 on the insulating material; opening holes on the insulating material that is in the first slot hole 57*a* by etching, to obtain a second slot hole 57*b* that exposes the conductive layer 7 and is thinner than the first slot hole 57*a*.

Thereafter, growing a conductive material inside the second slot hole 57*b*, and etching the conductive material to obtain an electrocoupling structure 57 formed by the conductive material and connecting the conductive layer 7 to the gate 5, and obtaining a passivation layer 9 formed by the remaining insulating material and on the barrier layer 204, and a second high-resistance portion 802, formed by the remaining insulating material, of the high-resistance structure 8 for wrapping the electrocoupling structure 57.

Corresponding steps can be seen in FIGS. 15*a*-15*i*, and it can be appreciated that the steps of FIGS. 15*a*-15*i* logically correspond to FIGS. 5*a*-5*i*. Those skilled in the art may understand the operational steps of FIGS. 15*a*-15*i* with knowledge of FIGS. 5*a*-5*i*.

Embodiment V

As shown in FIGS. 17-18, different from Embodiment I, the first surface of the conductive layer 7 is disposed within the channel layer 203, and the second surface of the conductive layer 7 is also disposed within the channel layer 203 to ensure that the conductive layer 7 is suitable to be formed by the ion implantation method and tempering activation. The conductive layer 7 may be a rectangular body that can be easily molded. The conductive layer 7 has a thickness of 10 nm-1000 nm, which may be 100 nm. The conductive layer 7 may be a conductive doped semiconductor structure, suitable for being formed by the ion implantation method and tempering activation. The conductive doped semiconductor structure may be one of an N-type doped semiconductor structure and a P-type doped semiconductor structure, in particular a structure formed by silicon-doped gallium nitride with a doping concentration of $5*10^{17}/cm^3$. The size of the conductive layer 7 along the first direction (i.e., the arrangement direction between the source 6 and the drain 4) is larger than the size of the conductive layer 7 along the second direction (i.e., the arrangement direction between the substrate 1 and the semiconductor layer 2), thereby reducing the occupancy ratio of the conductive layer 7 to the channel layer 203, thereby avoiding a significant decrease in the concentration of the two-dimensional electron gas, and ensuring that the switching characteristics of the semiconductor device are still useful and efficient.

The electrocoupling structure 57 is a rod-like structure, and the passivation layer 9 defines an avoidance hole through which the electrocoupling structure 57 passes, such that an end of the electrocoupling structure 57 is inside the semiconductor layer 2 and connected to a connection region of the conductive layer 7, while the other end of the electrocoupling structure 57 is outside the semiconductor layer 2 and connected to a side of the gate 5 facing the source 6. The electrocoupling structure 57, which is presented as the rod-like structure, not only enables the electrical coupling between the conductive layer 7 and the gate 5, but also the structure applied is very simple, as can be seen in FIG. 4. In some embodiments, the electrocoupling structure 57 may be perpendicular to the conductive layer 7 and made of a metal material to be suitable for being formed by the epitaxial growth method and the etching method. The metal may be one or more of high temperature resistant materials such as tungsten, molybdenum, tantalum, and nickel.

The high-resistance structure 8 includes a first high-resistance portion 801, which is disposed above the conductive layer 7 for insulating the conductive layer 7 from the two-dimensional electron gas. The fabrication material of the first high-resistance portion 801 may be of a high-resistance doped semiconductor structure, such as boron-doped gallium nitride, with a thickness of 5 nm-1000 nm, to be suitable for being formed by the ion implantation method and tempering activation. In some embodiments, the first high-resistance portion 801 is disposed on the first surface of the conductive layer 7 other than the connection region. In some embodiments, the first high-resistance portion 801 is a structure formed by boron-doped gallium nitride and has a doping concentration of $5*10^{17}/cm^3$. Since a high-resistance dopant such as boron ions can disrupt the crystal lattice within the semiconductor structure to achieve high resistance, and the high-resistance property is utilized to block leakage currents generated by two-dimensional electron gases flowing into the conductive layer 7, such that the risk of failure or damage to the semiconductor device during high-voltage operation can be effectively reduced.

The high-resistance structure 8 further includes a second high-resistance portion 802 wrapping the electrocoupling structure 57, for insulating the electrocoupling structure 57 from the two-dimensional electron gas, such that leakage currents generated by the two-dimensional electron gas flowing toward the electrocoupling structure 57 may be intercepted, and thus the risk of the semiconductor device failing or being damaged as a result of this in the process of the high-voltage operation may be effectively reduced. The fabrication material of the second high-resistance portion 802 is one of silicon dioxide, silicon nitride, aluminum nitride, and alumina, with a thickness of 5 nm-1000 nm, to be suitable for being formed by the epitaxial growth method and the etching method.

Next, a fabrication method of a semiconductor device is described, the steps of the fabrication method include: providing a substrate 1; growing a nucleation layer 201 on the substrate 1; growing a buffer layer 202 on the nucleation layer 201; growing a channel layer 203 on the buffer layer 202; growing a barrier layer 204 on the channel layer 203; injecting a conductive dopant into the channel layer 203 at a fixed region and a fixed depth by ion implantation, to obtain a conductive dopant region; tempering the conductive dopant region for activation to obtain a conductive layer 7; injecting a high-resistance dopant into the channel layer 203 at a fixed region and a fixed depth by ion implantation, to obtain a high-resistance dopant region on top of the conductive dopant region; tempering the high-resistance dopant region for activation to obtain a first high-resistance portion 801 of the high-resistance structure 8; and opening holes on the barrier layer 204, the channel layer 203, and the first high-resistance portion 801 of the high-resistance structure 8 by etching to obtain a first slot hole 57*a* exposing the conductive layer 7.

Next, growing an insulating material on the barrier layer 204 and in the first slot hole 57*a*; opening holes on the insulating material that is on the barrier layer 204 by etching to obtain a source hole region, a gate hole region, and a drain hole region; forming a source 6, a gate 5, and a drain 4 in the source hole region, the gate hole region, and the drain hole region, respectively, by means of growth, etching, and tempering, and at the same time forming a gate field plate 11 connected the gate 5 on the insulating material; opening holes on the insulating material that is in the first slot hole 57*a* by etching, to obtain a second slot hole 57*b* that exposes the conductive layer 7 and is thinner than the first slot hole 57*a*; growing a conductive material in the second slot hole 57*b*, and etching the conductive material to obtain an electrocoupling structure 57 formed by the conductive material and connecting the conductive layer 7 to the gate 5, and obtaining a passivation layer 9 formed by the remaining insulating material and on the barrier layer 204, and a second high-resistance portion 802 of the high-resistance structure 8 for wrapping the electrocoupling structure 57. Corresponding steps can be seen in FIGS. 19*a*-19*i*, and it can be appreciated that the steps of FIGS. 19*a*-19*i* correspond logically to FIGS. 5*a*-5*i*. Those skilled in the art may understand the operational steps of FIGS. 19*a*-19*i* with knowledge of FIGS. 5*a*-5*i*.

Embodiment VI

As shown in FIGS. 20-21, different from Embodiment I, the semiconductor device further includes a conductive layer 7 disposed within the buffer layer 202, and an electrocoupling structure 57 for electrically coupling the conductive layer 7 to the gate 5. The conductive layer 7 includes a first surface away from the substrate 1 and a second surface opposite to the first surface and near the substrate 1. The number of the conductive layer 7 may be one, and a positive projection of the conductive layer 7 on the substrate 1 is intersected with a positive projection of the gate 5 on the substrate 1. When an electric potential is applied to the gate 5 of the semiconductor device, the source 6 and the drain 4 may be connected through the two-dimensional electron gas, and the conductive layer 7 may regulate an electric field distribution between the channel layer 203 and the barrier layer 204, reduce a peak electric field strength near the gate 5, and increase a breakdown voltage of the device, thereby improving the device's operating characteristics at high voltages, high powers, and/or high frequencies. However, since the peak electric field strength occurs between the gate 5 and the drain 4 and immediately adjacent to the gate 5, it is proposed to set up the conductive layer 7 in such a way that the positive projection of the conductive layer 7 on the substrate 1 is closer to a positive projection of the drain 4 on the substrate 1 than the positive projection of the gate 5 on the substrate 1, whereby the conductive layer 7 may further reduce the peak electric field strength near the gate 5 and further improve the breakdown voltage of the device.

The first surface of the conductive layer 7 abuts against a side of the buffer layer 202 away from the substrate 1, and the second surface of the conductive layer 7 is disposed within the buffer layer 202 to ensure that the conductive layer 7 is suitable for being formed by the ion implantation method and tempering activation. The conductive layer 7 may be a rectangular body that can be easily molded. The conductive layer 7 has a thickness of 10 nm-1000 nm, which may be 100 nm. The conductive layer 7 may be a conductive doped semiconductor structure, suitable for being formed by the ion implantation method and tempering activation. The conductive doped semiconductor structure may be one of an N-type doped semiconductor structure and a P-type doped semiconductor structure, in particular a structure formed by silicon-doped gallium nitride with a doping concentration of $5*10^{17}/cm^3$. The size of the conductive layer 7 along the first direction (i.e., the arrangement direction between the source 6 and the drain 4) is larger than the size of the conductive layer 7 along the second direction (i.e., the arrangement direction between the substrate 1 and the semiconductor layer 2), thereby reducing the occupancy ratio of the conductive layer 7 to the channel layer 203, thereby avoiding a significant decrease in the concentration of the two-dimensional electron gas, and ensuring that the switching characteristics of the semiconductor device are still useful and efficient.

The electrocoupling structure 57 is a rod-like structure, and the passivation layer 9 defines an avoidance hole through which the electrocoupling structure 57 passes, such that an end of the electrocoupling structure 57 is inside the semiconductor layer 2 and connected to a connection region of the conductive layer 7, while the other end of the electrocoupling structure 57 is outside the semiconductor layer 2 and connected to a side of the gate 5 facing the source 6. The electrocoupling structure 57, which is presented as the rod-like structure, not only enables the electrical coupling between the conductive layer 7 and the gate 5, but also the structure applied is very simple. In some embodiments, the electrocoupling structure 57 may be perpendicular to the conductive layer 7 and made of a metal material to be suitable for being formed by the epitaxial growth method and the etching method. The metal may be one or more of high temperature resistant materials such as tungsten, molybdenum, tantalum, and nickel.

The high-resistance structure 8 includes a first high-resistance portion 801 (high-resistance layer) formed from a high-resistance material, that can cover the first surface of the conductive layer 7 other than the connection region of the conductive layer 7. The first high-resistance portion 801 is configured to insulate the conductive layer 7 from the two-dimensional electron gas to intercept leakage currents generated by the two-dimensional electron gas flowing to the conductive layer 7, thereby effectively reducing the risk of failure or damage to the semiconductor device during high-voltage operation. The first high-resistance portion 801 is selected as an integral layer structure, and thus the projected area of the first high-resistance portion 801 on the substrate 1 is much larger than the projected area of the conductive layer 7 on the substrate 1, which may effectively insulate the conductive layer 7 from the two-dimensional electron gas. Because the first high-resistance portion 801 is selected to be an integral layer structure, the first high-resistance portion 801 includes a lower surface that is connected to the side of the buffer layer 202 away from the substrate 1, and an upper surface that is connected to a side of the channel layer 203 near the substrate 1. The fabrication material of the first high-resistance portion 801 includes one of insulating compounds such as silicon dioxide, silicon nitride, aluminum nitride, and alumina, with a thickness of 5 nm-1000 nm, to be suitable for being formed by an epitaxial growth method to simplify the preparation process. In some embodiments, the first high-resistance portion 801 is a structure formed by boron-doped gallium nitride and has a doping concentration of $5*10^{17}/cm^3$. In other embodiments, the first high-resistance portion 801 of the high-resistance structure 8 may be of a non-integral layer structure, such as a non-integral layer structure similar to Embodiment III that only covers the conductive layer 7.

The high-resistance structure 8 also includes a second high-resistance portion 802 (referring to FIG. 3) wrapping the electrocoupling structure 57, for insulating the electrocoupling structure 57 from the two-dimensional electron gas, such that leakage currents generated by the two-dimensional electron gas flowing toward the electrocoupling structure 57 may be intercepted, and thus the risk of the semiconductor device failing or being damaged as a result of this in the process of the high-voltage operation may be effectively reduced. The fabrication material of the second high-resistance portion 802 is one of silicon dioxide, silicon nitride, aluminum nitride, and alumina, with a thickness of 5 nm-1000 nm, to be suitable for being formed by the epitaxial growth method and the etching method.

Next, a fabrication method of a semiconductor device is described, the steps of the fabrication method include: providing a substrate 1; growing a nucleation layer 201 on the substrate 1; growing a buffer layer 202 on the nucleation layer 201; injecting a conductive dopant into the buffer layer 202 at a fixed region and a fixed depth by ion implantation, to obtain a conductive dopant region; tempering the conductive dopant region for activation to obtain a conductive layer 7; growing a high-resistance layer on the buffer layer 202; growing a channel layer 203 on a first high-resistance portion 801 (the high-resistance layer); growing a barrier layer 204 on the channel layer 203, and opening holes on the barrier layer 204, the channel layer 203, and the high-resistance layer by etching, to obtain a first slot hole 57*a* exposing the conductive layer 7; and growing an insulating material on the barrier layer 204 and in the first slot hole 57*a*.

Next, opening holes on the insulating material that is on the barrier layer 204 by etching to obtain a source hole region, a gate hole region, and a drain hole region; forming a source 6, a gate 5, and a drain 4 in the source hole region, the gate hole region, and the drain hole region, respectively, by means of growth, etching, and tempering, and at the same time forming a gate field plate 11 connected to the gate 5 on the insulating material; opening holes on the insulating material that is in the first slot hole 57*a* by etching, to obtain a second slot hole 57*b* that exposes the conductive layer 7 and is thinner than the first slot hole 57*a*; growing a conductive material on the second slot hole 57*b*, and etching the conductive material to obtain an electrocoupling structure 57 formed by the conductive material and connecting the conductive layer 7 to the gate 5, and obtaining a passivation layer 9 formed by the insulating material and disposed on the barrier layer 204, and a second high-resistance portion 802 of the high-resistance structure 8 for wrapping the electrocoupling structure 57. Corresponding steps can be seen in FIGS. 22*a*-22*i*, and it can be appreciated that the steps of FIGS. 22*a*-22*i* correspond logically to FIGS. 5*a*-5*i*. Those skilled in the art may understand the operational steps of FIGS. 22*a*-22*i* with knowledge of FIGS. 5*a*-5*i*.

Embodiment VII

Figure 1:
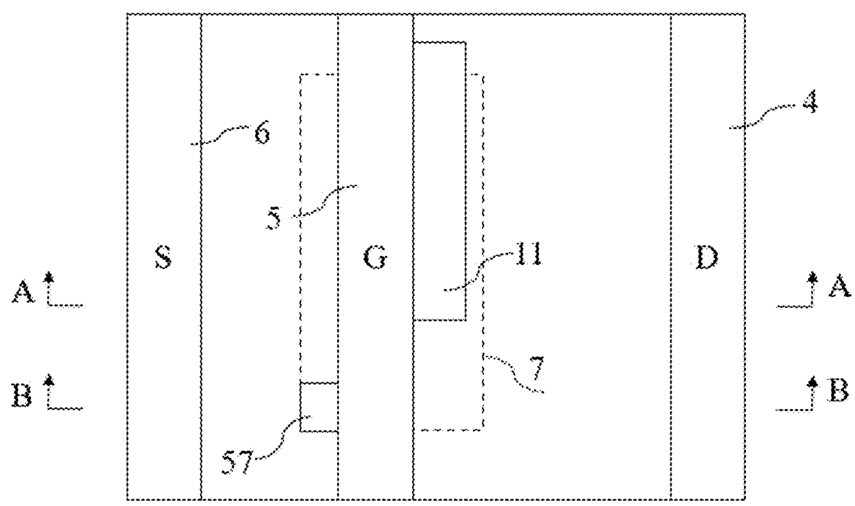
FIG. 1 is a schematic view of a top view structure of a semiconductor device according to Embodiment I of the present disclosure.

As shown in FIGS. 1, 23-24, the semiconductor device includes a substrate 1 and a semiconductor layer 2 disposed on the substrate 1. The substrate 1 may be made of silicon (Si), silicon carbide (SiC), or sapphire. The semiconductor layer 2 includes a first semiconductor stack layer and a second semiconductor layer disposed on the first semiconductor stack. The second semiconductor layer includes a barrier layer 204, a main fabrication material of which may be an alloy nitride, in particular aluminum gallium nitride (AlGaN), with a thickness of 5 nm-50 nm. The first semiconductor stack layer includes a buffer layer 202 and a channel layer 203 disposed on the buffer layer 202, where a main fabrication material of the channel layer 203 may be selected as a Group III-V nitride, in particular a gallium nitride (GaN), with a thickness of 100 nm-1000 nm. When the channel layer 203 includes a Group III-V nitride and the barrier layer 204 includes an alloy nitride, the channel layer 203 and the barrier layer 204 are heterogeneous structures, and two-dimensional electron gas (2DEG) is formed at an interface between the channel layer 203 and the barrier layer 204, due to a large polarization intensity difference and forbidden band width difference between the two. Each of the channel layer 203 and the barrier layer 204 may be of a one-layer or multi-layer structure. In some embodiments, the channel layer 203 includes a 300 nm high-resistance gallium nitride layer and a 200 nm high-temperature gallium nitride layer disposed in a direction away from the substrate 1, while the barrier layer 204 includes a 1 nm aluminum nitride layer, a 20 nm aluminum gallium nitride layer, and a 2 nm gallium nitride layer disposed in a direction away from the channel layer 203.

The semiconductor layer 2 may further include a nucleation layer 201 disposed on the substrate 1, with the buffer layer 202 disposed on the nucleation layer 201. The nucleation layer 201 is made of aluminum carbide (AlN) or gallium nitride (GaN) with a thickness of 10 nm-500 nm, for improving the growth quality of the buffer layer 202 and having an isolation effect. And the buffer layer 202 is made of iron-doped gallium nitride, carbon-doped gallium nitride, gallium nitride (GaN), or aluminum gallium nitride (AlGaN), with a thickness of 100 nm-10 um, for improving the growth quality of the Group III-V nitride. The buffer layer 202 may be of a one-layer or multi-layer structure. When the substrate 1 is selected as a silicon material, the buffer layer 202 may be of a three-layer structure, with the first layer being AlGaN with an aluminum content of 75% and an entire layer thickness of 400 nm, the second layer being AlGaN with an aluminum content of 50% and an entire layer thickness of 900 nm, and the third layer being AlGaN with an aluminum content of 25% and an entire layer thickness of 1500 nm.

The semiconductor device further includes a gate 5, a drain 4, and a source 6 primarily disposed on the barrier layer 204. b Each of the source 6 and the drain 4 may be of a one-layer or a multi-layer structure, and may include a titanium (Ti) layer, an aluminum (Al) layer, a nickel (Ni) layer, and a gold (Au) layer that are sequentially connected. The source 6 is in ohmic contact with the barrier layer 204 and is electrically coupled to the two-dimensional electron gas. The drain 4 is also in ohmic contact with the barrier layer 204 and is electrically coupled to the two-dimensional electron gas. The gate 5 primarily includes one or both of a nickel (Ni) layer and a gold (Au) layer and is in Schottky contact with the barrier layer 204. When using the semiconductor device, varying the electric field of the gate 5 may modulate the two-dimensional electron gas and control the turn-on and turn-off of the source 6 and drain 4.

The semiconductor device further includes a passivation layer 9. The passivation layer 9 is disposed on the barrier layer 204 and in avoidance with the gate 5, the drain 4, and the source 6. That is, the passivation layer 9 defines avoidance holes for penetration of the gate 5, the drain 4, and the source 6, respectively, such that the passivation layer 9 may provide insulating insulation for the gate 5, the drain 4, and the source 6 to prevent the semiconductor device from malfunctioning due to occurrence of erroneous turn-on between the terminals. The fabrication material of the passivation layer 9 includes one of insulating compounds such as silicon dioxide, silicon nitride, aluminum nitride, and alumina.

As shown in FIGS. 23 and 24, the semiconductor device further includes a conductive layer 7 disposed within the channel layer 203, and an electrocoupling structure 57 for electrically coupling the conductive layer 7 to the gate 5. The conductive layer 7 includes a first surface away from the substrate 1 and a second surface opposite to the first surface and near the substrate 1, and a side surface connected to the first surface and the second surface. The number of the conductive layer 7 may be one, and a positive projection of the conductive layer 7 on the substrate 1 is intersected with a positive projection of the gate 5 on the substrate 1. When an electric potential is applied to the gate 5 of the semiconductor device, the source 6 and the drain 4 may be connected through the two-dimensional electron gas, and the conductive layer 7 may regulate an electric field distribution between the channel layer 203 and the barrier layer 204, reduce a peak electric field strength near the gate 5, and increase a breakdown voltage of the device, thereby improving the operating characteristics of the device at high voltages, high powers, and/or high frequencies. However, since the peak electric field strength occurs between the gate 5 and the drain 4 and immediately adjacent to the gate 5, it is proposed to set up in such a way that the positive projection of the conductive layer 7 on the substrate 1 is closer to a positive projection of the drain 4 on the substrate 1 than the positive projection of the gate 5 on the substrate 1, whereby the conductive layer 7 may further reduce the peak electric field strength near the gate 5 and further improve the breakdown voltage of the device.

The first surface of the conductive layer 7 is disposed within the channel layer 203, and the second surface of the conductive layer 7 abuts against the interface between the buffer layer 202 and the channel layer 203 to ensure that the conductive layer 7 is suitable for being formed by the epitaxial growth method and the etching method. The conductive layer 7 may be a rectangular body that can be easily molded, as detailed in FIG. 4. The thickness of the conductive layer 7 is 10 nm-1000 nm, and may be 100 nm. The conductive layer 7 may be a structure made of a metal material suitable for being formed by the epitaxial growth method and the etching method. The metal may be one or more of high temperature resistant materials such as tungsten, molybdenum, titanium, and nickel. The size of the conductive layer 7 along a first direction (i.e., an arrangement direction between the source 5 and the drain 4) is larger than the size of the conductive layer 7 along a second direction (i.e., an arrangement direction between the substrate 1 and the semiconductor layer 2), resulting in a flattened structure, thereby reducing the occupancy ratio of the conductive layer 7 to the communication layer 3, thereby effectively avoiding the concentration of the two-dimensional electron gas from dropping significantly due to the large size of the conductive layer 7, which may ensure that the switching characteristics of the semiconductor device remain useful and efficient.

The electrocoupling structure 57 is a rod-like structure, and the passivation layer 9 defines an avoidance hole through which the electrocoupling structure 57 passes, such that an end of the electrocoupling structure 57 is inside the semiconductor layer 2 and connected to a connection region of the conductive layer 7, while the other end of the electrocoupling structure 57 is outside the semiconductor layer 2 and connected to a side of the gate 5 facing the source 6. The electrocoupling structure 57, which is presented as the rod-like structure, not only enables the electrical coupling between the conductive layer 7 and the gate 5, but also the structure applied is very simple. In some embodiments, the electrocoupling structure 57 may be perpendicular to the conductive layer 7 and made of a metal material to be suitable for being formed by the epitaxial growth method and the etching method. The metal may be one or more of high temperature resistant materials such as tungsten, molybdenum, tantalum, and nickel.

The high-resistance structure 8 includes a first high-resistance portion 801, which is disposed above the conductive layer 7 for insulating the conductive layer 7 from the two-dimensional electron gas, such that leakage currents generated by the two-dimensional electron gas flowing toward the conductive layer 7 may be intercepted, and thus the risk of the semiconductor device failing or being damaged as a result of this in the process of the high-voltage operation may be effectively reduced. In addition, the high-resistance structure 8 further prevents the conductive layer 7 from reacting with the ammonia gas used during the subsequent device fabrication process and in particular for the epitaxial growth, thereby ensuring the effectiveness of the conductive layer 7. In some embodiments, the first high-resistance portion 801 is disposed on the first surface of the conductive layer 7 other than the connection region. The fabrication material of the first high-resistance portion 801 is one of silicon dioxide, silicon nitride, aluminum nitride, and alumina, and the thickness may be 5 nm-1000 nm to ensure that it is suitable to be formed by the epitaxial growth method and the etching method.

The high-resistance structure 8 further includes a second high-resistance portion 802 wrapping the electrocoupling structure 57 for insulating the electrocoupling structure 57 from the two-dimensional electron gas, such that leakage currents generated by the two-dimensional electron gas flowing toward the electrocoupling structure 57 may be intercepted, and thus the risk of the semiconductor device failing or being damaged as a result of this in the process of the high-voltage operation may be effectively reduced. The second high-resistance portion 802 is similar to a sleeve structure, which is made of one of silicon dioxide, silicon nitride, aluminum nitride, and alumina, and the thickness may be 5 nm-1000 nm to ensure that it is suitable for being formed by the epitaxial growth method and the etching method.

To further prevent the conductive layer 7 from reacting during subsequent device fabrication processes, the semiconductor device further includes a barrier material 8', which is connected to the high-resistance structure 8 and covers a side of the conductive layer 7. The fabrication steps and materials selected for the barrier material 8' and the first high-resistance portion 801 of the high-resistance structure 8 may be the same or different.

The semiconductor device may further include a gate field plate 11 disposed on the passivation layer 9 and connected to the gate 5. The gate field plate 11 may assist the conductive layer 7 in regulating the electric field distribution between the channel layer 203 and the barrier layer 204, thereby further reducing the peak electric field strength near the gate 5, and substantially increasing the breakdown voltage of the device.

Next, a fabrication method of a semiconductor device is described, and the steps of the fabrication method include: providing a substrate 1, referring to FIG. 25*a* for details; growing a nucleation layer 201 on the substrate 1; growing a buffer layer 202 on the nucleation layer 201, referring to FIG. 25*b* for details; growing a conductive material layer formed from a metal material on the buffer layer 202; etching the conductive material layer to obtain a conductive layer 7 formed from a remaining conductive material layer; growing a high-resistance material layer formed by an insulating compound on the buffer layer 202 and the conductive layer 7; etching the high-resistance material layer to obtain a first high-resistance portion 801 of a high-resistance structure 8 formed by a remaining high-resistance material layer and disposed on a top of the conductive layer 7, as well as a barrier material 8' covering a side of the conductive layer 7, referring to FIG. 25*c* for details; growing a channel layer 203, capable of covering the first high-resistance portion 801 of the high-resistance structure 8 and the barrier material 8', on the buffer layer 202; and growing a barrier layer 204 on the channel layer 203, referring to FIG. 25*d* for details.

Next, opening holes on the barrier layer 204, the channel layer 203, and the first high-resistance portion 801 of the high-resistance structure 8 by etching to obtain a first slot hole 57*a* exposing the conductive layer 7, referring to FIG. 25*e* for details; growing an insulating material 9*a* on the barrier layer 204 and in the first slot hole 57*a*, referring to FIG. 25*f* for details; opening holes on the insulating material 9*a* that is on the barrier layer 204 by etching to obtain a source hole region, a gate hole region, and a drain hole region; forming a source 6, a gate 5, and a drain 4 in the source hole region, the gate hole region, and the drain hole region, respectively, by means of growth, etching, and tempering, and at the same time forming a gate field plate 11 connected to the gate 5 on the insulating material 9*a*, referring to FIG. 25*g* for details; opening holes on the insulating material 9*a* that is in the first slot hole 57*a* by etching, to obtain a second slot hole 57*b* that exposes the conductive layer 7 and is thinner than the first slot hole 57*a*, referring to FIG. 25*h* for details; growing a conductive material inside the second slot 57*b*, and etching the conductive material to obtain an electrocoupling structure 57 formed by the conductive material and connecting the conductive layer 7 to the gate 5, and obtaining a passivation layer 9 formed by the remaining insulating material 9*a* and disposed on the barrier layer 204, and a second high-resistance portion 802 of the high-resistance structure 8 to cover the electrocoupling structure 57, referring to FIG. 25*i* for details.

It will be appreciated that the main difference between Embodiment VII and Embodiment I is the material of the conductive layer 7 and the setting of the barrier material 8'. Those skilled in the art may understand the relevant technical features of the present embodiment in the context or the embodiment one.

Embodiment VIII

As shown in FIGS. 6, 8, 26, different from Embodiment VII, the conductive layer 7 includes first conductive layers 701 spaced apart along a first direction (i.e., an arrangement direction between the source 6 and the drain 4) and a second conductive layer 702 connecting the first conductive layer 701, and a connection region (third conductive layer) 703 is arranged on one of the first conductive layers 701 in contact with the electrocoupling structure 57. In some embodiments, the connection region 703 is disposed on an extended region where the first conductive layer 701 having the connection region 703 extends back from the second conductive layer 702. In some embodiments, the second conductive layer 702 and the first conductive layer 701 are perpendicular to each other to reduce fabrication difficulty. A positive projection of each of at least one first conductive layer 701 on the substrate 1 is intersected with a positive projection of the gate 5 on the substrate 1. When an electric potential is applied to the gate 5 of the semiconductor device, the source 6 and the drain 4 may be connected through the two-dimensional electron gas, and the conductive layer 7 uniformly regulates the electric field distribution between the channel layer 203 and the barrier layer 204 mainly with the aid of the first conductive layers 701. Compared to the semiconductor device in Embodiment I, the semiconductor device having the first conductive layers 701 and the second conductive layer 702 is able to reduce the peak electric field strength near the gate 5 more effectively, and further increase the breakdown voltage of the device, thereby improving the operating characteristics of the device at high voltage, high power, and/or high frequency. However, since the peak electric field strength occurs between the gate 5 and the drain 4 and immediately adjacent to the gate 5, it is proposed that the positive projection of the first conductive layer 701, among the positive projections of the first conductive layers 701 on the substrate 1, which is closest to the drain 4 is closer to the positive projection of the drain 4 on the substrate 1 than the positive projection of the gate 5 on the substrate 1, whereby the first conductive layer 701 which is closest to the drain 4 may better reduce the peak electric field strength near the gate 5 and more effectively increase the breakdown voltage of the device.

The first surface of the conductive layer 7 is disposed within the channel layer 203, and the second surface of the conductive layer 7 is connected to the surface of the buffer layer 202 away from the substrate 1 to ensure that the conductive layer 7 is suitable for being formed by the epitaxial growth method and the etching method. Each first conductive layer 701 may be a rectangular body that is easy to mold. The conductive layer 7 has a thickness of 10 nm-1000 nm, which may be 100 nm. The conductive layer 7 may be a structure formed from a metal material suitable for being formed by the epitaxial growth method and the etching method. The metal may be one or more of high temperature resistant materials such as tungsten, molybdenum, tantalum, and nickel. The size of each first conductive layer 701 along the first direction is larger than the size of the first conductive layer 7 along the second direction (i.e., the arrangement direction between the substrate 1 and the semiconductor layer 2), thereby reducing the occupancy ratio of the conductive layer 7 to the channel layer 203, thereby avoiding a significant decrease in the concentration of the two-dimensional electron gas, and ensuring that the switching characteristics of the semiconductor device are still useful and efficient.

The electrocoupling structure 57 is a rod-like structure, and the passivation layer 9 defines an avoidance hole through which the electrocoupling structure 57 passes, such that an end of the electrocoupling structure 57 is inside the semiconductor layer 2 and connected to a connection region of the conductive layer 7, while the other end of the electrocoupling structure 57 is outside the semiconductor layer 2 and connected to a side of the gate 5 facing the source 6. The electrocoupling structure 57, which is presented as the rod-like structure, not only enables the electrical coupling between the conductive layer 7 and the gate 5, but also the structure applied is very simple. In some embodiments, the electrocoupling structure 57 may be perpendicular to the conductive layer 7 and made of a metal material to be suitable for being formed by the epitaxial growth method and the etching method. The metal may be one or more of high temperature resistant materials such as tungsten, molybdenum, tantalum, and nickel.

In some embodiments, the first high-resistance portion 801 is disposed on the first surface of the conductive layer 7 other than the connection region. The number of the first high-resistance portions 801 may be selected as one or more, and when the number of the first high-resistance portions 801 is selected as one, the first high-resistance portions 801 cover all of the first surfaces (i.e., the upper surfaces) of the first conductive layers 701 other than the connection region for connecting the electrocoupling structure 57. When the number of the first high-resistance portions 801 is selected to be more than one, one of the first high-resistance portions 801 covers the first surface of the first conductive layer 701 having the connection region other than the connection region for connecting the electrocoupling structure 57, and each of the remaining first high-resistance portions 801 may independently cover the first surface of a corresponding first conductive layer 701. The first high-resistance portion 801 is made of one of silicon dioxide, silicon nitride, aluminum nitride, and alumina, with a thickness of 5 nm-1000 nm, to be suitable for being formed by the epitaxial growth method and the etching method. The high-resistance structure 8 further includes a second high-resistance portion 802 wrapping the electrocoupling structure 57, for insulating the electrocoupling structure 57 from the two-dimensional electron gas, such that leakage currents generated by the two-dimensional electron gas flowing toward the electrocoupling structure 57 may be intercepted, and thus the risk of the semiconductor device failing or being damaged as a result of this in the process of the high-voltage operation may be effectively reduced. The fabrication material of the second high-resistance portion 802 is one of silicon dioxide, silicon nitride, aluminum nitride, and alumina, with a thickness of 5 nm-1000 nm, to be suitable for being formed by the epitaxial growth method and the etching method.

Next, a fabrication method of the semiconductor device is described, and the steps of the fabrication method include: providing a substrate 1; growing a nucleation layer 201 on the substrate 1; growing a buffer layer 202 on the nucleation layer 201; growing a conductive material layer formed from a metal material on the buffer layer 202; etching the conductive material layer to obtain a conductive layer 7 formed from a remaining conductive material layer; growing a high-resistance material layer formed by an insulating compound on the buffer layer 202 and the conductive layer 7; etching the high-resistance material layer to obtain a first high-resistance portion 801 of a high-resistance structure 8 formed by a remaining high-resistance material layer and disposed on a top of the conductive layer 7; growing a barrier material 8' that covers a side of the conductive layer 7; growing a channel layer 203, capable of covering the first high-resistance portion 801 of the high-resistance structure 8 and the barrier material 8', on the buffer layer 202; and growing a barrier layer 204 on the channel layer 203.

Next, opening holes on the barrier layer 204, the channel layer 203, and the first high-resistance portion 801 of the high-resistance structure 8 by etching to obtain a first slot hole 57*a* exposing the conductive layer 7; growing an insulating material on the barrier layer 204 and in the first slot hole 57*a*; opening holes on the insulating material that is on the barrier layer 204 by etching to obtain a source hole region, a gate hole region, and a drain hole region; forming a source 6, a gate 5, and a drain 4 in the source hole region, the gate hole region, and the drain hole region, respectively, by means of growth, etching, and tempering, and at the same time forming a gate field plate 11 connected the gate 5 on the insulating material; opening holes on the insulating material that is in the first slot hole 57*a* by etching, to obtain a second slot hole 57*b* that exposes the conductive layer 7 and is thinner than the first slot hole 57*a*; growing a conductive material inside the second slot hole 57*b*, and etching the conductive material to obtain an electrocoupling structure 57 formed by the conductive material and connecting the conductive layer 7 to the gate 5, and obtaining a passivation layer 9 formed by the remaining insulating material and disposed on the barrier layer 204, and a second high-resistance portion 802 of the high-resistance structure 8 to wrap the electrocoupling structure 57. Corresponding steps can be seen in FIGS. 27*a*-27*i*.

It will be appreciated that the main difference between Embodiment VIII and Embodiment II is the material of the conductive layer 7 and the setting of the barrier material 8'. Those skilled in the art may understand the relevant technical features of the present embodiment with knowledge of Embodiment II.

Embodiment IX

As shown in FIGS. 8, 10, 28, different from Embodiment VIII, the first conductive layers 701 are spaced apart along a third direction. The third direction is perpendicular to the first direction and second direction. That is, the first second and third directions form a right-angle coordinate system.

It will be appreciated that the main difference between Embodiment IX and Embodiment III is the material of the conductive layer 7 and the setting of the barrier material 8'. Those skilled in the art may understand the relevant technical features of the present embodiment with knowledge of Embodiment III.

Embodiment X

As shown in FIGS. 13, 16, 29, different from Example VIII, the semiconductor device further includes multiple conductive layers 7 of equal dimensions disposed within the channel layer 203, and multiple electrocoupling structures 57 for electrically coupling each of the conductive layers 7 to the gate 5. The multiple conductive layers 7 are disposed at intervals in a third direction, and each of the conductive layers 7 is arranged with a connection region for receiving the electrocoupling structure 57, as detailed in FIG. 16. A total size of the conductive layers 7 along the third direction is larger than a size of each conductive layer 7 along the second direction, and each conductive layer 7 includes a first surface away from the substrate 1 and a second surface opposite to the first surface and near the substrate 1. A positive projection of each of at least one conductive layer 7 on the substrate 1 is intersected with a positive projection of the gate 5 on the substrate 1. When an electric potential is applied to the gate 5 of the semiconductor device, the source 6 and the drain 4 may be connected through the two-dimensional electron gas, and the conductive layers 7 may regulate an electric field distribution between the channel layer 203 and the barrier layer 204. Compared to the semiconductor device having only one conductive layer, the semiconductor device having multiple conductive layers 7 may reduce the peak electric field strength near the gate 5 more efficiently and further increase the breakdown voltage of the device, thereby improving the operating characteristics of the device at high voltage, high power, and/or high frequency. However, since the peak electric field strength occurs between the gate 5 and the drain 4 and immediately adjacent to the gate 5, it is proposed that the positive projection of the conductive layer 7, among the positive projections of the conductive layers 7 on the substrate 1, which is closest to the drain 4 is closer to the positive projection of the drain 4 on the substrate 1 than the positive projection of the gate 5 on the substrate 1, whereby the conductive layer 7 which is closest to the drain 4 may better reduce the peak electric field strength near the gate 5, and more effectively improve the operating characteristics of the device at high voltage, high power, and/or high frequency, thereby more effectively increasing the breakdown voltage of the device.

It can be understood that the main difference between Embodiment X and Embodiment IV is the material of the conductive layer 7 and the setting of the barrier material 8'. Those skilled in the art may understand the relevant technical features of the present embodiment with knowledge of Embodiment IV.

Embodiment XI

As shown in FIGS. 17 and 30, different from Example VII, the first surface of the conductive layer 7 is disposed within the channel layer 203, and the second surface of the conductive layer 7 is also disposed within the channel layer 203 to ensure that the conductive layer 7 is suitable to be formed by the ion implantation method and tempering activation. The conductive layer 7 may be a rectangular body that can be easily molded. The conductive layer 7 has a thickness of 10 nm-1000 nm, which may be 100 nm. The conductive layer 7 may be a conductive doped semiconductor structure, suitable for being formed by the ion implantation method and tempering activation. The conductive doped semiconductor structure may be one of an N-type doped semiconductor structure and a P-type doped semiconductor structure, in particular a structure formed by silicon-doped gallium nitride with a doping concentration of $5*10^{17}/cm^3$. The size of the conductive layer 7 along the first direction (i.e., the arrangement direction between the source 6 and the drain 4) is larger than the size of the conductive layer 7 along the second direction (i.e., the arrangement direction between the substrate 1 and the semiconductor layer 2), thereby reducing the occupancy ratio of the conductive layer 7 to the channel layer 203, thereby avoiding a significant decrease in the concentration of the two-dimensional electron gas, and ensuring that the switching characteristics of the semiconductor device are still useful and efficient.

The fabrication method differs from Embodiment VII in that the conductive layer 7 including the metal material is formed by: carrying out a first epitaxial growth of the channel layer 203 to a certain height, growing the conductive material layer using the growth method and etching to obtain the conductive layer 7, and then carrying out a second epitaxial growth for the remaining channel layer 203.

It can be understood that the main difference between Embodiment XI and Embodiment V is the material of the conductive layer 7 and the setting of the barrier material 8'. Those skilled in the art may understand the relevant technical features of the present embodiment with knowledge of Embodiment V.

Embodiment XII

As shown in FIGS. 20 and 31, different from Embodiment XI, the first surface of the conductive layer 7 is connected to the side of the buffer layer 202 away from the substrate, and the second surface of the conductive layer 7 is disposed within the buffer layer 202 to ensure that the conductive layer 7 is suitable to be formed by the ion-implantation method and tempering activation. The conductive layer 7 may be a rectangular body that can be easily molded. The conductive layer 7 has a thickness of 10 nm-1000 nm, which may be 100 nm. The conductive layer 7 may be a conductive doped semiconductor structure, suitable for being formed by the ion implantation method and tempering activation. The conductive doped semiconductor junction may be one of an N-type doped semiconductor structure and a P-type doped semiconductor structure, in particular a structure formed by silicon doped gallium nitride with a doping concentration of $5*10^{17}/cm^3$. The size of the conductive layer 7 along the first direction (i.e., the arrangement direction between the source 6 and the drain 4) is larger than the size of the conductive layer 7 along the second direction (i.e., the arrangement direction between the substrate 1 and the semiconductor layer 2), thereby reducing the occupancy ratio of the conductive layer 7 to the channel layer 203, thereby avoiding a significant decrease in the concentration of the two-dimensional electron gas, and ensuring that the switching characteristics of the semiconductor device are still useful and efficient.

Different from Embodiment XI, the first high-resistance portion 801 can cover the first surface of the conductive layer 7 other than the connection region of the conductive layer 7. The first high-resistance portion 801 is configured to insulate the conductive layer 7 from the two-dimensional electron gas to intercept leakage currents generated by the two-dimensional electron gas flowing toward the conductive layer 7, thereby effectively reducing the risk of failure or damage to the semiconductor device during high-voltage operation. The first high-resistance portion 801 is selected as an integral layer structure, and thus the projected area of the first high-resistance portion 801 on the substrate 1 is much larger than the projected area of the conductive layer 7 on the substrate 1, which may effectively insulate the conductive layer 7 from the two-dimensional electron gas. Because the first high-resistance portion 801 is selected to be an integral layer structure, the first high-resistance portion 801 includes a lower surface that is connected to a side of the buffer layer 202 away from the substrate 1, and an upper surface that is connected to a side of the channel layer 203 near the substrate 1. In other embodiments, the first high-resistance portion 801 of the high-resistance structure 8 may be of a non-integral layer structure, such as a non-integral layer structure covering only the conductive layer 7 as in Embodiment X.

The fabrication method differs from Embodiment XI in that the conductive layer 7 is formed by: carrying out a first epitaxial growth of the buffer layer 202 to a certain height, growing the conductive material layer using the growth method and etching to obtain the conductive layer 7, and then carrying out a second epitaxial growth for the remaining buffer layer 202.

It can be understood that the main difference between Embodiment XII and Embodiment XI is the material of the conductive layer 7 and the setting of the barrier material 8'. Those skilled in the art may understand the relevant technical features of the present embodiment with knowledge of Embodiment VI.

Embodiment XIII

The present disclosure further proposes that the electrocoupling structure 57 may be disposed below the gate 5. Referring to FIGS. 32 and 33, specifically, the electrocoupling structure 57 includes a slot body and a conductive material, the slot body extending from a surface of the second semiconductor layer (204) toward into the semiconductor layer, the conductive material filling the slot body, an end of the conductive material being directly connected to the conductive layer, and the other end of the conductive material being directly connected to a lower surface of the gate 5. The second high-resistance portion 802 wraps the conductive material filling the slot body.

It will be appreciated that in all embodiments disclosed herein, the electrocoupling structure 57 may be disposed on a side or a bottom of the gate 5, provided there is no conflict. This embodiment is shown as an example only to show a variant of Embodiment I.

Embodiment XIV

In the Embodiment I, the connection region for connecting with the electrocoupling structure 57 is arranged on the first surface of the conductive layer 7, and the first high-resistance portion 801 is arranged on the first surface of the conductive layer 7 other than the connection region. Correspondingly, with reference to FIG. 34, the present embodiment continues to propose that the connection region of the conductive layer 7 may be arranged on a side of the conductive layer 7 instead of on the first surface of the conductive layer 7 in Embodiment I.

Embodiment XV

In Embodiment II and Embodiment III, the electrocoupling structure 57 is connected to a side of the connection region 703. Correspondingly, therefore, with reference to FIG. 35, the present embodiment continues to suggest that the electrocoupling structure 57 may be connected to an upper surface of the connection region 703. It will be appreciated that variants of this connection can be applied at least in Embodiment II and Embodiment III.

It will be understood by those skilled in the art that the present disclosure elaborates on the overall technical solution mainly through two aspects, namely, embodiments corresponding to the conductive layer made of a semiconductor material and embodiments corresponding to the conductive layer made of a metal material. Further, the main difference between the above two aspects is the setting of the barrier material. However, this does not mean that the embodiments corresponding to the conductive layer made of the metal material are necessarily provided with the barrier material, or that the embodiments corresponding to the conductive layer made of the semiconductor material are necessarily not provided with the barrier material. The embodiments corresponding to the above two aspects may be combined arbitrarily without conflict, and all are within the scope of the present disclosure.

The foregoing is only some embodiments of the present disclosure, but the scope of the present disclosure is not limited thereto. Those skilled in the art may easily make changes or variations within the technical scope disclosed in the present disclosure, and such changes or variations shall be covered within the scope of the present disclosure. Therefore, the scope of the present disclosure shall be subject to the scope of the claims. As long as there is no structural conflict, each of the technical features mentioned in the various embodiments can be combined in any manner. The present disclosure is not limited to the particular embodiments disclosed in the text, but includes all technical solutions falling within the scope of the claims.

What is claimed is:

1. A high electron mobility transistor (HEMT) device, comprising:

a substrate;

an epitaxial layer, disposed on the substrate, and comprising: a first semiconductor stack layer and a second semiconductor layer disposed on the first semiconductor stack layer; wherein a two-dimensional electron gas is formed at an interface between the first semiconductor stack layer and the second semiconductor layer;

a source, a drain, and a gate, disposed on the second semiconductor layer and spaced apart;

a conductive layer, disposed within the epitaxial layer and between the substrate and the two-dimensional electron gas;

an electrocoupling structure; wherein an end of the electrocoupling structure is electrically connected to the gate, and the other end of the electrocoupling structure extends into the epitaxial layer and is electrically connected to the conductive layer; and a high-resistance structure, at least partially disposed between the conductive layer and the two-dimensional electron gas, and between the electrocoupling structure and the two-dimensional electron gas.

2. The HEMT device according to claim 1, wherein the high-resistance structure comprises:

a first high-resistance portion, disposed in the epitaxial layer and on a top of the conductive layer; and a second high-resistance portion, disposed in the epitaxial layer and wrapping the electrocoupling structure.

3. The HEMT device according to claim 2, wherein a material of the first high-resistance portion is one or more of boron-doped gallium nitride, silicon dioxide, silicon nitride, aluminum nitride, and alumina; a material of the second high-resistance portion is one or more of silicon dioxide, silicon nitride, aluminum nitride, and alumina.

4. The HEMT device according to claim 2, wherein the electrocoupling structure comprises a slot body and a conductive material; the slot body extends from a surface of the second semiconductor layer towards into the epitaxial layer, the conductive material is filled in the slot body; an end of the conductive material is directly connected to the conductive layer, the other end of the conductive material is directly connected to the gate, and the second high-resistance portion wraps around the conductive material filled in the slot body.

5. The HEMT device according to claim 2, wherein the electrocoupling structure comprises a slot body and a conductive material; the slot body extends from a surface of the second semiconductor layer towards into the epitaxial layer, the conductive material is filled in the slot body; an end of the conductive material is directly connected to the conductive layer, the other end of the conductive material extends out of the second semiconductor layer to be directly connected to the gate; and the HEMT device further comprises a passivation layer disposed on the second semiconductor layer, the passivation layer insulatingly isolates the gate, the source, the drain, and the conductive material.

6. The HEMT device according to claim 5, wherein the conductive material is one or more of tungsten, molybdenum, tantalum, and nickel.

7. The HEMT device according to claim 2, wherein a positive projection of the conductive layer on the substrate coincides at least partially with a positive projection of the gate on the substrate.

8. The HEMT device according to claim 7, wherein the conductive layer is of a complete-plate structure.

9. The HEMT device according to claim 8, wherein the conductive layer comprises a first surface away from the substrate and a second surface proximate to the substrate; the first surface comprises a connection region to be electrically connected to the electrocoupling structure, and the first high-resistance portion is disposed on the first surface of the conductive layer other than the connection region.

10. The HEMT device according to claim 7, wherein the conductive layer comprises a plurality of first conductive layers spaced apart and a second conductive layer connected to the plurality of first conductive layers.

11. The HEMT device according to claim 10, wherein the second conductive layer comprises a first side and a second side that are opposite to each other, the first side of the second conductive layer is connected to the plurality of first conductive layers.

12. The HEMT device according to claim 11, wherein the plurality of first conductive layers are spaced apart along a first direction and extend in a second direction, and the second conductive layer is connected to the plurality of first conductive layers along the first direction; the first direction is an arrangement direction between the gate and the drain, and the second direction is an extension direction of the gate.

13. The HEMT device according to claim 11, wherein the plurality of first conductive layers are spaced apart along a second direction and extend in a first direction, and the second conductive layer is connected to the plurality of first conductive layers along the second direction; the first direction is an arrangement direction between the source and the drain, and the second direction is an extension direction of the gate.

14. The HEMT device according to claim 11, wherein each of the plurality of first conductive layers and the second conductive layer comprises a first surface away from the substrate and a second surface proximate to the substrate; the first surface of the second conductive layer comprises a connection region to be electrically connected to the electrocoupling structure, the first high-resistance portion is disposed on the first surface of each first conductive layer and the first surface of the second conductive layer other than the connection region.

15. The HEMT device according to claim 11, wherein the second side of the second conductive layer comprises a connection region to be electrically connected to the electrocoupling structure; each of the plurality of first conductive layers and the second conductive layers comprises a first surface away from the substrate and a second surface proximate to the substrate; the first high-resistance portion is disposed on the first surface of each first conductive layer and the first surface of the second conductive layer.

16. The HEMT device according to claim 15, wherein the conductive layer further comprises a third conductive layer; the second side of the second conductive layer is connected to the electrocoupling structure by the third conductive layer; the third conductive layer comprises a first surface away from the substrate and a second surface proximate to the substrate; the first high-resistance portion is disposed on the first surface of each first conductive layer, the first surface of the second conductive layer, and the first surface of the third conductive layer.

17. The HEMT device according to claim 3, wherein the conductive layer comprises a plurality of conductive layers; the plurality of conductive layers are spaced apart along a second direction and extend along a first direction; the first direction is an arrangement direction between the source and the drain, and the second direction is an extension direction of the gate;

the electrocoupling structure comprise a plurality of electrocoupling structures, and each of the plurality of electrocoupling structures is electrically connected to a corresponding conductive layer.

18. The HEMT device according to claim 17, wherein each of the plurality of conductive layers comprises a first surface away from the substrate and a second surface proximate to the substrate, the first high-resistance portion being disposed on the first surface.

19. The HEMT device according to claim 2, wherein the conductive layer is made of a conductive doped semiconductor material or a metal material.

20. The HEMT device according to claim 19, wherein the conductive layer is made of the metal material and comprises:

a first surface away from the substrate, a second surface proximate to the substrate, and a side connected to the first surface and the second surface; wherein the side of the conductive layer is covered with a barrier material.

21. A semiconductor device, comprising:

a substrate;

an epitaxial layer, disposed on the substrate, and comprising: a first semiconductor stack layer and a second semiconductor layer disposed on the first semiconductor stack layer; wherein a two-dimensional electron gas is formed at an interface between the first semiconductor stack layer and the second semiconductor layer;

a source, a drain and a gate, disposed on the second semiconductor layer and spaced apart;

a plurality of conductive layers, spaced within the epitaxial layer and between the substrate and the two-dimensional electron gas;

a plurality of electrocoupling structures, for electrically coupling the plurality of conductive layers to the gate;

a first high-resistance portion, for insulating the plurality of conductive layers from the two-dimensional electron gas; and a second high-resistance portion, for insulating isolating the plurality of electrocoupling structures from the two-dimensional electron gas.

* * * * *